(12) United States Patent  
Sawada et al.

(10) Patent No.: US 8,338,073 B2  
(45) Date of Patent: Dec. 25, 2012

(54) LITHOGRAPHIC PRINTING PLATE SUPPORT, METHOD OF MANUFACTURING THE SAME, AND PRESENSITIZED PLATE

(75) Inventors: Hirokazu Sawada, Shizuoka (JP); Akio Uesugi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/264,570

(22) Filed: Nov. 4, 2008

(65) Prior Publication Data

US 2009/0061354 A1    Mar. 5, 2009

Related U.S. Application Data

(62) Division of application No. 11/486,283, filed on Jul. 14, 2006, now abandoned.

(30) Foreign Application Priority Data

Jul. 14, 2005    (JP) .................................. 2005-205564  
Aug. 12, 2005    (JP) .................................. 2005-234163

(51) Int. Cl.  
    *G03F 7/20*     (2006.01)  
    *C23F 1/00*     (2006.01)  
    *B22D 11/00*   (2006.01)  
(52) U.S. Cl. .................... 430/269; 164/476; 216/102  
(58) Field of Classification Search .................. 164/476; 216/102; 430/269  
See application file for complete search history.

(56) References Cited

U.S. PATENT DOCUMENTS

| | | |
|---|---|---|
| 2,790,216 A | 4/1957 | Hunter |
| 4,054,173 A | 10/1977 | Hickam |
| 6,670,099 B2 | 12/2003 | Sawada et al. |

FOREIGN PATENT DOCUMENTS

| | | |
|---|---|---|
| CA | 619491 | 5/1961 |
| EP | 0 640 694 A1 | 3/1995 |
| EP | 0 666 329 A1 | 8/1995 |
| EP | 1 442 894 A1 | 8/2004 |
| EP | 1 516 744 A2 | 3/2005 |
| EP | 1 520 728 A2 | 4/2005 |
| JP | 51-89827 A | 8/1976 |
| JP | 58-209449 | 12/1983 |

(Continued)

OTHER PUBLICATIONS

ASM International, Materials Park, Ohio, Properties and Selection: Nonferrous Alloys and Special Purpose Materials, vol. 2, Specific Metals and Alloys, pp. 46-47 and 55, Oct. 1990.*

(Continued)

*Primary Examiner* — Kiley Stoner  
*Assistant Examiner* — Alexander Polyansky  
(74) *Attorney, Agent, or Firm* — Sughrue Mion, PLLC

(57) ABSTRACT

A lithographic printing plate support in which surface unevenness due to surface treatment has been suppressed and a presensitized plate of excellent sensitivity are produced from an aluminum alloy plate containing iron, silicon, titanium and boron by specifying the state in which $TiB_2$ particles are present in the surface layer and the width of the crystal grains, and by having specific indicators relating to the respective concentrations of iron and silicon in the surface layer following graining treatment fall within specific ranges. In a method of manufacturing the lithographic printing plate support, an aluminum alloy melt having specified alloying ingredients is subjected to a specified casting process to have the amount of the alloying ingredients in solid solution following cold rolling fall within specified ranges.

7 Claims, 6 Drawing Sheets

FOREIGN PATENT DOCUMENTS

| | | |
|---|---|---|
| JP | 1-215441 A | 8/1989 |
| JP | 04-165041 | 6/1992 |
| JP | 09-285845 | 11/1997 |
| JP | 10-058094 | 3/1998 |
| JP | 11-047892 | 2/1999 |
| JP | 2000-158099 | 6/2000 |
| JP | 2002-079769 A | 3/2002 |
| JP | 2002-129270 | 5/2002 |
| JP | 2005-035098 | 2/2005 |
| JP | 2005-105366 A | 4/2005 |

OTHER PUBLICATIONS

European Search Report dated Jan. 12, 2007.
Japanese Office Action issued in Application No. 2006-194243 dated Apr. 3, 2012.
Japanese Office Action dated Apr. 20, 2010.

* cited by examiner

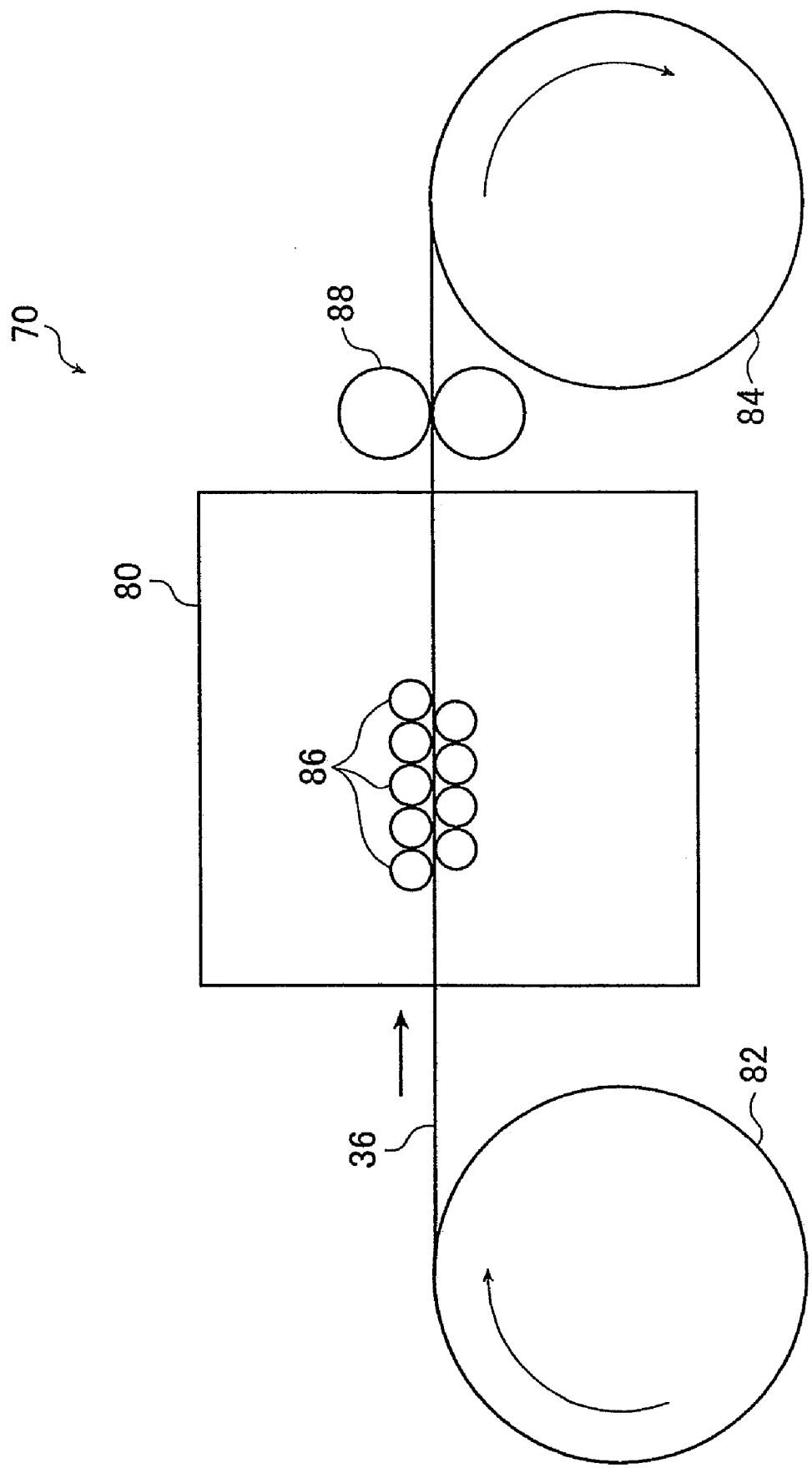

LITHOGRAPHIC PRINTING PLATE SUPPORT, METHOD OF MANUFACTURING THE SAME, AND PRESENSITIZED PLATE

This is a divisional of application Ser. No. 11/486,283 filed Jul. 14, 2006 now abandoned. The entire disclosure of the prior application, application Ser. No. 11/486,283 is considered part of the disclosure of the accompanying divisional application and is hereby incorporated by reference.

The entire contents of documents cited in this specification are incorporated herein by reference.

BACKGROUND OF THE INVENTION

The present invention relates to lithographic printing plate supports obtainable using an aluminum alloy plate, and to presensitized plates for lithographic printing obtainable from such supports. The invention also relates to methods of manufacturing such lithographic printing plate supports and presensitized plates.

Aluminum alloy plates are generally produced by using a semi-continuous casting process (direct chill casting) to cast a slab from an aluminum alloy melt, then subjecting the slab to homogenizing heat treatment, followed by hot rolling, cold rolling and, if necessary, annealing.

To produce aluminum alloy plates continuously by a simpler process than semi-continuous casting, various continuous casting processes have been proposed which use a driven, or moving, mold that casts the plates directly from the aluminum alloy melt.

Continuous casting processes which use such a moving mold include processes that employ a moving mold in the form of a pair of belts, such as the Hazelett process, and processes which employ a moving mold in the form of a pair of rolls, such as the Hunter process and the 3C process. In the Hunter process, a pair of cooling rollers are tilted about 15° from the vertical and the aluminum alloy plate is cast in an upwardly angled direction. In the 3C process, a pair of cooling rollers are arranged vertically and the aluminum alloy plate is cast in the horizontal direction.

An advantage with such processes which use a moving mold is that the equipment can be compact. Processes which use a moving mold in the form of rolls are especially outstanding in this respect.

In a process that uses a roll-type moving mold, the aluminum alloy melt (also referred to below as an "aluminum melt") is fed between a pair of cooling rollers by a melt feed nozzle, and solidification and rolling of the aluminum melt are carried out by the cooling rollers as a single operation. Processes which use roll-type moving molds are described in detail in U.S. Pat. No. 2,790,216, CA 619,491, JP 51-15968 B, JP 51-89827 A, JP 58-209449 A and JP 1-215441 A.

SUMMARY OF THE INVENTION

However, the inventors have made studies and as a result found that lithographic printing plate supports manufactured from aluminum alloy plates obtainable by these methods have surface unevenness caused by the surface treatment, and that presensitized plates manufactured from such supports have a poor sensitivity.

It is therefore an object of the present invention to provide a lithographic printing plate support having no surface unevenness due to surface treatment. Another object of the invention is to provide a presensitized plate which is obtainable using such a lithographic printing plate support and has an excellent sensitivity. Still another object of the invention is to provide manufacturing methods of such lithographic printing plate support and presensitized plate.

The inventors have made extensive studies to achieve the above objects and as a result found that the surface unevenness due to surface treatment in lithographic printing plate supports manufactured by continuous casting and the low sensitivity in presensitized plates produced using such supports are caused by factors having to do with the uniformity in the distribution of specific elements and the width of crystal grains at the surface of the aluminum alloy plate.

Moreover, the inventors have also found that when an aluminum alloy plate containing iron, silicon, titanium and boron is used, it is possible to obtain both lithographic printing plate supports in which surface unevenness due to surface treatment has been suppressed and presensitized plates of excellent sensitivity by specifying the state in which $TiB_2$ particles are present in the surface layer and the width of the crystal grains, and moreover by having specific indicators relating to the respective concentrations of iron and silicon in the surface layer following graining treatment fall within specific ranges.

The inventors have also made extensive studies to achieve the above objects and as a result additionally found that when a large amount of aluminum dissolves from the aluminum alloy plate during alkali etching, unevenness due to surface treatment readily arises at the surface of the plate, and that this is because inhomogeneities generated in the continuous casting step, such as coarsening of the crystal microstructure, segregation of the added elements, and the admixture and condensation of impurities, are readily manifested by alkali etching treatment.

The inventors have also found that, to prevent unevenness due to surface treatment from appearing at the surface of a lithographic printing plate support, it is effective to keep such inhomogeneities from arising in the continuous casting process; and moreover that, even should such inhomogeneities arise, the degree of surface treatment-related unevenness that ultimately appears at the surface can be reduced by improving the uniformity of subsequent electrochemical graining treatment.

Furthermore, the inventors have found that, to improve the uniformity of electrochemical graining treatment, it is important to control the respective amounts of elemental iron, silicon and copper in the aluminum melt within specific ranges, and also to control the amounts in which these respective elements enter into solid solution within the aluminum matrix.

The inventors have completed the invention described below on the basis of these findings.

Accordingly, the invention provides the following aspects:
(1) In a first aspect, the invention provides a lithographic printing plate support obtainable by carrying out a graining treatment comprising at least alkali etching and subsequent electrochemical graining on a surface of an aluminum alloy plate which is produced from an aluminum alloy melt containing iron, silicon, titanium and boron, which has a surface layer of up to 20 µm from the surface that is free of $TiB_2$ particles or contains $TiB_2$ particles at least 95% of which have a width of less than 100 µm, and in which crystal grains present in the surface layer have an average width of 20 to 200 µm and a maximum width of at most 2,000 µm;

wherein the surface layer of up to 20 µm from the surface of the plate following the graining treatment has an iron concentration and a silicon concentration such that, for each, a ratio of a difference between a concentration in high-concentration areas and a concentration in low-concentration areas to the concentration in the low-concentration areas is at most 20%.

(2) In a second aspect, the invention provides a lithographic printing plate support according to (1) above, wherein the aluminum alloy plate is obtainable by carrying out:

a continuous casting step in which the aluminum alloy melt is fed through a melt feed nozzle between a pair of cooling rollers where the aluminum alloy melt is rolled as it is solidified to thereby form the aluminum alloy plate;

a cold rolling step in which the aluminum alloy plate obtained in the continuous casting step is cold rolled to reduce a thickness of the aluminum alloy plate;

an intermediate annealing step in which the cold-rolled aluminum alloy plate is heat treated; and a finish cold rolling step in which the aluminum alloy plate after the intermediate annealing step is rolled to further reduce the thickness of the aluminum alloy plate.

(3) In a third aspect, the invention provides a lithographic printing plate support according to (2) above, wherein the aluminum alloy plate is obtainable by carrying out, prior to the continuous casting step:

a filtering step in which the aluminum alloy melt is filtered using a filtration tank, and a melt feeding step in which the filtered aluminum alloy melt is fed from the filtration tank to the melt feed nozzle through a flow channel;

wherein, in the melt feeding step, agitating means provided in a recess formed in a base of the flow channel agitates the aluminum alloy melt near the recess.

(4) In a fourth aspect, the invention provides a lithographic printing plate support according to (2) or (3) above, wherein an inner wall of the melt feed nozzle that comes into contact with the aluminum alloy melt is coated beforehand with a parting agent containing filler particles having a particle size distribution with a median diameter of 5 to 20 μm and a modal diameter of 4 to 12 μm.

(5) In a fifth aspect, the invention provides a lithographic printing plate support according to any one of (2) to (4) above, wherein, in the continuous casting step, a carbon graphite-containing parting agent is applied to surfaces of the pair of cooling rollers, then the applied parting agent is made uniform in thickness, and the melt feed nozzle has an opening with an outer edge which does not contact the cooling rollers or which contacts the cooling rollers only at a tip thereof.

(6) In a sixth aspect, the invention provides a lithographic printing plate support according to any one of (2) to (5) above, wherein Equation:

$$V \geq 5 \times 10^{-5} \times (D/t^2)$$

(where V is a circumferential velocity (m/min) of the cooling rollers, t is a thickness (m) of the aluminum alloy plate and D is a diameter (m) of the cooling rollers in the continuous casting step) is satisfied.

(7) In a seventh aspect, the invention provides a lithographic printing plate support according to any one of (1) to (6) above, wherein the graining treatment includes, in order, at least a first alkali etching treatment, a first electrochemical graining treatment using an alternating current in a nitric acid-containing electrolyte, a second alkali etching treatment, and a second electrochemical graining treatment using an alternating current in a hydrochloric acid-containing electrolyte.

(8) In an eighth aspect, the invention provides a presensitized plate which is obtainable by forming an image recording layer on the lithographic printing plate support of any one of (1) to (7) above.

(9) In a ninth aspect, the invention provides a presensitized plate according to (8) above, wherein the image recording layer is a laser-imagable image recording layer.

(10) In a tenth aspect, the invention provides a presensitized plate according to (9) above, wherein the laser-imagable image recording layer is of a photopolymer type or a thermal positive type.

(11) In an eleventh aspect, the invention provides a method of manufacturing a lithographic printing plate support which comprises:

(filtering) a filtering step in which an aluminum alloy melt is filtered using a filtration tank;

(melt feeding) a melt feeding step in which the filtered aluminum alloy melt is fed from the filtration tank to a melt feed nozzle through a flow channel;

(casting) a continuous casting step in which the aluminum alloy melt is fed through the melt feed nozzle between a pair of cooling rollers where the aluminum alloy melt is rolled as it is solidified to thereby form an aluminum alloy plate;

(rolling) a cold rolling step in which the aluminum alloy plate obtained in the continuous casting step is cold rolled to reduce a thickness of the aluminum alloy plate;

(intermediate annealing) an intermediate annealing step in which the cold-rolled aluminum alloy plate is heat treated;

(finish rolling) a finish cold rolling step in which the aluminum alloy plate after the intermediate annealing step is rolled to further reduce the thickness of the aluminum alloy plate, and (graining) a graining treatment step in which a graining treatment comprising at least alkali etching and subsequent electrochemical graining is carried out on a surface of the aluminum alloy plate after the finish cold rolling step;

wherein, in the melt feeding step, agitating means provided in a recess formed in a base of the flow channel agitates the aluminum alloy melt near the recess;

(A) the aluminum alloy melt contains at least 95 wt % of aluminum, 30 to 5,000 ppm (parts per million by weight, the same applies below) of iron, 300 to 2,000 ppm of silicon, and 1 to 500 ppm of copper; and (B) the aluminum alloy plate after the finish cold rolling step contains in solid solution at least 20 ppm of iron, at least 20 ppm of silicon, and at least 70 wt % of copper in relation to the total amount of copper in the plate.

(12) In a twelfth aspect, the invention provides a method of manufacturing a lithographic printing plate support which comprises:

(melt feeding) a melt feeding step in which an aluminum alloy melt is fed through a melt feed nozzle between a pair of cooling rollers;

(casting) a continuous casting step in which the aluminum alloy melt is rolled with the pair of colling rollers as it is solidified to thereby form an aluminum alloy plate;

(rolling) a cold rolling step in which the aluminum alloy plate obtained in the continuous casting step is cold rolled to reduce a thickness of the aluminum alloy plate;

(intermediate annealing) an intermediate annealing step in which the cold-rolled aluminum alloy plate is heat treated;

(finish rolling) a finish cold rolling step in which the aluminum alloy plate after the intermediate annealing step is rolled to further reduce the thickness of the aluminum alloy plate, and (graining) a graining treatment step in which a graining treatment comprising at least alkali etching and subsequent electrochemical graining is carried out on a surface of the aluminum alloy plate after the finish cold rolling step;

wherein (a) the melt feed nozzle has, at a tip thereof, a bottom outside face which is acutely angled with respect to the direction in which the aluminum alloy melt is discharged from the nozzle, and/or (b) the melt feed nozzle includes a top plate member which contacts the aluminum alloy melt from above and a bottom plate member which contacts the aluminum alloy melt from below, each of the members being vertically movable, and the top plate member and bottom plate member being each subjected to pressure by the aluminum alloy melt and thereby pushed against an adjoining cooling roller surface;

(A) the aluminum alloy melt contains at least 95 wt % of aluminum, 30 to 5,000 ppm of iron, 300 to 2,000 ppm of silicon, and 1 to 500 ppm of copper; and (B) the aluminum alloy plate after the finish cold rolling step contains in solid solution at least 20 ppm of iron, at least 20 ppm of silicon, and at least 70 wt % of cupper in relation to the total amount of copper in the plate.

(13) In a thirteenth aspect, the invention provides a method of manufacturing a lithographic printing plate support which comprises:

(melt feeding) a melt feeding step in which an aluminum alloy melt is fed through a melt feed nozzle between a pair of cooling rollers;

(casting) a continuous casting step in which the aluminum alloy melt is rolled with the pair of colling rollers as it is solidified to thereby form an aluminum alloy plate;

(rolling) a cold rolling step in which the aluminum alloy plate obtained in the continuous casting step is cold rolled to reduce a thickness of the aluminum alloy plate;

(intermediate annealing) an intermediate annealing step in which the cold-rolled aluminum alloy plate is heat treated;

(finish rolling) a finish cold rolling step in which the aluminum alloy plate after the intermediate annealing step is rolled to further reduce the thickness of the aluminum alloy plate, and (graining) a graining treatment step in which a graining treatment comprising at least alkali etching and subsequent electrochemical graining is carried out on a surface of the aluminum alloy plate after the finish cold rolling step;

wherein an inner wall of the melt feed nozzle that comes into contact with the aluminum alloy melt is coated beforehand with a parting agent containing filler particles having a particle size distribution with a median diameter of 5 to 20 μm and a modal diameter of 4 to 12 μm;

(A) the aluminum alloy melt contains at least 95 wt % of aluminum, 30 to 5,000 ppm of iron, 300 to 2,000 ppm of silicon, and 1 to 500 ppm of copper; and (B) the aluminum alloy plate after the finish cold rolling step contains in solid solution at least 20 ppm of iron, at least 20 ppm of silicon, and at least 70 wt % of cupper in relation to the total amount of copper in the plate.

(14) In a fourteenth aspect, the invention provides a method of manufacturing a lithographic printing plate support which comprises:

(melt feeding) a melt feeding step in which an aluminum alloy melt is fed through a melt feed nozzle between a pair of cooling rollers;

(casting) a continuous casting step in which the aluminum alloy melt is rolled with the pair of colling rollers as it is solidified to thereby form an aluminum alloy plate;

(rolling) a cold rolling step in which the aluminum alloy plate obtained in the continuous casting step is cold rolled to reduce a thickness of the aluminum alloy plate;

(intermediate annealing) an intermediate annealing step in which the cold-rolled aluminum alloy plate is heat treated;

(finish rolling) a finish cold rolling step in which the aluminum alloy plate after the intermediate annealing step is rolled to further reduce the thickness of the aluminum alloy plate, and (graining) a graining treatment step in which a graining treatment comprising at least alkali etching and subsequent electrochemical graining is carried out on a surface of the aluminum alloy plate after the finish cold rolling step;

wherein, in the continuous casting step, a carbon graphite-containing parting agent is applied to surfaces of the pair of cooling rollers, then the applied parting agent is made uniform in thickness, and the melt feed nozzle has an opening with an outer edge which does not contact the cooling rollers or which contacts the rollers only at a tip thereof;

(A) the aluminum alloy melt contains at least 95 wt % of aluminum, 30 to 5,000 ppm of iron, 300 to 2,000 ppm of silicon, and 1 to 500 ppm of copper; and (B) the aluminum alloy plate after the finish cold rolling step contains in solid solution at least 20 ppm of iron, at least 20 ppm of silicon, and at least 70 wt % of cupper in relation to the total amount of copper in the plate.

Methods of manufacturing lithographic printing plate supports according to this invention may realize two or more of the above eleventh to fourteenth aspects of the invention, and preferably realize all of the above eleventh to fourteenth aspects.

The lithographic printing plate supports according to the invention have no surface unevenness due to surface treatment. Moreover, the presensitized plates of the invention have an excellent sensitivity.

With the manufacturing methods of the invention, there can be obtained lithographic printing plate supports which have no surface unevenness due to surface treatment and which have an excellent uniformity in electrochemical graining treatment.

BRIEF DESCRIPTION OF THE DRAWINGS

In the accompanying drawings:

FIG. 8 is a schematic view of an example of a straightening machine.

DETAILED DESCRIPTION OF THE INVENTION

Figure 1:
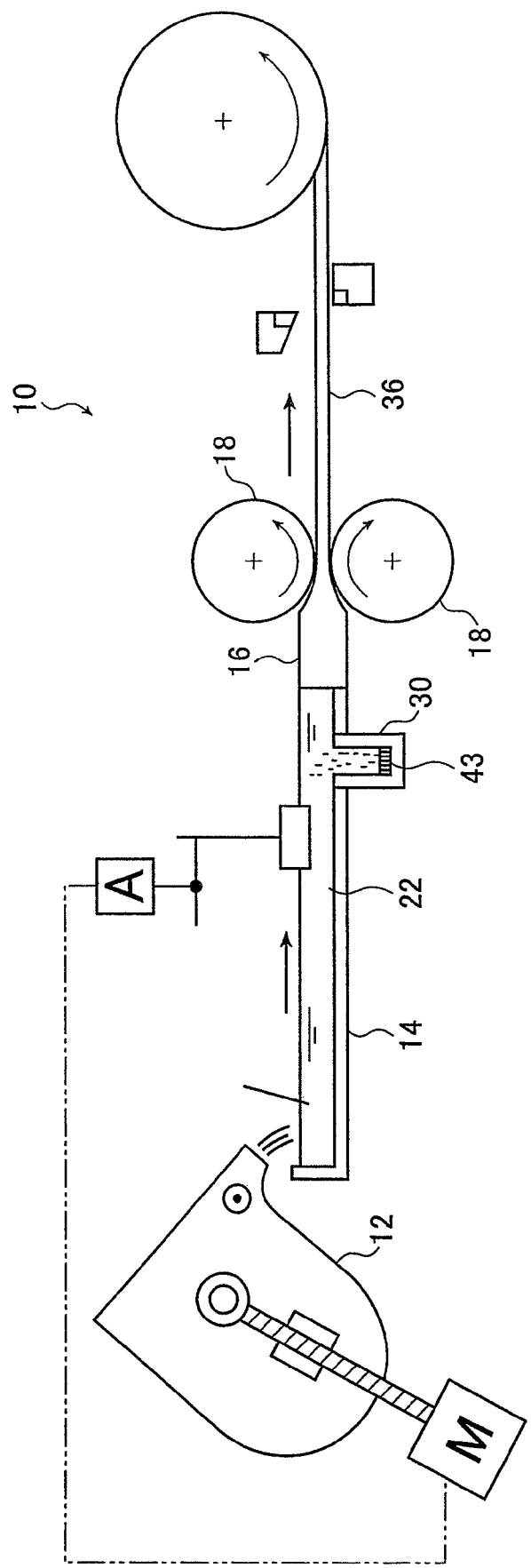
FIG. 1 is a schematic view of an exemplary arrangement from a melting furnace to a casting machine.

The inventive methods of manufacturing lithographic printing plate supports are described below in detail based on the preferred embodiments illustrated in the attached diagrams. The methods of manufacturing lithographic printing plate supports according to the eleventh to fourteenth aspects of the invention are described together below because they share some common steps.

[Lithographic Printing Plate Support]
<Aluminum Alloy Plate>
<Aluminum Alloy Plates in First to Tenth Aspects of Invention>

The aluminum alloy plates (also referred to below as simply "aluminum plates") in the first to tenth aspects of the invention are prepared from an aluminum alloy melt (also referred to below as an "aluminum melt") containing iron, silicon, titanium and boron. The effects that the presence of these elements has on the aluminum melt are described later in the specification.

The aluminum alloy plate used in the invention has a surface layer of up to 20 μm from the surface that is either free of $TiB_2$ particles or contains $TiB_2$ particles at least 95% of which have a width of less than 100 μm.

As noted above, the aluminum alloy plate used in the invention is prepared from an aluminum melt which contains titanium and boron. Sometimes the titanium and boron agglomerate to form coarse $TiB_2$ particles. When graining treatment is carried out, these coarse particles appear as lenticular streaks that extend in the rolling direction, and thus become a cause of surface unevenness in the surface-treated plate.

The inventors have found that when the surface layer of up to 20 μm from the surface is free of $TiB_2$ particles or contains $TiB_2$ particles at least 95% of which, and preferably at least 98% of which have a width of less than 100 μm, such surface unevenness tends not to arise. The lithographic printing plate support of the invention is thus specified accordingly.

The presence of $TiB_2$ particles in the surface layer of up to 20 μm from the surface of the aluminum alloy plate and the proportion of these particles having a width of less than 100 μm may be determined in the following way.

The surface of the aluminum alloy plate is etched under one of three sets of conditions; that is, until the amount of material dissolved is about 5 $g/m^2$, about 20 $g/m^2$, or about 50 $g/m^2$. Desmutting is also carried out under each condition, after which any lenticular streaks appearing on the surface that are visually observable are marked. An electron probe microanalyzer (EPMA) is used to determine whether titanium and boron can be detected from the lenticular streaks, following which the maximum value for width (length in the direction perpendicular to the rolling direction) is measured for each lenticular streak in which both titanium and boron have been detected.

Moreover, in the aluminum alloy plate used in the invention, the crystal grains present in the surface layer of up to 20 μm from the surface have an average width of 20 to 200 μm, and preferably 20 to 100 μm, and a maximum width of 2,000 μm or less, and preferably 500 μm or less. If the average width and maximum width of the crystal grains present in the surface layer fall within the above ranges, surface unevenness can be discouraged from arising when graining treatment has been carried out.

The average and maximum values for the width of crystal grains present in the surface layer may be determined as follows.

The surface of the aluminum alloy plate is buffed to a mirror finish, following which etching treatment is carried out. The crystal grains (crystal microstructure of the aluminum) are examined under a polarizing microscope at a magnification of 15×, and photographs are taken in ten visual fields. A total of 100 crystal grains—ten from each image—are randomly selected and the widths of the crystal grains are measured using image analysis software, based on which the average value and the maximum value (largest value of the 100 grains) are determined.

Such an aluminum alloy plate can be obtained from an aluminum melt containing iron, silicon, titanium and boron by, for example, a continuous casting step, a cold rolling step, an intermediate annealing step and a finish cold rolling step.

<Aluminum Alloy Plates in Eleventh to Fourteenth Aspects of Invention>

In the eleventh to fourteenth aspects of the invention, the aluminum alloy plate after the finish cold rolling step contains in solid solution at least 20 ppm of iron, at least 20 ppm of silicon, and at least 70 wt % of copper in relation to the total amount of copper in the plate.

<Aluminum Melts Used to Obtain Supports in First to Tenth Aspects of Invention>
<Silicon>

Silicon is an element which is present in an amount of about 0.03 to 0.1 wt % as an inadvertent impurity in the aluminum ingot serving as the starting material for the aluminum melt. A very small amount of silicon is often intentionally added to prevent variations due to starting material differences. Part of the amount of silicon added enters into solid solution in the aluminum.

In the practice of the invention, the aluminum melt has a silicon content of preferably 0.03 to 0.2 wt %.

The silicon which does not enter into solid solution readily forms intermetallic compounds with iron and aluminum, such as αFeAlSi and β-FeAlSi, when continuous casting is carried out.

If the rate of solidification during continuous casting differs in the width direction, a concentration or paucity of the intermetallic compounds arises in areas where the solidification rate is faster or slower than surrounding areas. As a result, when alkali etching treatment and electrochemical graining treatment are carried out, the etching rate and electrochemical graining treatment performance will differ, causing streak-like appearance defects, or unevenness due to surface treatment to arise at the surface.

<Iron>

Iron increases the mechanical strength of the aluminum alloy, exerting a large influence on the strength of the support. In particular, because it has a large heat softening resistance-enhancing effect, the deliberate addition of iron is advantageous. Like silicon, some of the iron enters into solid solution in the aluminum.

In the practice of the invention, the aluminum melt has an iron content of preferably 0.03 to 0.50 wt %.

The iron that does not enter into solid solution readily forms intermetallic compounds with aluminum, such as $Al_3Fe$ and $Al_6Fe$, and intermetallic compounds with silicon and aluminum, such as α-FeAlSi and β-FeAlSi, when continuous casting is carried out.

If the rate of solidification during continuous casting differs in the width direction, a concentration or paucity of the intermetallic compounds arises in areas where the solidification rate is faster or slower than surrounding areas. As a result, when alkali etching treatment and electrochemical graining treatment are carried out, the etching rate and electrochemical graining treatment performance will differ, causing streak-like appearance defects, or unevenness due to surface treatment to arise at the surface.

To keep cracks from being formed during casting, the aluminum melt may include an element such as titanium or boron which has a crystal grain refining effect. If the crystals are sufficiently refined during casting, the crystal grains will have a small width even after finish cold rolling, which is desirable. For example, titanium may be included within a range of 0.003 to 0.5 wt %, and boron may be included within a range of 0.001 to 0.02 wt %.

Titanium and boron have crystal grain refining effects even when added separately. However, because $TiB_2$, which is a compound of titanium and boron, functions as a nucleus for crystal growth, the presence of numerous $TiB_2$ grains results in the creation of numerous crystal nuclei, leading to the presence of many fine crystal grains, which in turn enables an aluminum alloy plate having a good appearance to be cast. It is thus preferable to add $TiB_2$. $TiB_2$-containing master alloys are exemplified by a master alloy in the form of wire which contains 5 wt % titanium and 1 wt % boron, with the balance being aluminum and inadvertent impurities.

The aluminum melt may include also copper and/or zinc so as to control within a desirable range the performance of the aluminum alloy plate in electrochemical graining treatment.

The aluminum melt may include also magnesium and/or manganese so as to obtain an aluminum alloy plate having the desired mechanical properties.

The balance of the aluminum melt is composed of aluminum and inadvertent impurities. Examples of such impurities include chromium, zirconium, vanadium, beryllium and gallium. These may be present in respective amounts of up to 0.05 wt %.

Most of the inadvertent impurities in the melt will originate from the aluminum ingot. If the inadvertent impurities in the melt are what is present in an ingot having an aluminum purity of 99.7 wt %, they will not compromise the intended effects of the invention. The inadvertent impurities may be, for example, impurities included in the amounts mentioned in *Aluminum Alloys: Structure and Properties*, by L. F. Mondolfo (1976).

<Aluminum Melts Used in Eleventh to Fourteenth Aspects of Invention>

The aluminum melt used in the continuous casting step contains at least 95 wt % aluminum, 30 to 5,000 ppm of iron, 300 to 2,000 ppm of silicon, and 1 to 500 ppm of copper.
<Silicon>

Silicon is an element which is present in an amount of about 300 to 1,000 ppm as an inadvertent impurity in the aluminum ingot serving as the starting material for the aluminum melt. A very small amount of silicon is often intentionally added to prevent variations due to starting material differences. Part of the amount of silicon added enters into solid solution in the aluminum.

In the practice of the invention, the aluminum melt has a silicon content of preferably from 300 to 2,000 ppm. Generally, the stability of electrochemical graining treatment can be enhanced by increasing the amount of silicon to at least a given level. However, in the practice of this invention, by providing a lower limit in the amount of copper in solid solution which is based on the total amount of copper, an excellent electrochemical graining treatment uniformity is achieved even in a relatively low amount of silicon in solid solution. In the present invention, the amount of silicon is at least 300 ppm, and preferably at least 500 ppm.

The presence of too much silicon favors the formation of compounds with iron, which affects the amount of iron that enters into solid solution. Moreover, too much silicon will increase the amount of uncombined silicon. When anodizing treatment is carried out after graining treatment, the uncombined silicon causes defects to arise more easily in the anodized layer. Water retention at such defects is poor, and tends to result in scumming of the paper medium during printing.

Accordingly, the amount of silicon in the invention is not more than 2,000 ppm, and preferably not more than 1,500 ppm.
<Iron>

Iron increases the mechanical strength of the aluminum alloy, exerting a large influence on the strength of the support. In particular, it has a large heat softening resistance-enhancing effect. Moreover, although iron has until now been thought of as having relatively little influence on electrochemical graining treatment, when the amount of iron in solid solution is too small, the pits that are formed as a result of electrochemical graining treatment may undergo deformation.

In the practice of the invention, the amount of iron is set to at least 30 ppm, and preferably at least 1,000 ppm. This makes the pits created by electrochemical graining treatment uniform, and results in excellent resistance to heat softening.

It has been conventionally noted that, when the iron content is too high, the support will have a higher strength than necessary. As a result, when mounted onto the plate cylinder of the printing press, the lithographic printing plate may not fit well on the cylinder and the edges thereof may be readily broken during printing. The inventors have found that to provide an excellent uniformity in electrochemical graining treatment, it is effective for the iron content to be set to 5,000 ppm or less. If too much iron is present, some shedding of iron-containing intermetallic compounds will occur during graining treatment, lowering the uniformity of electrochemical graining treatment.

In the practice of the invention, the amount of iron is set to 5,000 ppm or less, and preferably 4,000 ppm or less.
<Copper>

Copper is an important element for controlling the electrochemical graining treatment. Copper enters with great ease into solid solution, although some of the copper forms intermetallic compounds. In the practice of the invention, to achieve an excellent uniformity of electrochemical graining treatment within the above-indicated ranges in the amounts of iron and silicon, the amount of copper is set at 1 ppm or more, and preferably 10 ppm or more.

Too much copper will make the diameter of the pits formed by electrochemical graining treatment in a nitric acid solution too large and lower the uniformity of the pit diameters, and thus is especially undesirable from the standpoint of the scumming resistance.

The inventors have found that by setting the amount of copper within a specific range, the pits having a diameter of 0.5 µm or less that are formed by electrochemical graining treatment in a hydrochloric acid-containing solution can be made uniform. Moreover, the ratio by which the surface area at the surface of the substrate is increased can be made larger. A larger ratio of increase in the surface area enables the surface area of contact with the image recording layer to be increased, enhancing the bond strength between the support and the image recording layer so that an excellent press life and an excellent cleaner resistance are achieved. Also, lithographic printing plates manufactured from the resulting support have an excellent scumming resistance.

In the practice of the invention, the amount of copper is at most 500 ppm, and preferably 350 ppm or less.

To prevent crack formation during casting, the aluminum melt may include elements which have a crystal grain refining effect. For example, titanium may be included within a range of up to 500 ppm, and boron may be included within a range of up to 200 ppm.

Specifically, it is desirable to add a $TiB_2$-containing master alloy to the aluminum melt. In this way, the crystal grains during continuous casting can easily be refined so that, when the lithographic printing plate support is manufactured, surface unevenness arising from coarse crystal grains in the surface treatment step can be suppressed. $TiB_2$-containing master alloys are exemplified by a master alloy in the form of wire which contains 5 wt % titanium and 1 wt % boron, with the balance being aluminum and inadvertent impurities. $TiB_2$ by itself is composed of very small particles about 1 to 2 μm in size, but sometimes agglomerates to form coarse particles 100 μm or larger in size. In such cases, because these large particles cause surface unevenness, it is preferable to provide an agitating means in the subsequently described filtration step and/or melt feeding step.

The balance of the aluminum melt is aluminum and inadvertent impurities. Examples of such impurities include magnesium, manganese, zinc, chromium, zirconium, vanadium and beryllium. These may be present in respective amounts of up to 500 ppm.

Most of the inadvertent impurities in the melt will originate from the aluminum ingot. If the inadvertent impurities in the melt are what is present in an ingot having an aluminum purity of 99.7 wt %, they will not compromise the intended effects of the invention. The inadvertent impurities may be, for example, impurities included in the amounts mentioned in *Aluminum Alloys: Structure and Properties*, by L. F. Mondolfo (1976).

<Melting Step>

During preparation of the aluminum melt, first an aluminum ingot adjusted so as to include preferably at least 95 wt % of aluminum, preferably 0.03 to 0.50 wt % of iron, preferably 0.03 to 0.20 wt % of silicon, and other desirable elements is dissolved in a melting furnace.

Titanium and/or boron may be dissolved in the melting furnace, but because the $TiB_2$ grains have a relatively high specific gravity, they tend to precipitate. Hence, in one preferred embodiment, the titanium and/or boron are added at the flow channel downstream from the melting furnace (e.g., in the subsequently described filtration step and/or melt feeding step). In another preferred embodiment, addition may be carried out in the melting furnace, provided sufficient agitation of the melt is carried out within the melting furnace.

<Cleaning Treatment Step>

After the aluminum melt has been prepared to the desired composition, cleaning treatment may be carried out. The cleaning treatment may be carried out by an ordinary method.

For example, flux treatment, or degassing treatment using a suitable gas such as argon gas or chlorine gas, may be used to remove hydrogen and other unnecessary gases from the aluminum melt.

Cleaning treatment, while not essential, is preferably carried out to prevent defects due to foreign matter such as nonmetallic inclusions and oxides in the aluminum melt, and defects due to dissolved gases in the aluminum melt.

<Crystal Grain Refining Step>

As mentioned above, titanium and/or boron may be dissolved in the melting furnace, although it is preferable to add a $TiB_2$-containing master alloy at the flow channel downstream from the melting furnace.

$TiB_2$ by itself is generally made up of very small particles 1 to 2 μm in size, although it does sometimes agglomerate to form coarse particles which are 100 μm or larger in size. In such cases, because the large particles cause surface unevenness, it is preferable to provide an agitating means on the flow channel.

Moreover, the use of a master alloy having a low $TiB_2$ content is effective for suppressing the formation of large particles. However, if there are few $TiB_2$ particles, the grain refining effect also decreases. Hence, the use of a master alloy having an appropriate $TiB_2$ content is preferred.

<Filtration Step>

Prior to the above continuous casting step, it is preferable to carry out a filtration step in which the above-described aluminum melt is filtered using a filtration tank. This enables the removal of impurities which have entered the aluminum melt and the removal of contaminants remaining in the melting furnace, the melt flow channel and elsewhere. Moreover, filtration also makes it possible to prevent the outflow of the above-described coarse particles of $TiB_2$. Hence, it is preferable for the filtration tank to be situated downstream from the position where the $TiB_2$ is added to the aluminum melt.

The filtration step and the filtration tank used therein are preferably those described in JP 3,549,080 B.

In the eleventh aspect of the invention, prior to the above continuous casting step, a filtration step is carried out in which the aluminum alloy melt is filtered using a filtration tank. In the twelfth to fourteenth aspects of the invention, it is preferable to carry out this filtration step. Impurities which have entered the aluminum melt and contaminants remaining in the melting furnace and the melt flow channel can thus be removed, making it possible to prevent the outflow of coarse particles of $TiB_2$.

<Melt Feeding Step>

In the eleventh aspect of the invention, a melt feeding step is carried out in which the filtered aluminum alloy melt is fed from the filtration tank to a melt feed nozzle via a flow channel. In the melt feeding step, an agitating means provided in a recess formed in a base of the flow channel agitates the aluminum alloy melt. In the twelfth to fourteenth aspects of the invention, when a filtration step has been carried out, this melt feeding step is preferably followed by such agitation. In this way, large particles of $TiB_2$ are prevented from re-agglomerating in stagnant portions of the melt after having passed through the filtration step.

FIG. 1 is schematic view of an exemplary arrangement from a melting furnace to a casting machine.

In a melting furnace 12, an aluminum ingot is melted and iron, silicon and the like are added to give an aluminum melt of the desired composition. The method of adding the iron, silicon and other ingredients is exemplified by, in the first to tenth aspects of the invention, the addition of an Al—Fe (25 wt %) master alloy or an Al—Si (25 wt %) master alloy. In the eleventh to fourteenth aspects of the invention, the method of addition is exemplified by the addition of an Al—Fe (25 wt %) master alloy, an Al—Si (25 wt %) master alloy, or an Al—Cu (25 wt %) master alloy.

An aluminum melt 22 that has been held in the melting furnace 12 is then supplied via a flow channel 14 to a melt feed nozzle 16 in a casting machine 10. A recess 30 is formed in the base of the flow channel 14 at an intermediate position thereon, and a gas discharging element 43 is provided in the recess 30 as the agitating means.

Figure 2:
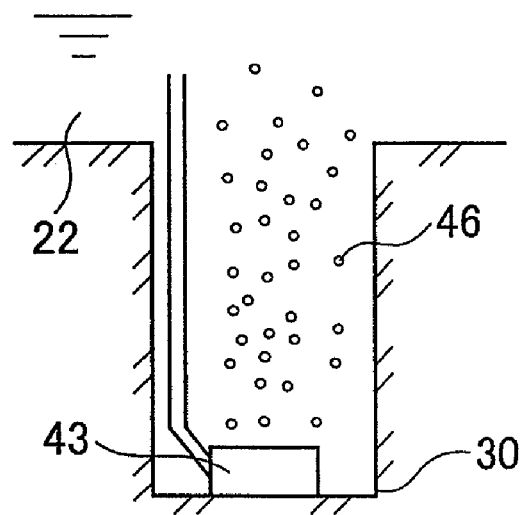
FIG. 2 is a schematic view of an example of a recess provided with an agitating means.

FIG. 2 is a schematic view of an example of the recess provided with the agitating means.

When casting is continued for a long time, impurities having a high specific gravity settle to the bottom of the recess 30. Moreover, $TiB_2$ particles in the aluminum melt have a tendency to be trapped by the stagnation in flow that occurs at the top of the recess 30 and held there for a while. Moreover, the longer the period for which casting is continued, the greater the amount of $TiB_2$ retained, which encourages agglomeration of $TiB_2$. Hence, as shown in FIG. 2, a gas such as argon that does not react with the aluminum melt 22 is discharged as small bubbles 46 from a gas discharging element 43 which is made of ceramic or some other porous material and located within the recess 30, thereby agitating the aluminum melt 22 in the recess 30 and preventing stagnation from occurring.

Figure 3:
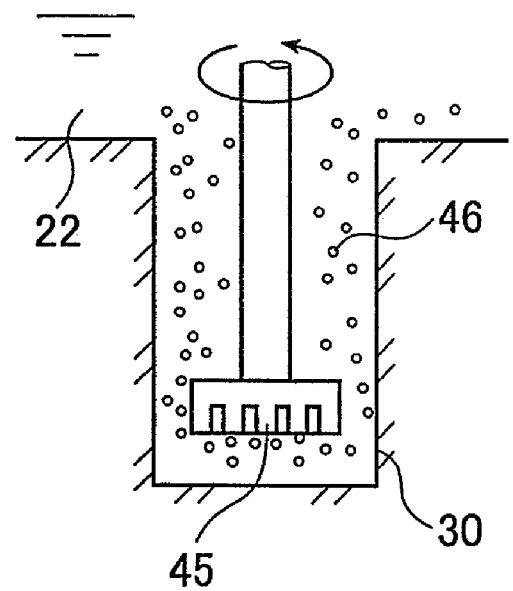
FIG. 3 is a schematic view of another example of the recess provided with an agitating means.

FIG. 3 is a schematic view of another example of the recess provided with an agitating means. As shown in FIG. 3, a gas such as argon that does not react with the aluminum melt 22 is discharged as small bubbles 46 from a rotating rotor 45 in the recess 30, thereby agitating the aluminum melt 22 in the recess 30 and preventing stagnation from occurring.

Such mechanisms are described more fully in JP 2000-24762 A.

Because there is a possibility that particle retention during long-term casting will arise in all recesses which are prone to stagnation, this agitating means preferably carries out agitation in a recess located just prior to the melt feed nozzle.

<Melt Feed Nozzle>

The aluminum melt discharged from the melt feed nozzle comes into contact with the surface of cooling rollers and begins to solidify. If, even when the meniscus of the aluminum melt has been stabilized as described subsequently, the flow of aluminum melt within the melt feed nozzle is non-uniform, the continuously cast aluminum alloy plate will tend to become inhomogeneous. In particular, a concentration or scarcity of iron and silicon will tend to arise in areas where the solidification rate is faster or slower than surrounding areas. There is a possibility that surface unevenness may arise as a result, prompting in turn a decline in the sensitivity of the presensitized plate.

It is thus necessary for the flow of the melt within the melt feed nozzle to be made uniform. However, because the gap between the pair of cooling rollers is from several millimeters to about ten millimeters in size and thus very small, the nozzle which feeds the melt thereto also has a very narrow construction, and so the space in the interior of the nozzle through which the aluminum melt passes is also narrow. Hence, any disruption in the smooth flow of the aluminum melt in the nozzle interior will immediately result in a non-uniformity in the flow of the aluminum melt.

To ensure that the aluminum melt flows smoothly through the nozzle, it is preferable for the inner wall of the nozzle to have a low aluminum melt wettability. To this end, it is preferable for the inner wall of the nozzle to be made of a material having a low wettability with respect to the aluminum melt, and also having a suitable degree of irregularities. JP 10-225750 A describes a method for specifying the degree of roughness on the nozzle inner wall.

Specifically, in the thirteenth aspect of the invention, the above-described melt feed nozzle is coated beforehand, on the inner wall that comes into contact with the aluminum alloy melt, with a parting agent containing filler particles having a particle size distribution with a median diameter of 5 to 20 μm and a modal diameter of 4 to 12 μm. In the first to tenth and the eleventh, twelfth and fourteenth aspects of the invention, it is preferable for such a parting agent to be coated. Illustrative examples of parting agents which encourage smooth flow of the aluminum melt include parting agents that use compounds such as zinc oxide or boron nitride (BN) as the filler therein. Of these, a parting agent which uses boron nitride as the filler therein is desirable. Preferred use can be made of the method described in JP 11-192537 A.

Here, when the aluminum melt moves from the tip of the melt feed nozzle to the surface of the cooling rollers, a meniscus is formed in the aluminum melt. Oscillation of this meniscus causes the point of contact with the cooling rollers to oscillate, as a result of which areas having different solidification histories arise on the surface, making inhomogeneities in the crystal structure and segregation of the trace elements more likely to occur. These imperfections, which are called "ripple marks", tend to cause surface unevenness when surface treatment is carried out on the lithographic printing plate support after the aluminum alloy plate has been subjected to cold rolling, intermediate annealing and finish cold rolling.

In the twelfth aspect of the invention, (a) the melt feed nozzle has, at a tip thereof, a bottom outside face which is acutely angled with respect to the direction in which the aluminum alloy melt is discharged from the nozzle, and/or (b) the melt feed nozzle includes a top plate member which contacts the aluminum alloy melt from above and a bottom plate member which contacts the aluminum alloy melt from below, each of which is vertically movable, and the top plate member and bottom plate member are each subjected to pressure by the aluminum alloy melt and thereby pushed against an adjoining cooling roller surface. In the first to tenth, eleventh, thirteenth and fourteenth aspects of the invention, it is preferable for either or both of these conditions to be satisfied.

When the bottom outside face at the tip of the melt feed nozzle is acutely angled with respect to the direction in which the aluminum alloy melt is discharged, the position at which the aluminum melt leaves the nozzle tip is readily stabilized in one place, enabling ripple marks to be minimized. For example, preferred use can be made of the method described in JP 10-58094 A.

It is more preferable for the melt feed nozzle tip to have a top outside face which is acutely angled with respect to the direction of aluminum alloy melt discharge.

It is preferable for the melt feed nozzle to have a shape such that the nozzle opening has an outer edge which contacts the cooling rollers and has an outer periphery with a relief recessed therein to avoid contact with the cooling rollers. In such an arrangement, only the tip of the melt feed nozzle is constantly in touch with the cooling rollers, increasing the stability of the melt at the tip of the nozzle, which is desirable.

Figure 5:
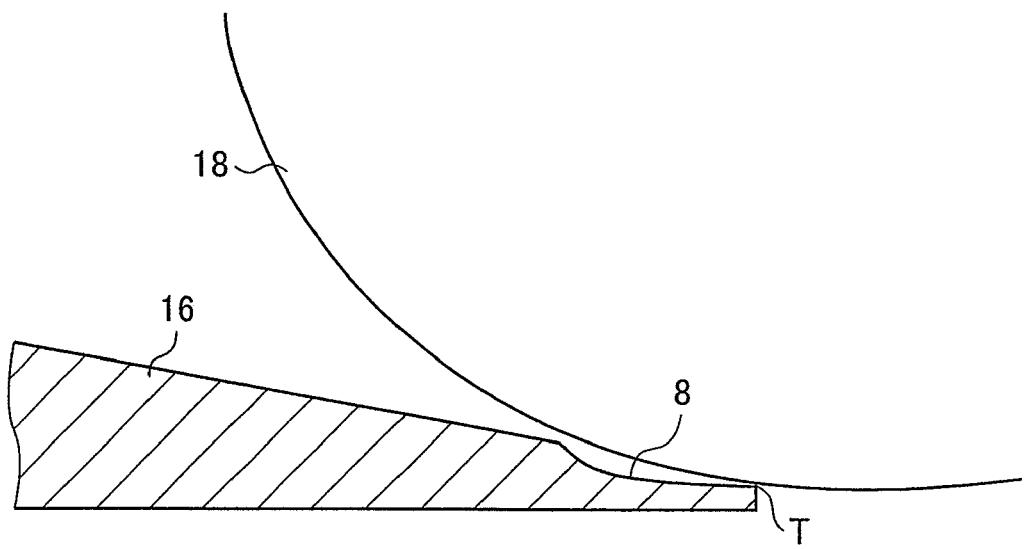
FIG. 5 is a schematic view of a preferred example of the shape of the melt feed nozzle and the relative positions of the nozzle and a cooling roller.

FIG. 5 is a schematic view of a preferred example of the shape of the melt feed nozzle and its position relative to a cooling roller. In FIG. 5, only the nozzle plate and cooling roller on the top side of the nozzle are shown, but the same positional relationship exists between the nozzle plate and cooling roller on the bottom side of the nozzle.

In FIG. 5, the outer edge of the melt feed nozzle 16 opening contacts the cooling roller 18, and the outer periphery of the nozzle 16 opening has a relief (chamfer) recessed therein to avoid contact with the cooling roller 18. Hence, only the tip T of the melt feed nozzle 16 touches the cooling roller 18. The relief (chamfer) is preferably provided over the entire width of the melt feed nozzle 16.

By adopting such a construction, no gap that may form a space where the melt meniscus can fluctuate is provided. As a result, there can be obtained an aluminum alloy plate in which appearance defects do not arise. In turn, a lithographic printing plate support in which appearance defects have been further suppressed can be obtained.

In addition, to reduce the amplitude of oscillation of the meniscus, it is preferable to shorten the distance between the tip of the nozzle and the surface of the cooling rollers. To this end, ideally, it is preferable for the nozzle tip having a bottom outside face (and especially bottom and top outside faces) which is acutely angled with respect to the direction of melt discharge to be constantly in contact with the cooling roller surface.

More specifically, in a preferred arrangement, the melt feed nozzle includes a top plate member which contacts the aluminum alloy melt from above and a bottom plate member which contacts the aluminum alloy melt from below, each of which is vertically movable, and the top plate member and bottom plate member are each subjected to pressure by the aluminum alloy melt and thereby pushed against the adjoining cooling roller surface. For example, preferred use can be made of the arrangement described in JP 2000-117402 A.

In this way, the tip of the melt feed nozzle is always in contact with the cooling rollers. As a result, the melt meniscus maintains a constant shape, enabling a lithographic printing plate support in which appearance defects have been suppressed to be obtained.

Figure 6A:
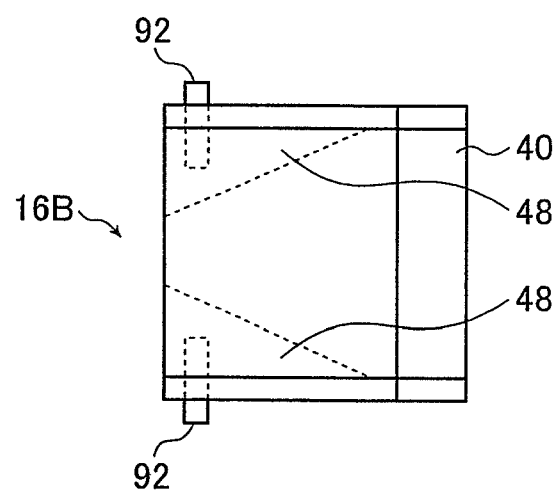
FIGS. 6A and 6B are schematic views of another example of the melt feed nozzle which has a tip with a movable construction.
Figure 6B:
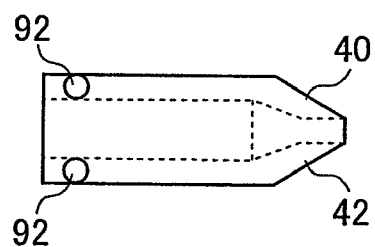

FIGS. 6A and 6B are schematic views of another example of the melt feed nozzle which has a tip with a movable construction. FIG. 6A is a top view, and FIG. 6B is a side view.

In a melt feed nozzle 16B shown in FIGS. 6A and 6B, a top plate member 40 and a bottom plate member 42 are fixed with pins 92 in such a way as to allow the tip of the top plate member 40 and the tip of the bottom plate member 42 to pivot a little about the respective pins 92 in response to pressure from the aluminum melt. The respective tips of the top plate member 40 and the bottom plate member 42 can thus be brought into contact with the cooling rollers under pressure from the aluminum melt.

<Cooling Rollers>

The cooling rollers are not subject to any particular limitation. For example, use may be made of known cooling rollers having an iron core/shell construction. When cooling rollers with a core-shell construction are used, the cooling ability at the surface of the cooling rollers can be increased by having cooling water flow through channels provided between the core and the shell. Moreover, the aluminum alloy plate can be set precisely to a desired thickness by further rolling the solidified aluminum.

The aluminum which has solidified at the cooling roller surface may have a tendency to stick to the cooling rollers in this state, making it difficult to continuously carry out stable casting. Hence, in the fourteenth aspect of the invention, a parting agent is applied to the surface of the pair of cooling rollers. In the first to tenth and the eleventh to thirteenth aspects of the invention, it is preferable to apply such a parting agent. The parting agent is preferably one having an excellent heat resistance. Suitable examples include parting agents which contain carbon graphite. The method of application is not subject to any particular limitation. A suitable example is a method in which a suspension of carbon graphite particles (preferably an aqueous suspension) is sprayed on. Spraying is preferred because the parting agent can be supplied to the cooling rollers without direct contact with the cooling rollers.

Here, if the thickness of the applied parting agent differs in the width direction and/or circumferential direction of the cooling rollers, this will have an influence on the rate of heat transfer to the cooling rollers and lead to crystal grain inhomogeneities. Hence, in the fourteenth aspect of the invention, the thickness of the parting agent that has been applied is made uniform. In the first to tenth and the eleventh to thirteenth aspects of the invention, when a parting agent is applied to the surface of the pair of cooling rollers, it is preferable to make the thickness of the applied parting agent uniform.

Specifically, one preferred method for doing so is to bring a wiper made of a refractory material or a heat-resistant cloth into contact with the surface of the cooling roller under a uniform pressure. Alternatively, if there is no danger of direct contact with the melt, the thickness of the applied parting agent can similarly be made uniform using a cloth made of cotton or the like.

Because the parting agent becomes trapped by the wiper or other thickness uniformizing means or moves to the surface of the continuously cast aluminum alloy plate, it is desirable to periodically supply fresh parting agent to the surface of the cooling rollers.

If the melt feed nozzle comes into non-uniform contact with the cooling rollers in the width direction, the parting agent on the surfaces of the cooling rollers will be scraped off in some areas, as a result of which the thickness of the parting agent on the surfaces of the rollers will tend to become non-uniform, which will tend to compromise the uniformity of the crystal grains. Non-uniformity of the crystal grains in turn leads to streak-like appearance defects when a lithographic printing plate support is manufactured from the aluminum alloy plate.

Therefore, in the fourteenth aspect of the invention, the melt feed nozzle has an opening with an outer edge which does not contact the cooling rollers or which contacts the rollers only at the nozzle tip. In the first to tenth and the eleventh to thirteenth aspects of the invention, it is preferable for the melt feed nozzle to have an opening with an outer edge which does not contact the cooling rollers or which contacts the rollers only at the nozzle tip.

Of the above, contacting the cooling rollers only at the nozzle tip is more preferred in that ripple marks can thereby be minimized.

The circumferential speed of the cooling rollers has a large influence on the course of solidification in continuous casting.

If the circumferential speed is too high, solidification will be inadequate, making it impossible to cast the aluminum alloy plate. On the other hand, if the circumferential speed is too low, solidification will tend to arise from an early stage, which may result in partial solidification within the melt feed nozzle. In such a case, unlike solidification that occurs when the melt comes into contact with the cooling rollers, very large crystal grains tend to be formed. Therefore, it is desirable for the circumferential speed of the cooling rollers to be made as rapid as possible within a range that allows solidification to occur.

Accordingly, it is preferable for the cooling roller to have a circumferential velocity V (m/min), for the aluminum alloy plate to have a thickness t (m) and for the cooling rollers to have a diameter D (m) which satisfy Eq. below. This will enable the formation of large crystal particles to be suppressed, and the maximum width of crystal grains in the aluminum alloy plate following finish cold rolling to be made smaller.

$$V \geq 5 \times 10^{-6} \times (D/t^2), \text{ preferably } V \geq 5 \times 10^{-5} \times (D/t^2)$$

<Casting>

Casting is carried out by using the melt feed nozzle to feed the aluminum melt between a pair of cooling rollers and rolling the melt as it is being solidified by the pair of cooling rollers so as to form an aluminum alloy plate.

As shown in FIG. 1, in the casting machine 10, the aluminum melt 22 is fed between the pair of cooling rollers 18 by the melt feed nozzle 16. The aluminum melt 22 is rolled as it is being solidified by the cooling rollers 18, forming an aluminum alloy plate 36. For a good cold rolling efficiency, the thickness of the aluminum alloy plate 36 thus obtained is preferably small, and is generally set at from 1 to 10 mm.

Figure 4:
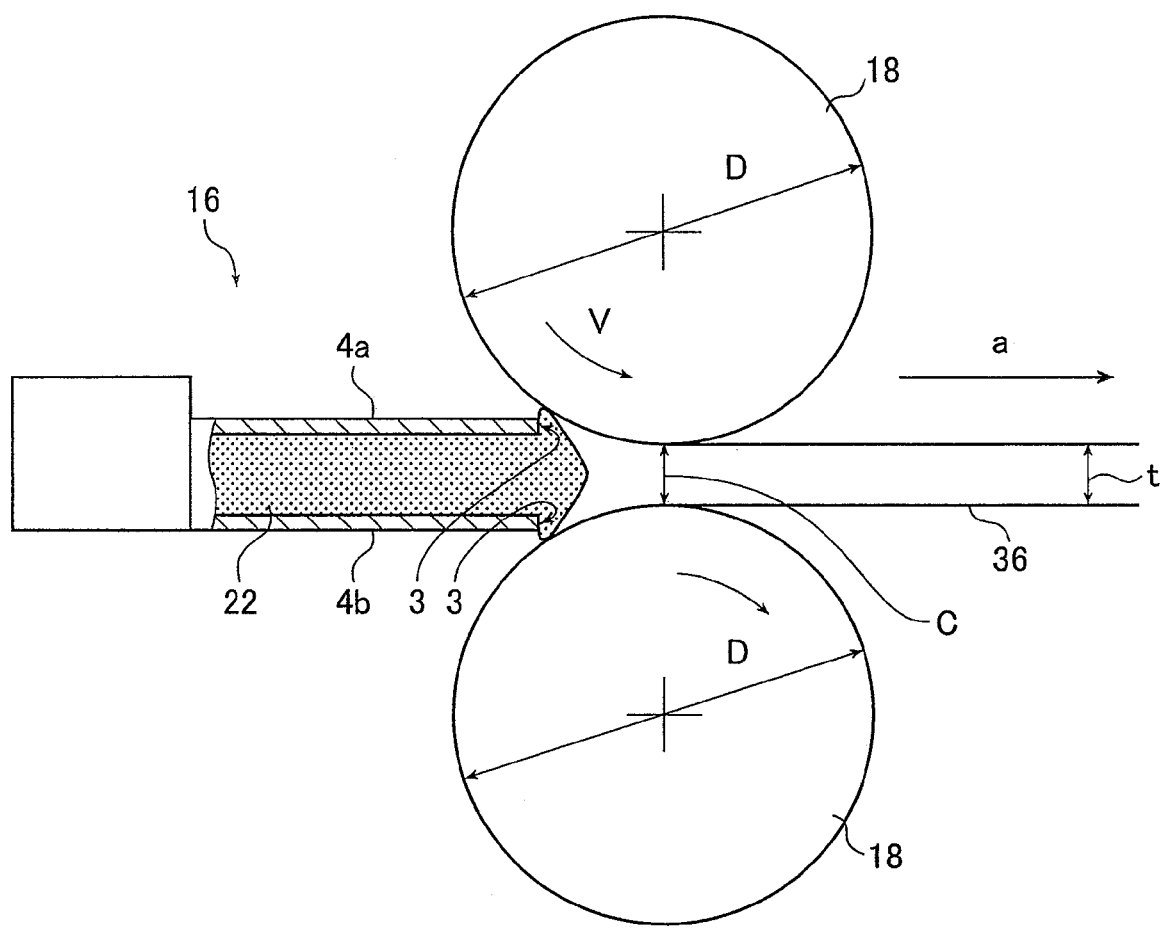
FIG. 4 is a schematic view of an example of the relative arrangement of cooling rollers, a melt feed nozzle, an aluminum alloy plate, an aluminum melt and a melt meniscus.

FIG. 4 is a schematic diagram showing an example of the relative positions of the cooling rollers, the melt feed nozzle, the aluminum alloy plate, the aluminum melt and the melt meniscus. In FIG. 4, the aluminum melt 22 passes through the melt feed nozzle 16 including a pair of nozzle plates 4a and 4b and side plates (not shown), and is fed between the pair of cooling rollers 18 which have been installed with a clearance C therebetween, turn in the direction of the arrow V and have a diameter D, thereby casting an aluminum alloy plate in the direction of the arrow a. The aluminum melt 22 spreads vertically within a gap defined by the nozzle outlet and top and bottom sides having curvatures corresponding to the diameter of the cooling rollers, thereby forming a melt meniscus 3. In the aluminum melt 22 which comes into contact with the cooling rollers 18, because heat flows toward the center of each of the pair of cooling rollers 18, the crystal structure grows in the same direction as the flow of heat. The cast aluminum alloy plate has a thickness t which is substantially equal to the clearance C between the cooling rollers 18 or is a value equivalent to the sum of the clearance C and elastic deformation of the casting machine and the aluminum alloy plate.

<Cold Rolling>

Following the continuous casting step, cold rolling is carried out. Cold rolling is a step which further reduces the thickness of the aluminum alloy plate obtained in the continuous casting step. This enables the aluminum alloy plate to have the desired thickness. The cold rolling step may be carried out by a conventionally known method.

Figure 7:
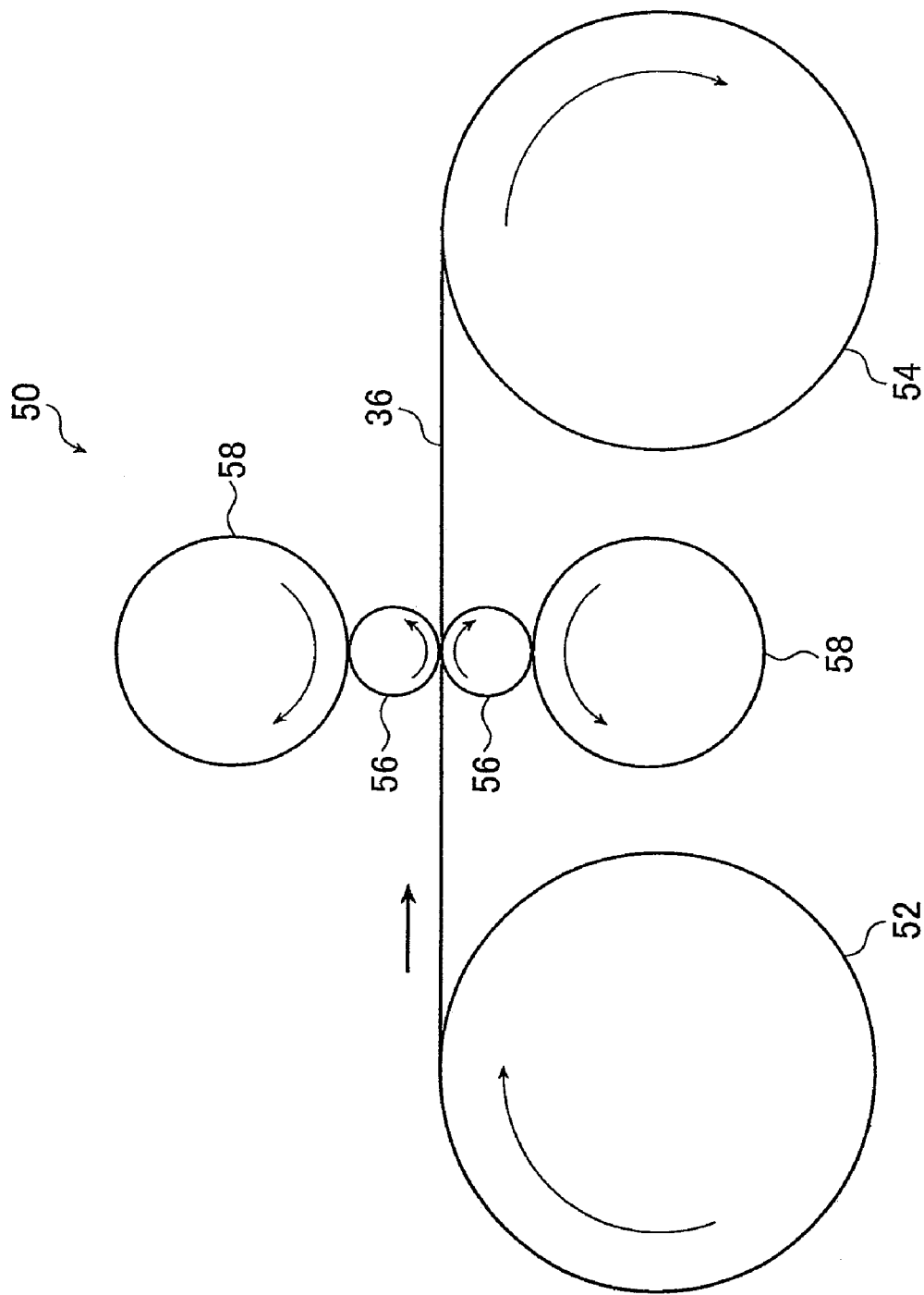
FIG. 7 is a schematic view of an example of a cold rolling mill that may be used in cold rolling.

FIG. 7 is a schematic diagram showing an example of a cold rolling mill that may be used for cold rolling. The cold rolling mill 50 shown in FIG. 7 carries out cold rolling by applying pressure to the aluminum alloy plate 36 which travels between a delivery coil 52 and a take-up coil 54 using a pair of cold-rolling rollers 56, each of which is rotated by a supporting roller 58.

<Intermediate Annealing>

After the cold rolling step, intermediate annealing is carried out. Intermediate annealing is a step in which the aluminum alloy plate in the cold rolling step is heat treated.

A continuous casting step, unlike a process which uses a conventional stationary mold for casting, is capable of cooling and solidifying aluminum very rapidly. As a result, the crystal grains within the aluminum alloy plate obtained by continuous casting can be refined to a much greater degree than is possible with a method that uses a conventional stationary mold. However, because the crystal grains thus obtained are still rather large, appearance defects (surface unevenness) attributable to the size of the crystal grains tend to arise when the aluminum alloy plate obtained after finish cold rolling is subjected to graining treatment to obtain a lithographic printing plate support.

Hence, when intermediate annealing is carried out after the buildup of strain in the above-described cold rolling step, the dislocations that have accumulated in the cold rolling step are released, re-crystallization occurs, and the crystal grains can be refined even further. Specifically, the crystal grains can be controlled by the reduction ratio in the cold rolling step and the heat treatment conditions (especially temperature, time and temperature rise rate) in the intermediate annealing step.

For example, when continuous annealing is carried out, heating is carried out at generally 300 to 600° C. for up to 10 minutes, preferably at 400 to 600° C. for up to 6 minutes, and more preferably at 450 to 550° C. for up to 2 minutes. Moreover, the temperature rise rate is generally set to about 0.5 to 500° C./min, although the formation of smaller crystal grains can be promoted by setting the temperature rise rate to 10 to 200° C./s or more and by shortening the holding time following temperature rise to at most 10 minutes, and preferably 2 minutes or less.

In the eleventh to fourteenth aspects of the invention, the respective amounts of the elemental iron, silicon and copper in solid solution within the aluminum alloy plate are controlled in the intermediate annealing step. This is described more fully below.

A continuous casting step, unlike a process which uses a conventional stationary mold for casting, is capable of cooling and solidifying aluminum very rapidly. As a result, the respective amounts of elemental iron, silicon and copper in solid solution within the aluminum alloy plate obtained by continuous casting are higher than in a process which uses a conventional stationary mold. The size of the intermetallic compounds which precipitate out into the aluminum alloy plate obtained by continuous casting is smaller than in a process which uses a conventional stationary mold for casting.

On the other hand, when extended heating has been carried out in the intermediate annealing step, the respective elements that were already in solid solution sometimes precipitate out, resulting in a dramatic drop in the amounts of these elements in solid solution. As a result, the specific amounts in solid solution mentioned later in the specification cannot be ensured, making the surface shape that arises from electrochemical graining treatment extremely unstable and non-uniform. As a result, following surface treatment, it may not be possible to suppress surface unevenness caused by non-uniformity in the aluminum alloy plate. Moreover, further surface shape instability and non-uniformity brings with it a decline in the printing performance.

As noted above, in the eleventh to fourteenth aspects of the invention, various methods may be used in the continuous casting step for suppressing surface unevenness due to surface treatment.

When these methods alone are used, the crystal structure prior to the subsequently described graining treatment will appear uniform. Yet, after graining treatment, particularly when the amount of material removed by alkali etching is large, any history of inhomogeneity in the crystal structure will tend to be revealed.

In the eleventh to fourteenth aspects of the invention, a method for suppressing various types of inhomogeneities that cause surface unevenness is used in the aluminum alloy plate continuous casting step. Moreover, in the intermediate annealing step, by controlling the respective amounts of elemental iron, silicon and copper in solid solution, it is possible to achieve excellent uniformity in the subsequently described electrochemical graining treatment and thus to keep surface unevenness caused by the aluminum alloy plate production step from arising.

In the eleventh to fourteenth aspects of the invention, according to one preferred embodiment, the intermediate annealing step is carried out by batch annealing at a temperature of 300 to 560° C. for a period of 2 to 20 hours. This suppresses the precipitation of the respective elements in solid solution, and promotes the re-entry of precipitated elements into solid solution. As a result, the respective amounts of these elements in solid solution are ensured. To prevent the crystal grains from becoming larger in size, it is preferable for the intermediate annealing step in these aspects of the invention to be carried out at a temperature of not more than 560° C. and for a period of up to 20 hours.

According to another preferred embodiment, the intermediate annealing step is carried out by continuous annealing at a temperature of 500 to 600° C. for a period of 1 second to 5 minutes. This suppresses the precipitation of the respective elements in solid solution, and promotes the re-entry of precipitated elements into solid solution. As a result, the respective amounts of these elements in solid solution are ensured. To prevent the crystal grains from becoming larger in size, it is preferable for the intermediate annealing step in these aspects of the invention to be carried out at a temperature of not more than 600° C. and for a period of up to 5 minutes.

<Finish Cold Rolling>

After intermediate annealing, a finish cold rolling step is carried out. Finish cold rolling reduces the thickness of the intermediate-annealed aluminum alloy plate. The plate thickness following the finish cold rolling step is preferably from 0.1 to 0.5 mm.

The cold rolling step may be carried out by a conventionally known method. For example, it may be carried out by a method similar to the cold rolling step carried out prior to the above-described intermediate annealing step.

In the eleventh to fourteenth aspects of the invention, the aluminum alloy plate following the finish cold rolling step contains in solid solution at least 20 ppm of iron, at least 20 ppm of silicon, and at least 70 wt % of copper in relation to the total amount of copper in the plate. As noted above, the respective amounts of elemental iron, silicon and copper in solid solution can be achieved by the intermediate annealing step.

When the amounts of elemental iron, silicon and copper in solid solution fall within the above ranges, the uniformity of electrochemical graining treatment will be excellent. It is preferable for the amount of iron in solid solution to be at least 25 ppm, for the amount of silicon in solid solution to be at least 50 ppm, and for the amount of copper in solid solution to be at least 70 wt % of the total copper in the plate. The amount of copper in solid solution is preferably at least 100 ppm, but preferably not more than 500 ppm.

<Flatness Correction>

In the practice of the invention, it is preferable to carry out a flatness correcting step after the finish cold rolling step and before the graining step. Flatness correction involves correcting the flatness of the aluminum alloy plate.

The flatness correcting step can be carried out by a conventionally known method. For example, this step can be carried out using a straightening machine such as a roller leveler or a tension leveler.

FIG. 8 is a schematic view of an example of a straightening machine. A straightening machine 70 shown in FIG. 8 improves the flatness of the aluminum alloy plate 36 traveling between a delivery coil 82 and a take-up coil 84 while applying tension to the plate with a leveler 80 that includes work rolls 86. The plate is then cut to a given width with a slitter 88.

<Slitting>

A slitting step in which the plate is passed through a slitter line is also carried out by a conventionally known method to cut the plate to a given width.

<Graining Treatment>

The surface of the above-described aluminum alloy plate is subjected to graining treatment which includes at least alkali etching followed by electrochemical graining.

Either the top side or the bottom side in the aluminum alloy plate casting step may be used as the surface of the aluminum alloy plate to be treated. However, use of the top side is preferred because few large $TiB_2$ particles are formed at the top, making surface unevenness due to graining treatment less likely to arise.

Graining treatment generally consists of one or a combination of two or more of the following: mechanical graining, chemical graining and electrochemical graining.

In the practice of the invention, graining treatment includes both alkali etching and subsequent electrochemical graining treatment, although it may also include other types of graining treatment.

For example, in one preferred embodiment of the invention, a first alkali etching treatment, a first electrochemical graining treatment using an alternating current in a nitric acid-containing electrolyte, a second alkali etching treatment, and a second electrochemical graining treatment using an alternating current in a hydrochloric acid-containing electrolyte are carried out in this order.

The treatments that may be included in graining treatment are each described below.

<Mechanical Graining>

Mechanical graining is generally carried out to give the surface of the aluminum alloy plate a mean surface roughness of 0.35 to 1.0 μm. Methods such as those described in JP 6-135175 A and JP 50-40047 B may be used to carry out mechanical graining. This type of treatment is preferably carried out prior to electrochemical graining (prior to the first electrochemical graining treatment if electrochemical graining is carried out a plurality of times).

Mechanical graining preferably involves the use of a rotating nylon brush roll having a bristle diameter of 0.2 to 0.9 mm and an abrasive-containing slurry that is supplied to the surface of the aluminum alloy plate. Alternatively, use may be made of a technique that involves spraying of the slurry, a technique that involves the use of a wire brush, or a technique in which the surface shape of a textured metal-rolling roll is transferred to the aluminum alloy plate. The last of these methods is better than methods which use a brush or an abrasive because there is less tendency for locally deep areas to be formed.

In cases where the arithmetical mean roughness is to be set to less than 0.35 μm, mechanical graining treatment is generally not carried out.

<Chemical Etching>

In chemical etching treatment, the surface of the aluminum alloy plate is chemically etched in an aqueous alkali solution or an aqueous acid solution. In the practice of the invention, alkali etching treatment having an excellent dissolution efficiency is carried out using an aqueous alkali solution. A conventionally known method may be used to carry out alkali etching treatment. In working the present invention, alkali etching treatment is carried out before the first electrochemical graining treatment.

Alkali etching treatment is carried out to dissolve the edges of irregularities that were formed on the surface of the plate during mechanical graining treatment, so as to obtain a smoothly undulating surface. As a result, lithographic printing plates of excellent scumming resistance can be obtained.

In cases where mechanical graining treatment has not been carried out, alkali etching treatment is used to remove foreign matter such as rolling oils remaining on the surface of the aluminum alloy plate.

Illustrative examples of aqueous alkali solutions that may be used in alkali etching treatment include aqueous solutions containing one or more of the following: sodium hydroxide, sodium carbonate, sodium aluminate, sodium metasilicate, sodium phosphate, potassium hydroxide and lithium hydroxide. An aqueous solution composed mainly of sodium hydroxide is especially preferred. The aqueous alkali solution may contain 0.5 to 10 wt % of aluminum and also alloying ingredients present in the aluminum alloy plate.

The aqueous alkali solution has a concentration of preferably 1 to 50 wt %, and more preferably 1 to 30 wt %.

It is advantageous to carry out alkali etching treatment preferably for a period of 1 to 120 seconds, and more preferably 2 to 60 seconds, at an aqueous alkali solution temperature of preferably from 20 to 100° C., and more preferably from 40 to 80° C.

The amount of aluminum dissolution in alkali etching treatment following mechanical graining treatment is preferably 1 to 20 $g/m^2$ on the surface of the aluminum alloy plate on which graining treatment is carried out. Excessive alkali etching treatment is undesirable because surface unevenness due to host crystals present within the aluminum alloy plate readily occurs. Hence, the amount of aluminum dissolution is preferably 1 to 13 g/m², and more preferably 2 to 13 g/m².

When mechanical graining treatment has not been carried out, it is preferable for the amount of aluminum dissolution to be from 1 to 6 g/m² on the surface of the aluminum alloy plate on which graining treatment is carried out.

As described above, by setting the amount of aluminum dissolution on the surface of the aluminum alloy plate on which graining treatment is carried out to be at least 1 g/m², impurities near the surface layer of the aluminum alloy plate can be completely removed, enabling uniform electrochemical graining treatment to be carried out.

It is preferable for the amount of aluminum dissolution on the surface of the aluminum alloy plate on which graining treatment is not carried out, i.e., the back side, to be at least 1 g/m².

<Electrochemical Graining>

Electrochemical graining is a treatment in which an alternating current or a direct current is passed through the aluminum alloy plate as the electrode in an aqueous acid solution so as to electrochemically grain the surface of the plate. Electrochemical graining may be carried out using a conventionally known method.

Electrochemical graining is carried out with the aim of forming crater-like or honeycomb-like pits having an average diameter of about 0.05 to 20 μm to a surface area ratio of 30 to 100% on the surface of the aluminum alloy plate. Electrochemical graining treatment enhances the press life and the scumming resistance in non-image areas of the lithographic printing plate.

Any aqueous acid solution used in conventional electrochemical graining involving the use of direct current or alternating current may be employed in electrochemical graining treatment, although the use of a nitric acid-containing aqueous acid solution or a hydrochloric acid-containing aqueous acid solution is preferred.

For example, use can be made of a nitric acid-containing aqueous acid solution prepared by adding to an aqueous nitric acid solution having a nitric acid concentration of 1 to 100 g/L at least one nitrate compound having nitrate ions, such as aluminum nitrate, sodium nitrate or ammonium nitrate, to a concentration of from 0.01 g/L to saturation. Metals which are present in the aluminum alloy, such as iron, copper, manganese, nickel, titanium, magnesium and silicon may be dissolved in the nitric acid-containing aqueous acid solution.

Alternatively, use can be made of a hydrochloric acid-containing aqueous acid solution prepared by adding to an aqueous hydrochloric acid solution having a hydrochloric acid concentration of 1 to 100 g/L at least one chloride compound containing chloride ions, such as aluminum chloride, sodium chloride or ammonium chloride, to a concentration of from 0.01 g/L to saturation. Metals which are present in the aluminum alloy, such as iron, copper, manganese, nickel, titanium, magnesium and silicon may be dissolved in the hydrochloric acid-containing aqueous acid solution.

After electrochemical graining treatment with primarily nitric acid, alkali etching and desmutting are carried out, following which electrochemical graining treatment with primarily hydrochloric acid may be carried out as the second electrochemical graining treatment.

Thus, in cases where the amount of aluminum dissolution in alkali etching treatment is large, surface unevenness on the lithographic printing plate support arising from the host crystals that were formed during casting can be prevented by increasing the total amount of electricity during the anode reaction in electrochemical graining treatment. Specifically, it is preferable for the total amount of electricity during the anode reaction on the aluminum plate to be at least 500 C/dm².

On the other hand, if the total amount of electricity during the anode reaction in electrochemical graining is too large, the surface unevenness reducing effect will diminish. By having this value fall within the above range, a larger effect can be achieved.

Electrochemical graining treatment can also be carried out as a combination of two or more treatments. For example, after initially carrying out the first electrochemical graining treatment using a nitric acid-containing electrolyte, then carrying out alkali etching (and preferably also desmutting), the second electrochemical graining treatment may be carried out using a hydrochloric acid-containing electrolyte. In this case, a more finely textured structure formed in the second electrochemical graining treatment can be superimposed on the surfaces of the irregularities formed in the first electrochemical graining treatment.

The amount of electricity in the first electrochemical graining treatment is preferably such that the total amount of electricity during the anode reaction at the aluminum plate is from 50 to 1,000 C/dm², and preferably at least 500 C/dm², and the amount of electricity in the second electrochemical graining treatment is preferably such that the total amount of electricity during the anode reaction at the aluminum plate is from 30 to 80 C/dm².

Alternatively, by using hydrochloric acid in both the first electrochemical graining treatment and the second electrochemical graining treatment and changing the respective conditions, a more finely textured structure formed in the second electrochemical graining treatment can be superimposed on the surfaces of the irregularities formed in the first electrochemical graining treatment.

The amount of electricity in the first electrochemical graining treatment is preferably such that the total amount of electricity during the anode reaction at the aluminum plate is from 50 to 1,000 C/dm², and preferably at least 500 C/dm², and the amount of electricity in the second electrochemical graining treatment is preferably such that the total amount of electricity during the anode reaction at the aluminum plate is from 30 to 80 C/dm².

Alternatively, after initially carrying out a first electrochemical graining treatment using a hydrochloric acid-containing electrolyte, then carrying out alkali etching (and preferably also desmutting), a second electrochemical graining treatment may be carried out using a nitric acid-containing electrolyte.

In this case, the fine irregularities having a diameter of about 0.1 to 0.5 μm which were formed on the surface in the first electrochemical graining treatment using a hydrochloric acid-containing electrolyte readily become the starting points for pit-forming reactions in the subsequent second electrochemical graining treatment carried out using a nitric acid-containing electrolyte. Therefore, because irregularities due to nitric acid electrolysis are formed uniformly over the entire surface, surface unevenness can be prevented from arising.

The amount of electricity in the first electrochemical graining treatment is preferably such that the total amount of electricity during the anode reaction at the aluminum plate is from 30 to 80 C/dm², and the amount of electricity in the second electrochemical graining treatment is preferably such that the total amount of electricity during the anode reaction at the aluminum plate is from 50 to 300 C/dm².

As noted above, it is preferable to include alkali etching and desmutting steps between the first electrochemical graining treatment and the second electrochemical graining treatment, although such steps may be omitted.

The total amount of electricity in electrochemical graining during the anode reaction on the surface of the aluminum alloy plate on which graining treatment is carried out is preferably at least 50 C/dm$^2$. Within this range, unevenness due to surface treatment on the surface of the lithographic printing plate support can be more reliably suppressed.

The average current density during the anode reaction in electrochemical graining treatment is preferably at least 5 A/dm$^2$. Within this range, the dispersibility of pits in electrochemical graining treatment is good.

<Electropolishing Treatment or Second Chemical Etching Treatment>

Electropolishing is a treatment in which electrolysis is carried out in an aqueous acid solution using the aluminum alloy plate as the electrode. Any conventionally known electropolishing method may be used.

The electropolishing treatment or second chemical etching treatment is carried out to remove smut consisting primarily of aluminum hydroxide that has been formed in electrochemical graining treatment, and to smooth the edges of the pits that have been formed and thereby ultimately improve scumming resistance in lithographic printing plates obtained from the treated aluminum alloy plates.

The amount of dissolution from the aluminum alloy plate in electropolishing treatment or the second chemical etching treatment is preferably 0.05 to 5 g/m$^2$, and more preferably 0.1 to 3 g/m$^2$.

<Desmutting>

Following the first, second and any subsequent alkali etching treatments, it is advantageous to carry out desmutting treatment using an acidic solution.

Desmutting treatment may be carried out by a conventionally known method. For example, desmutting is carried out by bringing the aluminum alloy plate into contact with an acidic solution (containing 0.01 to 5 wt % of aluminum ions) having a concentration of hydrochloric acid, nitric acid, sulfuric acid or the like of 0.5 to 30 wt %. Illustrative examples of methods for bringing the aluminum alloy plate into contact with the acidic solution include dipping the aluminum alloy plate in a tank filled with the acidic solution (dipping), and spraying the surface of the aluminum alloy plate with the acidic solution (spraying).

In the practice of the invention, in desmutting treatment, particularly desmutting treatment just prior to anodizing treatment, it is advantageous to use a dipping technique and additionally impart ultrasonic oscillations in an acidic solution because TiB$_2$ particles present at the surface can be thereby removed, enabling the effective suppression of surface unevenness caused by TiB$_2$ particles. The method of imparting ultrasonic oscillations is not subject to any particular limitation. In one exemplary method, an immersion tank that is outfitted with an ultrasonic oscillator and somewhat larger than the dipping tank so that the entire dipping tank can be immersed therein is filled with water, and ultrasonic oscillations are applied within the dipping tank.

<Anodizing Treatment>

In the practice of the invention, after graining treatment, it is preferable to carry out anodizing treatment. Anodizing treatment is carried out to increase the wear resistance at the surface of the aluminum alloy plate.

Anodizing treatment may be carried out by any method commonly used in this technical field. For example, an anodized layer may be formed on the surface of the aluminum alloy plate by passing a current through the plate as the anode in a solution having a sulfuric acid concentration of 50 to 300 g/L and an aluminum ion concentration of 5 wt % or less. The solution used in anodizing treatment is not subject to any particular limitation so long as it is capable of forming an oxide layer on the aluminum alloy plate. Illustrative examples include solutions of sulfuric acid, phosphoric acid, oxalic acid, chromic acid, and mixtures thereof. The electrolyte concentration may be selected as appropriate for the type of electrolyte.

The anodizing treatment conditions vary empirically according to the electrolyte used, although it is generally suitable for the electrolyte to have a concentration of 1 to 80 wt % and a temperature of 5 to 70° C., and for the current density to be 1 to 60 A/dm$^2$, the voltage to be 1 to 100 V, and the electrolysis time to be 10 to 300 seconds. These conditions are adjusted to obtain the desired anodized layer weight.

<Sealing Treatment>

In the practice of the invention, sealing treatment may be carried out so as to seal micropore openings in the anodized layer that has been formed by anodizing treatment.

Illustrative examples of sealing treatment include a method in which the aluminum alloy plate is immersed in hot water or an aqueous solution containing an inorganic or organic salt, and a method in which the aluminum alloy plate is passed through a steam bath.

<Hydrophilizing Treatment>

In working the invention, it is preferable to carry out hydrophilizing treatment after anodizing treatment. Hydrophilizing treatment involves rendering the surface of the lithographic printing plate support hydrophilic.

Illustrative examples of hydrophilizing treatment include the alkali metal silicate (e.g., aqueous sodium silicate solution) methods described in U.S. Pat. Nos. 2,714,066, 3,181,461, 3,280,734 and 3,902,734. In this type of method, the aluminum alloy plate is immersed, or subjected to electrolysis, in an aqueous solution of sodium silicate.

Use can also be made of methods involving treatment with potassium hexafluorozirconate as described in JP 36-22063 B, and methods involving treatment with polyvinylphosphonic acid, as described in U.S. Pat. Nos. 3,276,868, 4,153,461 and 4,689,272.

The inventive lithographic printing plate support which may be thus obtained has, in a surface layer of up to 20 µm from the grained surface, an iron concentration and a silicon concentration for each of which the ratio of the difference between the concentration in high-concentration areas and the concentration in low-concentration areas to the concentration in low-concentration areas (which is also referred to below as the "fluctuation") is 20% or less, and preferably 10% or less. If the respective fluctuations for iron and silicon in the surface layer after graining treatment satisfy the above conditions, streak-like surface unevenness becomes substantially invisible.

The fluctuations for iron and silicon in the surface layer after graining treatment can be determined by the following method.

Of the linear streaks that appear on the side of the lithographic printing plate support to which graining treatment has been carried out, those which are visually observed are marked and the levels of iron and silicon (peak counts) in the domains of the marked streaks are determined by EPMA. The iron and silicon levels (peak counts) in areas outside of the streak domains (blank areas) are similarly measured. The fluctuations, as defined by the following formula, are then determined for iron and silicon, respectively.

Fluctuation(%)=100×[(peak count for streaks)−(peak count for blank areas)]/(peak count for blank areas)

[Presensitized Plate]

A presensitized plate can be obtained by providing an image recording layer on the lithographic printing plate support obtained according to this invention. A photosensitive composition may be used to form the image recording layer.

The image recording layer is not subject to any particular limitation and any conventionally known layer may be used. Examples thereof include a conventional photosensitive layer which is exposed in combination with a lith film, a thermal type heat-sensitive layer on which image can be directly formed with a laser, non-treatment type image recording layer which requires no development after exposure with a laser, and an image recording layer which is capable of developing on a printing press after exposure with a laser. The image recording layer may be of a negative or positive type.

Preferred examples of photosensitive compositions that may be used in the invention include thermal positive-type photosensitive compositions containing an alkali-soluble polymeric compound and a photothermal conversion substance (such compositions and the image recording layers obtained using these compositions are referred to below as "thermal positive-type" compositions and image recording layers), thermal negative-type photosensitive compositions containing a curable compound and a photothermal conversion substance (such compositions and the image recording layers obtained therefrom are similarly referred to below as "thermal negative-type" compositions and image recording layers), photopolymerizable photosensitive compositions (referred to below as "photopolymer-type" compositions), negative-type photosensitive compositions containing a diazo resin or a photo-crosslinkable resin (referred to below as "conventional negative-type" compositions), positive-type photosensitive compositions containing a quinonediazide compound (referred to below as "conventional positive-type" compositions), and photosensitive compositions that do not require a special development step (referred to below as "non-treatment type" compositions).

Among these, the thermal positive-type, thermal negative-type, photopolymer-type and non-treatment type compositions for the laser-imagable image recording layers are preferred, and the thermal positive-type and photopolymer-type compositions are more preferred. These preferred photosensitive compositions are described below.

<Thermal Positive-Type Photosensitive Compositions>
<Photosensitive layer>

Thermal positive-type photosensitive compositions contain an alkali-soluble polymeric compound and a photothermal conversion substance. In a thermal positive-type image recording layer, the photothermal conversion substance converts light energy such as from an infrared laser into heat, which efficiently eliminates interactions that lower the alkali solubility of the alkali-soluble polymeric compound.

The alkali-soluble polymeric compound may be, for example, a resin having an acidic group on the molecule, or a mixture of two or more such resins. Resins having an acidic group, such as a phenolic hydroxy group, a sulfonamide group ($-SO_2NH-R$, wherein R is a hydrocarbon group) or an active imino group ($-SO_2NHCOR$, $-SO_2NHSO_2R$ or $-CONHSO_2R$, wherein R is as defined above), are especially preferred on account of their solubility in alkaline developers.

For an excellent image formability with exposure to light from an infrared laser, resins having phenolic hydroxy groups are desirable. Preferred examples of such resins include novolak resins such as phenol-formaldehyde resins, m-cresol-formaldehyde resins, p-cresol-formaldehyde resins, cresol-formaldehyde resins in which the cresol is a mixture of m-cresol and p-cresol, and phenol/cresol mixture-formaldehyde resins (phenol-cresol-formaldehyde co-condensation resins) in which the cresol is m-cresol, p-cresol or a mixture of m- and p-cresol.

Additional preferred examples include the polymeric compounds described in JP 2001-305722 A (especially paragraphs to [0042]), the polymeric compounds having recurring units of general formula (1) described in JP 2001-215693 A, and the polymeric compounds described in JP 2002-311570 A (especially paragraph [0107]).

To provide a good recording sensitivity, the photothermal conversion substance is preferably a pigment or dye that absorbs light in the infrared wavelength range of 700 to 1200 nm. Illustrative examples of suitable dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal-thiolate complexes (e.g., nickel-thiolate complexes). Of these, cyanine dyes are preferred. The cyanine dyes of general formula (I) described in JP 2001-305722 A are especially preferred.

A dissolution inhibitor may be included in thermal positive-type photosensitive compositions. Preferred examples of dissolution inhibitors include those described in paragraphs [0053] to [0055] of JP 2001-305722 A.

The thermal positive-type photosensitive compositions preferably also include, as additives, sensitivity regulators, print-out agents for obtaining a visible image immediately after heating from light exposure, compounds such as dyes as image colorants, and surfactants for enhancing coatability and treatment stability. Compounds as described in paragraphs [0053] to [0060] of JP 2001-305722 A are preferred additives.

Use of the photosensitive compositions described in detail in JP 2001-305722 A is desirable in consideration of additional advantages as well.

The thermal positive-type image recording layer is not limited to a single layer, but may have a two-layer construction.

Preferred examples of image recording layers with a two-layer construction (also referred to as "multilayer-type image recording layers") include those comprising a bottom layer ("layer A") of excellent press life and solvent resistance which is provided on the side close to the support and a layer ("layer B") having an excellent positive-image formability which is provided on layer A. This type of image recording layer has a high sensitivity and can provide a broad development latitude. Layer B generally contains a photothermal conversion substance. Preferred examples of the photothermal conversion substance include the dyes mentioned above.

Preferred examples of resins that may be used in layer A include polymers that contain as a copolymerizable component a monomer having a sulfonamide group, an active imino group or a phenolic hydroxy group; such polymers have an excellent press life and solvent resistance. Preferred examples of resins that may be used in layer B include phenolic hydroxy group-bearing resins which are soluble in aqueous alkali solutions.

In addition to the above resins, various additives may be included, if necessary, in the compositions used to form layers A and B. For example, suitable use can be made of the additives described in paragraphs [0062] to [0085] of JP 2002-323769 A. The additives described in paragraphs [0053] to [0060] of JP 2001-305722 A as above are also suitable for use.

The components and proportions thereof in each of layers A and B are preferably selected as described in JP 11-218914 A.

<Intermediate Layer>

It is advantageous to provide an intermediate layer between the thermal positive-type image recording layer and the support. Preferred examples of ingredients that may be used in the intermediate layer include the various organic compounds described in paragraph [0068] of JP 2001-305722 A.

An intermediate layer as that described in JP 2001-108538 A which contains a polymer having an acid group-bearing monomer and an onium group-bearing monomer is also advantageously used. This intermediate layer is also advantageously used in the image recording layers other than the thermal positive-type image recording layer.

<Others>

The methods described in detail in JP 2001-305722 A may be used to form a thermal positive-type image recording layer and to make a printing plate having such a layer.

<Thermal Negative-Type Photosensitive Compositions>

Thermal negative-type photosensitive compositions contain a curable compound and a photothermal conversion substance. A thermal negative-type image recording layer is a negative-type photosensitive layer in which areas irradiated with light such as from an infrared laser cure to form image areas.

<Polymerizable Layer>

An example of a preferred thermal negative-type image recording layer is a polymerizable image recording layer (polymerizable layer). The polymerizable layer contains a photothermal conversion substance, a radical generator, a radical-polymerizable compound which is a curable compound, and a binder polymer. In the polymerizable layer, the photothermal conversion substance converts absorbed infrared light into heat, and the heat decomposes the radical generator, thereby generating radicals. The radicals then trigger the chain polymerization and curing of the radical-polymerizable compound.

Illustrative examples of the photothermal conversion substance include photothermal conversion substances that may be used in the above-described thermal positive-type photosensitive compositions. Specific examples of cyanine dyes, which are especially preferred, include those described in paragraphs [0017] to [0019] of JP 2001-133969 A.

Preferred radical generators include onium salts. The onium salts described in paragraphs [0030] to [0033] of JP 2001-133969 A are especially preferred.

Exemplary radical-polymerizable compounds include compounds having one, and preferably two or more, terminal ethylenically unsaturated bonds.

Preferred binder polymers include linear organic polymers. Linear organic polymers which are soluble or swellable in water or a weakly alkaline aqueous solution are preferred. Of these, (meth)acrylic resins having unsaturated groups (e.g., allyl, acryloyl) or benzyl groups and carboxy groups in side chains are especially preferred because they provide an excellent balance of film strength, sensitivity and developability.

Radical-polymerizable compounds and binder polymers that may be used include those described specifically in paragraphs [0036] to [0060] of JP 2001-133969 A.

Thermal negative-type photosensitive compositions preferably contain additives described in paragraphs [0061] to [0068] of JP 2001-133969 A (e.g., surfactants for enhancing coatability).

The methods described in detail in JP 2001-133969 A may be used to form a polymerizable layer and to make a printing plate having such a layer.

<Acid-Crosslinkable Layer>

Another preferred thermal negative-type image recording layer is an acid-crosslinkable image recording layer (abbreviated hereinafter as "acid-crosslinkable layer"). An acid-crosslinkable layer contains a photothermal conversion substance, a thermal acid generator, a compound (crosslinker) which is curable and which crosslinks under the influence of an acid, and an alkali-soluble polymeric compound which is capable of reacting with the crosslinker in the presence of an acid. In an acid-crosslinkable layer, the photothermal conversion substance converts absorbed infrared light into heat. The heat decomposes the thermal acid generator, thereby generating an acid which causes the crosslinker and the alkali-soluble polymeric compound to react and cure.

The photothermal conversion substance is exemplified by the same substances as can be used in the polymerizable layer.

Exemplary thermal acid generators include photoinitiators for photopolymerization, dye photochromogenic substances, and heat-decomposable compounds such as acid generators which are used in microresists and the like.

Exemplary crosslinkers include hydroxymethyl- or alkoxymethyl-substituted aromatic compounds, compounds having N-hydroxymethyl, N-alkoxymethyl or N-acyloxymethyl groups, and epoxy compounds.

Exemplary alkali-soluble polymeric compounds include novolak resins and polymers having hydroxyaryl groups in side chains.

<Photopolymer-Type Photosensitive Compositions>

Photopolymer-type photosensitive compositions contain an addition-polymerizable compound, a photopolymerization initiator and a polymer binder.

Preferred addition-polymerizable compounds include compounds containing an ethylenically unsaturated bond which are addition-polymerizable. Ethylenically unsaturated bond-containing compounds are compounds which have a terminal ethylenically unsaturated bond. Such compounds may have the chemical form of a monomer, a prepolymer, or a mixture thereof. The monomers are exemplified by esters of unsaturated carboxylic acids (e.g., acrylic acid, methacrylic acid, itaconic acid, maleic acid) and aliphatic polyols, and amides of unsaturated carboxylic acids and aliphatic polyamines.

Preferred addition-polymerizable compounds include also urethane-type addition-polymerizable compounds.

The photopolymerization initiator may be any of various photopolymerization initiators or a system of two or more photopolymerization initiators (photoinitiation system) which is suitably selected according to the wavelength of the light source to be used. Preferred examples include the initiation systems described in paragraphs [0021] to [0023] of JP 2001-22079A.

The polymer binder, inasmuch as it must function as a film-forming agent for the photopolymerizable photosensitive composition and, at the same time, must allow the image recording layer to dissolve in an alkaline developer, should be an organic polymer which is soluble or swellable in an alkaline aqueous solution. Preferred examples of such organic polymers include those described in paragraphs [0036] to [0063] of JP 2001-22079 A.

It is preferable for the photopolymer-type photosensitive composition to include the additives described in paragraphs [0079] to [0088] of JP 2001-22079 A (e.g., surfactants for improving coatability, colorants, plasticizers, thermal polymerization inhibitors).

To prevent oxygen from inhibiting polymerization, it is preferable to provide an oxygen-blocking protective layer on top of the photopolymer-type image recording layer. The polymer present in the oxygen-blocking protective layer is exemplified by polyvinyl alcohols and copolymers thereof.

It is also desirable to provide an intermediate layer or a bonding layer like those described in paragraphs [0124] to [0165] of JP 2001-228608 A.

<Conventional Negative-Type Photosensitive Compositions>

Conventional negative-type photosensitive compositions contain a diazo resin or a photo-crosslinkable resin. Among others, photosensitive compositions which contain a diazo resin and an alkali-soluble or swellable polymeric compound (binder) are preferred.

The diazo resin is exemplified by condensation products of an aromatic diazonium salt with an active carbonyl group-bearing compound such as formaldehyde; and organic solvent-soluble diazo resin inorganic salts which are the reaction products of a hexafluorophosphate or tetrafluoroborate with the condensation product of a p-diazophenylamine and formaldehyde. The high-molecular-weight diazo compounds described in JP 59-78340 A, in which the content of hexamer and larger polymers is at least 20 mol %, are especially preferred.

Exemplary binders include copolymers containing acrylic acid, methacrylic acid, crotonic acid or maleic acid as an essential component. Specific examples include the multi-component copolymers of such monomers as 2-hydroxyethyl (meth)acrylate, (meth)acrylonitrile and (meth)acrylic acid described in JP 50-118802 A, and the multi-component copolymers of alkyl acrylates, (meth)acrylonitrile and unsaturated carboxylic acids described in JP 56-4144 A.

Conventional negative-type photosensitive compositions preferably contain as additives the print-out agents, dyes, plasticizers for imparting flexibility and wear resistance to the applied coat, development promoters and other compounds, and the surfactants for enhancing coatability described in paragraphs [0014] to [0015] of JP 7-281425 A.

Below the conventional negative-type photosensitive layer, it is advantageous to provide the intermediate layer which contains a polymeric compound having an acid group-bearing component and an onium group-bearing component described in JP 2000-105462 A.

<Conventional Positive-Type Photosensitive Compositions>

Conventional positive-type photosensitive compositions contain a quinonediazide compound. Photosensitive compositions containing an o-quinonediazide compound and an alkali-soluble polymeric compound are especially preferred.

Illustrative examples of the o-quinonediazide compound include esters of 1,2-naphthoquinone-2-diazido-5-sulfonyl-chloride and a phenol-formaldehyde resin or a cresol-formaldehyde resin, and the esters of 1,2-naphthoquinone-2-diazido-5-sulfonylchloride and pyrogallol-acetone resins described in U.S. Pat. No. 3,635,709.

Illustrative examples of the alkali-soluble polymeric compound include phenol-formaldehyde resins, cresol-formaldehyde resins, phenol-cresol-formaldehyde co-condensation resins, polyhydroxystyrene, N-(4-hydroxyphenyl)methacrylamide copolymers, the carboxy group-bearing polymers described in JP 7-36184 A, the phenolic hydroxy group-bearing acrylic resins described in JP 51-34711 A, the sulfonamide group-bearing acrylic resins described in JP 2-866 A, and urethane resins.

Conventional positive-type photosensitive compositions preferably contain as additives the compounds such as sensitivity regulators, print-out agents and dyes described in paragraphs [0024] to [0027] of JP 7-92660 A, and surfactants for enhancing coatability such as those described in paragraph [0031] of JP 7-92660 A.

Below the conventional positive-type photosensitive layer, it is advantageous to provide an intermediate layer similar to the intermediate layer which is preferably used in the case of the conventional negative-type photosensitive layer as above.

<Non-Treatment Type Photosensitive Compositions>

Illustrative examples of non-treatment type photosensitive compositions include thermoplastic polymer powder-based photosensitive compositions, microcapsule-based photosensitive compositions, and sulfonic acid-generating polymer-containing photosensitive compositions. All of these are heat-sensitive compositions containing a photothermal conversion substance. The photothermal conversion substance is preferably a dye of the same type as those which can be used in the above-described thermal positive-type photosensitive compositions.

Thermoplastic polymer powder-based photosensitive compositions are composed of a hydrophobic, heat-meltable finely divided polymer dispersed in a hydrophilic polymer matrix. In the thermoplastic polymer powder-based image recording layer, the fine particles of hydrophobic polymer melt under the influence of heat generated by light exposure and mutually fuse, forming hydrophobic regions which serve as the image areas.

The finely divided polymer is preferably one in which the particles melt and fuse together under the influence of heat. A finely divided polymer in which the individual particles have a hydrophilic surface, enabling them to disperse in a hydrophilic component such as dampening water, is especially preferred. Preferred examples include the finely divided thermoplastic polymers described in Research Disclosure No. 33303 (January 1992), JP 9-123387 A, JP 9-131850 A, JP 9-171249 A, JP 9-171250 A and EP 931,647 A. Of these, polystyrene and polymethyl methacrylate are preferred. Illustrative examples of finely divided polymers having a hydrophilic surface include those in which the polymer itself is hydrophilic, and those in which the surfaces of the polymer particles have been rendered hydrophilic by adsorbing thereon a hydrophilic compound such as polyvinyl alcohol or polyethylene glycol.

The finely divided polymer preferably has reactive functional groups.

Preferred examples of microcapsule-type photosensitive compositions include those described in JP 2000-118160 A, and compositions like those described in JP 2001-277740 A in which a compound having thermally reactive functional groups is enclosed within microcapsules.

Illustrative examples of sulfonic acid-generating polymers that may be used in sulfonic acid generating polymer-containing photosensitive compositions include the polymers described in JP 10-282672 A that have sulfonate ester groups, disulfone groups or sec- or tert-sulfonamide groups in side chains.

Including a hydrophilic resin in a non-treatment type photosensitive composition not only provides a good on-press developability, it also enhances the film strength of the photosensitive layer itself. Preferred hydrophilic resins include resins having hydrophilic groups such as hydroxy, carboxy, hydroxyethyl, hydroxypropyl, amino, aminoethyl, aminopropyl or carboxymethyl groups; and hydrophilic binder resins of a sol-gel conversion-type.

A non-treatment type image recording layer can be developed on the press, and thus does not require a special development step. The methods described in detail in JP 2002-178655 A may be used as the method of forming a non-treatment type image recording layer and the associated plate making and printing methods.

<Back Coat>

If necessary, the presensitized plate of the invention obtained by providing any of the various image recording layers on a lithographic printing plate support obtained according to the invention may be provided on the rear side with a coat composed of an organic polymeric compound to prevent scuffing of the image recording layer when the presensitized plates are stacked on top of each other.

[Lithographic Plate Making Process]

The presensitized plate prepared using a lithographic printing plate support obtainable according to the invention is then subjected to any of various treatment methods depending on the type of the image recording layer, thereby obtaining a lithographic printing plate.

Illustrative examples of sources of actinic light that may be used for imagewise exposure include mercury vapor lamps, metal halide lamps, xenon lamps and chemical lamps. Examples of laser beams that may be used include those from helium-neon lasers (He—Ne lasers), argon lasers, krypton lasers, helium-cadmium lasers, KrF excimer lasers, semiconductor lasers, YAG lasers and YAG-SHG lasers.

Following the above exposure, if the image recording layer is of a thermal positive type, thermal negative type, conventional negative type, conventional positive type or photopolymer type, it is preferable to carry out development using a developer in order to prepare a lithographic printing plate.

The developer is preferably an alkaline developer, and more preferably an alkaline aqueous solution which is substantially free of organic solvent.

Developers which are substantially free of alkali metal silicates are also preferred. One example of a suitable method of development using a developer which is substantially free of alkali metal silicates is the method described in detail in JP 11-109637 A.

Developers which contain an alkali metal silicate may also be used.

EXAMPLES

Hereinafter, the present invention is described in detail by way of examples. However, the present invention is not limited thereto.

Examples and Comparative Examples of First to Tenth Aspects of Invention 1-1. Preparation of Aluminum Melt Aluminum Melts 1 to 7 containing various ingredients in the amounts shown in Table 1, with the balance being aluminum and inadvertent impurities, were prepared.

TABLE 1

| Al melt | Fe (wt %) | Si (wt %) | Cu (wt %) | Ti (wt %) | B (wt %) | Mg (wt %) | Mn (wt %) | Zn (wt %) |
|---|---|---|---|---|---|---|---|---|
| 1 | 0.06 | 0.03 | 0.001 | 0.005 | 0.001 | 0.001 | 0.001 | 0.001 |
| 2 | 0.28 | 0.05 | 0.002 | 0.010 | 0.002 | 0.001 | 0.001 | 0.001 |
| 3 | 0.28 | 0.08 | 0.015 | 0.010 | 0.002 | 0.001 | 0.001 | 0.001 |
| 4 | 0.28 | 0.08 | 0.025 | 0.010 | 0.002 | 0.001 | 0.001 | 0.001 |
| 5 | 0.28 | 0.08 | 0.035 | 0.010 | 0.002 | 0.001 | 0.001 | 0.001 |
| 6 | 0.28 | 0.08 | 0.001 | 0.005 | 0.001 | 0.250 | 0.001 | 0.001 |
| 7 | 0.28 | 0.20 | 0.003 | 0.030 | 0.006 | 0.250 | 0.900 | 0.050 |

1-2. Manufacture of Lithographic Printing Plate Support

Examples 1 to 25 and Comparative Examples 1 to 4

Cleaning treatment was carried out on the above aluminum melts, following which, as shown in Table 2, the respective melts were consecutively subjected to a filtration step, a continuous casting step, a cold rolling step, an intermediate annealing step, a finish cold rolling step, a graining treatment step and an anodizing treatment step by the methods described below, thereby obtaining lithographic printing plate supports.

(1) Filtration Step:

The aluminum melt was filtered using a filtration tank. The filter used in the filtration tank was a ceramic tube filter. A filtration step was not carried out in Examples 6, 7, 16 and 17 of the invention, and in Comparative Examples 1 to 4.

(2) Continuous Casting Step:

Aluminum alloy plates were continuously cast using the machine shown in FIG. 1. More specifically, first, in a melt feeding step, the aluminum melt was fed from a melting furnace to a melt feed nozzle via a filtration tank (not shown), except in Examples 6, 7, 16 and 17 of the invention and Comparative Examples 1 to 4, and also via a flow channel having a recess in which an agitating means shown in FIG. 3 was provided (an agitating means was not provided in Examples 6, 7, 16 and 17 of the invention and in Comparative Examples 1 to 4). To refine the crystal grains, Al—Ti (5 wt %)—B (1 wt %) alloy wire was added at some point along the flow channel. Next, in a casting step, the aluminum melt was fed between a pair of cooling rollers from the melt feel nozzle, then was rolled while being solidified by the pair of cooling rollers, thereby forming an aluminum alloy plate having a thickness of 5 mm.

The agitating means was provided in a pouring basin (recess) just prior to the melt feed nozzle. Agitation was carried out by turning a rotary carbon rotor (diameter, 50 mm) at 150 rpm while feeding argon gas through a hole passing through the center of the rotor shaft at a rate of 3 liters per minute.

As shown in Table 2, the inside surface of the melt feed nozzle which comes into contact with the aluminum melt was coated with Parting Agent 1 (a parting agent in which the filler is boron nitride (BN) having a median diameter of 15 μm and a modal diameter of 8 μm) or Parting Agent 2 (a parting agent in which the filler is zinc oxide (ZnO) having a median diameter of 5 μm and a modal diameter of 3 μm).

Table 2 shows whether the circumferential velocity V of the cooling rollers, the diameter D of the cooling rollers and the thickness t of the cast aluminum alloy plate obtained satisfy the above Eq. relating to the casting speed. When Eq. $V \geq 5 \times 10^{-5} \times (D/t^2)$ was satisfied, the circumferential velocity V of the cooling rollers was 1 m/min and the thickness t of the cast aluminum alloy plate was 0.15 m; and when Eq. was not satisfied, the circumferential velocity V of the cooling rollers was 0.15 m/min and the thickness t of the cast aluminum alloy plate was 0.005 m. The diameter D of the cooling rollers in both cases was 0.9 m.

(3) Cold Rolling Step:

The aluminum alloy plate obtained in the continuous casting step was cold rolled to a thickness of 2 mm.

(4) Intermediate Annealing Step:

Intermediate annealing was carried out by heating to 550° C. the cold-rolled aluminum alloy plate. In the "Intermediate annealing" column in Table 2, "normal" indicates that annealing was carried out at a temperature ramp-up rate of 1° C./s with a holding time after ramp up of 10 hours, and "rapid"

indicates that annealing was carried out at a temperature ramp-up rate of 12° C./s with a holding time after ramp up of 30 seconds.

(5) Finish Cold Rolling Step:

The intermediate-annealed aluminum alloy plate was then finish cold rolled to a thickness of 0.3 mm.

(6) Graining Treatment Step:

One side of the finish cold-rolled aluminum alloy plate was subjected to one of the subsequently described Graining Treatments 1 to 10. In Table 2, "top side" indicates that graining treatment was carried out on the top side in the aluminum alloy plate casting step, and "bottom side" indicates that graining treatment was carried out on the plate bottom side in the casting step.

(I) Graining Treatment 1

Graining Treatment 1 was carried out by consecutively carrying out each of the following treatments (a) to (i).

(a) Mechanical Graining

Mechanical graining was carried out with a rotating roller-type nylon brush while feeding an abrasive slurry in the form of a suspension (specific gravity, 1.12) of an abrasive (pumice having an average particle size of 35 μm) in water to the surface of the aluminum alloy plate. The nylon brushes were made of 6/10 nylon and had a bristle length of 50 mm and a bristle diameter of 0.48 mm. Each brush was constructed of a 300 mm diameter stainless steel cylinder in which holes had been formed and bristles densely set (the brush had a bristle density of $450/cm^2$). Three rotating brushes were used. The brush rollers were pressed against the aluminum alloy plate until the load on the driving motor that rotates the brushes was 7 kW greater than before the brush rollers were pressed against the plate. The direction in which the brushes were rotated was the same as the direction in which the aluminum plate was moved. The speed of rotation of the brushes was 200 rpm.

(b) Alkali Etching

The aluminum alloy plate was subjected to etching treatment by spraying with an aqueous solution having a sodium hydroxide concentration of 25 wt %, an aluminum ion concentration of 7 wt % and a temperature of 70° C. so as to dissolve 7 $g/m^2$ of material from the aluminum plate. The plate was subsequently rinsed by spraying with water.

(c) Desmutting

Desmutting was carried out by spraying the plate with an aqueous solution having a sulfuric acid concentration of 25 wt % (aluminum ion content, 0.5 wt %) and a temperature of 60° C. for 4 seconds. The plate was subsequently rinsed by spraying with water.

(d) Electrochemical Graining

Electrochemical graining was consecutively carried out using a 60.0 Hz AC voltage. The electrolyte used was an aqueous solution of 1 wt % nitric acid (containing 0.5 wt % of aluminum ions) that had a liquid temperature of 35° C. Electrochemical graining was carried out for a period of time TP until the current reached a peak from zero of 0.8 ms, at a duty ratio of 1:1, using an alternating current having a trapezoidal waveform, and with a carbon electrode as the counterelectrode. Ferrite was used as the auxiliary anode.

The current density, which is the peak value of the current, was 25 $A/dm^2$. The amount of electricity, which is the total amount of electricity during the anode reaction at the aluminum alloy plate, was 180 $C/dm^2$. Of the current that flows from the power supply, 5% was diverted to the auxiliary anode.

Rinsing was subsequently carried out by spraying with water.

(e) Alkali Etching

Etching was carried out by spraying the aluminum alloy plate with an aqueous solution having a sodium hydroxide concentration of 25 wt %, an aluminum ion concentration of 7 wt % and a temperature of 70° C., thereby dissolving 3 $g/m^2$ of material from the plate. Rinsing was subsequently carried out by spraying with water.

(f) Desmutting

Desmutting was carried out by spraying the plate with an aqueous solution having a sulfuric acid concentration of 25 wt % (aluminum ion content, 0.5 wt %) and a temperature of 30° C. for 10 seconds. The plate was subsequently rinsed by spraying it with water.

(g) Electrochemical Graining

Electrochemical graining was consecutively carried out using a 60.0 Hz AC voltage. The electrolyte used was an aqueous solution of 0.5 wt % hydrochloric acid (containing 0.5 wt % of aluminum ions) that had a liquid temperature of 50° C. Electrochemical graining was carried out for a period of time TP until the current reached a peak from zero of 0.8 ms, at a duty ratio of 1:1, using an alternating current having a trapezoidal waveform, and with a carbon electrode as the counterelectrode. Ferrite was used as the auxiliary anode.

The current density, which is the peak value of the current, was 25 $A/dm^2$. The amount of electricity, which is the total amount of electricity during the anode reaction at the aluminum alloy plate, was 63 $C/dm^2$. Of the current that flows from the power supply, 5% was diverted to the auxiliary anode.

The plate was subsequently rinsed by spraying it with water.

(h) Alkali Etching

Etching was carried out by spraying the aluminum alloy plate with an aqueous solution having a sodium hydroxide concentration of 5 wt %, an aluminum ion concentration of 0.5 wt % and a temperature of 35° C., thereby dissolving 0.2 $g/m^2$ of material from the plate. The plate was subsequently rinsed by spraying it with water.

(i) Desmutting

Desmutting was carried out by immersing the plate in an aqueous solution having a sulfuric acid concentration of 25 wt % (aluminum ion content, 0.5 wt %) and a temperature of 60° C. for 3 seconds. The plate was subsequently rinsed by spraying it with water.

(II) Graining Treatment 2

Graining Treatment 2 was carried out in the same way as Graining Treatment 1, except that above steps (a) and (f) to (h) were not carried out, in step (b) the amount of aluminum dissolution was set to 5 $g/m^2$, in step (d) the total amount of electricity during the anode reaction at the aluminum alloy plate was set to 255 $C/dm^2$, in step (e) the temperature of the aqueous solution was set to 30° C. and the amount of aluminum dissolution was set to 0.3 $g/m^2$, and in step (i) the concentration of the aqueous solution was set to 15 wt % and the temperature was set to 30° C.

(III) Graining Treatment 3

Graining Treatment 3 was carried out in the same way as Graining Treatment 1, except that above steps (f) to (h) were not carried out.

(IV) Graining Treatment 4

Graining Treatment 4 was carried out in the same way as Graining Treatment 2, except that in step (d) an aqueous solution of 1 wt % hydrochloric acid (containing 0.5 wt % of aluminum ions) and having a liquid temperature of 35° C. was used instead of the aqueous solution of nitric acid, and the total amount of electricity during the anode reaction at the aluminum alloy plate was set to 450 $C/dm^2$.

(V) Graining Treatment 5

Graining Treatment 5 was carried out in the same way as Graining Treatment 2, except that in step (i) desmutting was carried out in the aqueous solution of sulfuric acid while applying ultrasonic oscillations (28 kHz) to the aluminum alloy plate.

(VI) Graining Treatment 6

Graining Treatment 6 was carried out in the same way as Graining Treatment 2, except that in step (d) the amount of electricity, which was the total amount of electricity during the anode reaction at the aluminum alloy plate, was set to 600 $C/dm^2$.

(VII) Graining Treatment 7

Graining Treatment 7 was carried out in the same way as Graining Treatment 4, except that in step (d) the amount of electricity, which was the total amount of electricity during the anode reaction at the aluminum alloy plate, was set to 600 $C/dm^2$.

(VIII) Graining Treatment 8

Graining Treatment 8 was carried out in the same way as Graining Treatment 2 except that steps (j) to (l) below were carried out between steps (c) and (d).

(j) Electrochemical Graining

Electrochemical graining was carried out consecutively using a 60.0 Hz AC voltage. The electrolyte used was an aqueous solution of 0.5 wt % hydrochloric acid (containing 0.5 wt % of aluminum ions) that had a liquid temperature of 50° C. Electrochemical graining was carried out for a period of time TP until the current reached a peak from zero of 0.8 ms, at a duty ratio of 1:1, using an alternating current having a trapezoidal waveform, and with a carbon electrode as the counterelectrode. Ferrite was used as the auxiliary anode.

The current density, which is the peak value of the current, was 25 $A/dm^2$. The amount of electricity, which is the total amount of electricity during the anode reaction at the aluminum alloy plate, was 63 $C/dm^2$. Of the current that flows from the power supply, 5% was diverted to the auxiliary anode.

The plate was subsequently rinsed by spraying it with water.

(k) Alkali Etching

Alkali etching was carried out by spraying the aluminum alloy plate with an aqueous solution having a sodium hydroxide concentration of 5 wt %, an aluminum ion concentration of 0.5 wt % and a temperature of 35° C., thereby dissolving 0.2 $g/m^2$ of material from the plate. The plate was subsequently rinsed by spraying it with water.

(l) Desmutting

Desmutting was carried out by spraying the plate with an aqueous solution having a sulfuric acid concentration of 25 wt % (aluminum ion content, 0.5 wt %) and a temperature of 60° C. for 3 seconds. The plate was subsequently rinsed by spraying it with water.

(IX) Graining Treatment 9

Graining Treatment 9 was carried out in the same way as Graining Treatment 5 except that above steps (j) to (l) were carried out between steps (c) and (d).

(X) Graining Treatment 10

Graining Treatment 10 was carried out in the same way as Graining Treatment 5, except that in step (d) the amount of electricity, which was the total amount of electricity during the anode reaction at the aluminum alloy plate, was set to 600 $C/dm^2$.

(7) Anodizing Treatment Step:

The aluminum alloy plate obtained from the graining treatment step was then subjected to anodizing treatment using an anodizing apparatus, thereby giving a lithographic printing plate support.

The electrolyte used was an aqueous solution having a sulfuric acid concentration of 15 wt % (and containing 0.5 wt % of aluminum ions) and a temperature of 35° C. The plate was then rinsed by spraying it with water. The final weight of the anodized layer was 2.7 $g/m^2$.

TABLE 2

| | Al melt | Filtration step | Agitation means | Parting agent on melt feed nozzle | Eq. for casting rate | Intermediate annealing | Graining treatment Treated side | Graining treatment Method |
|---|---|---|---|---|---|---|---|---|
| Example 1 | 2 | yes | yes | 1 | satisfied | normal | top side | 1 |
| Example 2 | 2 | yes | yes | 1 | satisfied | normal | top side | 2 |
| Example 3 | 2 | yes | yes | 1 | satisfied | normal | top side | 3 |
| Example 4 | 2 | yes | yes | 1 | satisfied | normal | top side | 4 |
| Example 5 | 2 | yes | yes | 1 | satisfied | normal | bottom side | 5 |
| Example 6 | 2 | no | no | 1 | satisfied | normal | top side | 2 |
| Example 7 | 2 | no | no | 1 | satisfied | normal | top side | 5 |
| Example 8 | 2 | yes | yes | 2 | satisfied | normal | bottom side | 6 |
| Example 9 | 2 | yes | yes | 2 | satisfied | normal | bottom side | 7 |
| Example 10 | 2 | yes | yes | 2 | satisfied | normal | bottom side | 6 |
| Example 11 | 2 | yes | yes | 2 | satisfied | normal | bottom side | 8 |
| Example 12 | 2 | yes | yes | 2 | satisfied | normal | bottom side | 8 |
| Example 13 | 2 | yes | yes | 2 | not satisfied | rapid | bottom side | 8 |
| Example 14 | 2 | yes | yes | 1 | satisfied | rapid | top side | 9 |
| Example 15 | 2 | yes | yes | 1 | satisfied | rapid | top side | 10 |
| Example 16 | 2 | no | no | 2 | satisfied | normal | top side | 6 |
| Example 17 | 2 | no | no | 2 | satisfied | normal | top side | 8 |
| Example 18 | 1 | yes | yes | 1 | satisfied | normal | top side | 1 |
| Example 19 | 3 | yes | yes | 1 | satisfied | normal | top side | 1 |
| Example 20 | 4 | yes | yes | 1 | satisfied | normal | top side | 1 |
| Example 21 | 5 | yes | yes | 1 | satisfied | normal | top side | 1 |
| Example 22 | 6 | yes | yes | 1 | satisfied | normal | top side | 1 |
| Example 23 | 7 | yes | yes | 1 | satisfied | normal | top side | 1 |
| Example 24 | 6 | yes | yes | 1 | satisfied | normal | top side | 4 |
| Example 25 | 7 | yes | yes | 1 | satisfied | normal | top side | 4 |
| Comp. Ex. 1 | 2 | no | no | 2 | not satisfied | normal | bottom side | 1 |

TABLE 2-continued

|  | Al melt | Filtration step | Agitation means | Parting agent on melt feed nozzle | Eq. for casting rate | Intermediate annealing | Graining treatment Treated side | Method |
|---|---|---|---|---|---|---|---|---|
| Comp. Ex. 2 | 2 | no | no | 2 | not satisfied | normal | bottom side | 2 |
| Comp. Ex. 3 | 2 | no | no | 2 | not satisfied | normal | bottom side | 3 |
| Comp. Ex. 4 | 2 | no | no | 2 | not satisfied | normal | bottom side | 4 |

1-3. Properties of Aluminum Alloy Plate and Lithographic Printing Plate Support

Various properties of the finish cold-rolled aluminum alloy plates and the lithographic printing plate supports obtained above were measured as described below. The results are shown in Table 3.

(1) TiB$_2$ Particle Streaks

The surface on the side of the finish cold-rolled aluminum alloy plate to be subsequently subjected to graining treatment was etched using a 24 wt % aqueous sodium hydroxide solution under three sets of conditions; that is, until the amount of material dissolved from the plate was about 5 g/m$^2$, about 20 g/m$^2$ or about 50 g/m$^2$. In each case, the plate was then rinsed with water, and subjected to desmutting treatment with a 20 wt % aqueous sulfuric acid solution.

Next, of the lenticular streaks that appeared on the surface of the aluminum alloy plate as a result of the above etching and desmutting treatments, those visually observed were marked. An electron probe microanalyzer (abbreviated below as "EPMA"; JXA-8800M; manufactured by JEOL Ltd.) was then used to determine whether titanium and boron were present or absent in the lenticular streaks. Each lenticular streak in which both titanium and boron were detected was then measured to determine its maximum width (dimension in the direction perpendicular to the rolling direction).

This procedure was carried out on twenty 0.5 m$^2$ sheets of aluminum alloy plate (equivalent to a total of 10 m$^2$ of the plate), and both the number of sheets bearing lenticular streaks in which both titanium and boron were detected and that had a maximum width of less than 100 μm as well as the number of sheets bearing lenticular streaks in which both titanium and boron were detected and that had a maximum width of 100 μm or more were counted. Table 3 gives the average values under the three sets of conditions.

EPMA measurement conditions were as follows: acceleration voltage, 20 kV; average current, 1×10$^{-6}$ A; beam diameter, 10 μm; measurement time per spot, 50 ms.

(2) Fluctuation in Iron and Silicon Levels

Of the linear streaks on the side of the lithographic printing plate support on which graining treatment was carried out, those visually observed were marked and the levels of iron and silicon in the streak domains were measured using an EPMA (JXA-8800M; manufactured by JEOL Ltd.). The levels of iron and silicon in areas outside of the streak domains (blank areas) were similarly measured.

Specifically, a measurement region 8 mm×8 mm in size was divided equally into 425×425=180,625 pixels, and surface analysis in which peak counts for iron and silicon are measured was carried out for each pixel. Pixels in the center portion of the linear streaks were selected in three places, and the average of these peak counts was treated as the "peak count for streaks". The average peak count for all pixels in areas outside of linear streak domains was treated as the "peak count for blank areas."

The fluctuations defined by the following formula were determined separately for iron and silicon.

Fluctuation(%)=100×[(peak count for streaks)−(peak count for blank areas)]/(peak count for blank areas)

The EPMA measurement conditions were as follows: acceleration voltage, 20 kV; average current, 1×10$^{-6}$ A; beam diameter, 10 μm; measurement time per spot, 50 ms.

(3) Crystal Grains

The surface of the finish cold-rolled aluminum alloy plate on which graining treatment is to be carried out was buffed to a mirror finish. Buffing was carried out with alumina abrasive having a particle size of 0.1 μm to a reduction in plate thickness of 1 to 2 μm.

Next, etching was carried out using a 10 wt % aqueous hydrofluoric acid solution, after which the plate was rinsed with water and dried. The crystal grains (crystal microstructure) were examined under a polarizing microscope at a magnification of 15×, and photographs were taken in ten visual fields. A total of 100 crystal grains—ten from each photograph—were randomly selected and the widths of the crystal grains were measured using image analysis software, based on which the average value and the maximum value (largest value of the 100 grains) were determined.

Etching was carried out by varying the length of treatment so that three different amounts of material were removed by dissolution. Of a depth to 20 μm from the surface layer, crystal grains were examined at depths from the surface layer of, including the amount of material removed by buffing, 5 μm, 10 μm and 20 μm. Because there was little difference between the crystal grains at the various depths in these examples and comparative examples, Table 3 shows the data obtained at a depth of 10 μm.

TABLE 3

| | TiB$_2$ particle streaks | | Fluctuation | | Width of crystal grains | |
|---|---|---|---|---|---|---|
| | Number of streaks having width of <100 μm (number/10 m$^2$) | Number of streaks having width of ≧100 μm (number/10 m$^2$) | Fe (%) | Si (%) | Average (μm) | Maximum (μm) |
| Example 1 | 5 | 0 | 5 | 2 | 50 | 250 |
| Example 2 | 11 | 0 | 10 | 8 | 50 | 250 |

TABLE 3-continued

| | TiB₂ particle streaks | | Fluctuation | | Width of crystal grains | |
|---|---|---|---|---|---|---|
| | Number of streaks having width of <100 μm (number/10 m²) | Number of streaks having width of ≧100 μm (number/10 m²) | Fe (%) | Si (%) | Average (μm) | Maximum (μm) |
| Example 3 | 10 | 0 | 10 | 8 | 50 | 250 |
| Example 4 | 4 | 0 | 5 | 2 | 50 | 250 |
| Example 5 | 0 | 0 | 5 | 2 | 50 | 250 |
| Example 6 | 75 | 3 | 5 | 2 | 50 | 250 |
| Example 7 | 0 | 0 | 5 | 2 | 50 | 250 |
| Example 8 | 0 | 0 | 15 | 10 | 50 | 250 |
| Example 9 | 6 | 0 | 15 | 10 | 50 | 250 |
| Example 10 | 6 | 0 | 15 | 10 | 100 | 1,500 |
| Example 11 | 8 | 0 | 20 | 15 | 50 | 250 |
| Example 12 | 5 | 0 | 20 | 15 | 100 | 500 |
| Example 13 | 5 | 0 | 20 | 15 | 50 | 250 |
| Example 14 | 0 | 0 | 5 | 2 | 50 | 250 |
| Example 15 | 0 | 0 | 5 | 2 | 50 | 250 |
| Example 16 | 68 | 1 | 15 | 15 | 100 | 500 |
| Example 17 | 59 | 1 | 20 | 20 | 100 | 500 |
| Example 18 | 5 | 0 | 5 | 2 | 50 | 250 |
| Example 19 | 6 | 0 | 5 | 2 | 50 | 250 |
| Example 20 | 5 | 0 | 5 | 2 | 50 | 250 |
| Example 21 | 6 | 0 | 5 | 2 | 50 | 250 |
| Example 22 | 4 | 0 | 5 | 2 | 50 | 250 |
| Example 23 | 10 | 0 | 5 | 2 | 50 | 250 |
| Example 24 | 5 | 0 | 5 | 2 | 50 | 200 |
| Example 25 | 12 | 0 | 5 | 2 | 25 | 70 |
| Comp. Ex. 1 | 48 | 20 | 30 | 20 | 100 | 2,500 |
| Comp. Ex. 2 | 125 | 43 | 50 | 35 | 150 | 2,500 |
| Comp. Ex. 3 | 65 | 31 | 50 | 35 | 150 | 2,500 |
| Comp. Ex. 4 | 30 | 19 | 30 | 20 | 150 | 2,500 |

1-4. Evaluation of Lithographic Printing Plate Support

The lithographic printing plate supports obtained above were evaluated as described below for surface unevenness due to surface treatment, and for sensitivity of presensitized plates obtained therefrom.

(1) Surface Unevenness

Surface unevenness due to surface treatment was categorized as gritty unevenness (bumpy appearance) and streak-like unevenness (long slender streak-like appearance), and their sensory evaluations were carried out visually.

The results are shown in Table 4. The ratings used in the table are described below.

Exc: The appearance is even (uniform)
Good: The appearance is slightly uneven (non-uniform)
Fair: The appearance is uneven (non-uniform) but is still at a level which is acceptable in practice
NG: The appearance is uneven (non-uniform) to a degree that is unacceptable in practice (2) Sensitivity of Presensitized Plate Prepared Presensitized plates for lithographic printing were prepared by forming as described below a thermal positive type, photopolymer type, or conventional negative type image recording layer on each of the lithographic printing plate supports obtained above. The sensitivity was then evaluated as appropriate for the particular image recording layer.

(I) Thermal Positive Type

<Hydrophilizing Treatment>

Hydrophilizing treatment was carried out on the lithographic printing plate support. More specifically, alkali metal silicate treatment (silicate treatment) was carried out by immersing the lithographic printing plate support in an aqueous solution containing 1 wt % of No. 3 sodium silicate (temperature: 30° C.) for ten seconds. Thereafter, the support was rinsed by spraying it with well water. The amount of silicon measured on the surface of the aluminum alloy plate with a fluorescent x-ray analyzer was 3.6 mg/m².

<Formation of Undercoat>

Then, an undercoat was formed thereon. More specifically, an undercoating solution of the composition indicated below was applied onto the lithographic printing plate support after alkali metal silicate treatment, and dried at 80° C. for 15 seconds, thereby forming an undercoat. The weight of the undercoat after drying was 15 mg/m².

<Composition of Undercoating Solution>

Polymeric compound of the following formula I    0.3 g

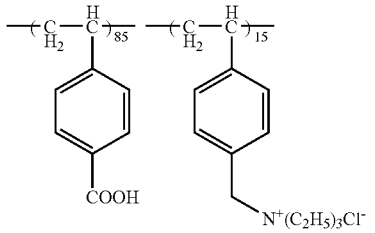

Mw: 26,000

I

Methanol    100 g
Water    1 g

<Formation of Image Recording Layer>

Next, Heat-Sensitive Layer Coating Solution 1 of the composition indicated below was applied with a wire bar onto the undercoated lithographic printing plate support and dried at 140° C. for 50 seconds to form a lower layer of the image recording layer. The dried coating weight of the lower layer (heat-sensitive layer coating weight) was 0.85 g/m². Then, Heat-Sensitive Layer Coating Solution 2 of the composition indicated below was applied with a wire bar onto the lower layer and dried at 140° C. for 1 minute to form an upper layer of the image recording layer. The total coating weight of the lower and upper layers (heat-sensitive layer coating weight) after drying was 1.1 g/m².

The heat-sensitive layer (multilayer-type thermal positive-type image recording layer) was thus formed on the support to obtain a presensitized plate.

| <Composition of Heat-Sensitive Layer Coating Solution 1> | |
|---|---|
| N-(4-Aminosulfonylphenyl) methacrylamide/acrylonitrile/methyl methacrylate copolymer (molar ratio: 36/34/30; weight-average molecular weight, 50,000) | 1.920 g |
| m,p-Cresol novolak (m-cresol/p-cresol ratio, 6/4; weight-average molecular weight, 4,000) | 0.213 g |
| Cyanine Dye of the following formula A | 0.032 g |

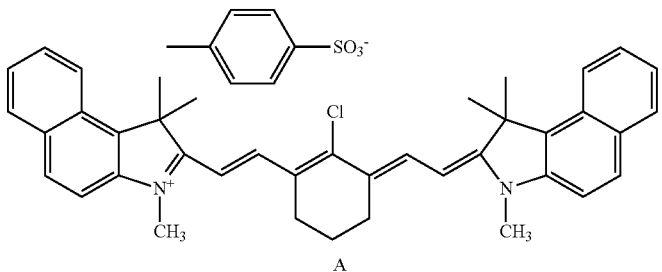

A

| | |
|---|---|
| p-Toluenesulfonic acid | 0.008 g |
| Tetrahydrophthalic anhydride | 0.19 g |
| Bis(p-hydroxyphenyl) sulfone | 0.126 g |
| 2-Methoxy-4-(N-phenylamino)benzenediazonium hexafluorophosphate | 0.032 g |
| Dye obtained by changing counterion in Victoria Pure Blue BOH to 1-naphthalenesulfonic acid anion | 0.078 g |
| Fluorochemical surfactant (Megaface F-780, available from Dainippon Ink and Chemicals, Inc.) | 0.02 g |
| γ-Butyrolactone | 13.18 g |
| Methyl ethyl ketone | 25.41 g |
| 1-Methoxy-2-propanol | 12.97 g |

| <Composition of Heat-Sensitive Layer Coating Solution 2> | |
|---|---|
| Phenol/m,p-cresol novolak )phenol/m-cresol/p-cresol = 5/3/2; weight-average molecular weight, 4,000) | 0.274 g |
| Cyanine Dye of the above formula A | 0.029 g |
| 30 wt % Solution in methyl ethyl ketone of Polymer of the formula B below | 0.14 g |
| Quaternary ammonium salt of the formula C below | 0.004 g |
| Sulfonium salt of the formula D below | 0.065 g |
| Fluorochemical surfactant (Megaface F-780, available from Dainippon Ink and Chemicals, Inc.) | 0.004 g |
| Fluorochemical surfactant (Megaface F-782, available from Dainippon Ink and Chemicals, Inc.) | 0.020 g |
| Methyl ethyl ketone | 10.39 g |
| 1-Methoxy-2-propanol | 20.98 g |

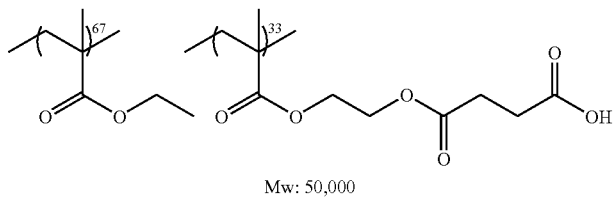

Mw: 50,000

B

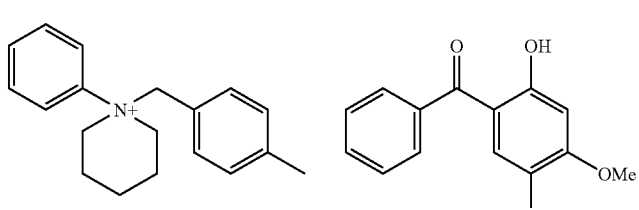

C

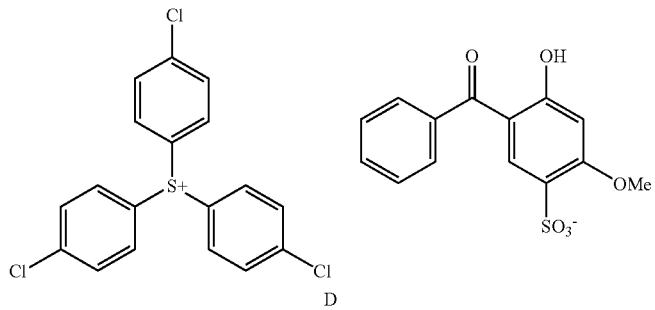

D

<Evaluation of Sensitivity>

A test pattern image was formed on the resulting presensitized plate by exposure using a Trendsetter 800 (manufactured by Creo) at a beam intensity of 7.0 W and a drum rotation speed of 250 rpm.

Next, using an FLH-E2 processor (manufactured by G&J) charged with the subsequently described developer and a 1:1 aqueous dilution of the finisher FG-1 available from Fuji Photo Film Co., Ltd., development was carried out for 26 seconds while maintaining the liquid temperature at 28° C.

<Developer>

The developer was prepared by diluting the following ingredients to the indicated concentrations with water.

<Developer Ingredients>

| | |
|---|---|
| Sodium metasilicate | 0.60 mol/L |
| Surfactant | 0.02 g/L |
| (the foam inhibitor Olfin AK-02, made by Nisshin Chemical Industry Co., Ltd.) | |
| Surfactant | 1.6 g/L |
| (Tetronic 304, made by BASF; molecular weight, 1650) | |
| Surfactant | 0.1 g/L |
| (Tetronic 704, made by BASF; molecular weight, 5500) | |
| Alkyl allylalkoxy phosphate ester | 15 g/L |
| (Triton H66, made by Dow Chemical Company) | |
| Sodium alkyl diphenyl ether disulfonate | 0.4 g/L |
| (Eleminol MON-2, made by Sanyo Chemical Industries, Ltd.) | |

Following development, the plate was examined for the presence or absence of speck-like residual coating in non-image areas (places where image areas have not been removed but remain on the developed plate) and rated as follows.

The results are shown in Table 4.

Good: No specks of residual coating whatsoever

Fair: A few residual coating specks were observed

NG: Numerous residual coating specks were observed (II) Photopolymer Type

<Formation of Undercoat>

An undercoating solution of the composition indicated below was applied onto the lithographic printing plate support with a bar coater to a weight after drying of 2 mg/m², then dried at 80° C. for 20 seconds.

| <Composition of Undercoating Solution> | |
|---|---|
| Polymer (P1) of the following formula | 0.3 g |
| $\begin{array}{ccc} \phantom{x} & \phantom{x} & \phantom{x} \\ 70 & 15 & 15 \\ COOCH_3 & COOC_2H_5 & CONHC(CH_3)_2CH_2SO_3Na \end{array}$ | |
| Mw: 100,000 | |
| Pure water | 60.0 g |
| Methanol | 939.7 g |

<Formation of Image Recording Layer>

Next, Photosensitive Layer Coating Solution 1 of the composition indicated below was applied with a bar coater onto the undercoated lithographic printing plate support and dried at 100° C. for 1 minute to form a photosensitive layer (photopolymer-type image recording layer). The dried coating weight (photosensitive layer coating weight) was 1.1 g/m².

| <Composition of Photosensitive Layer Coating Solution 1> | |
|---|---|
| Ethylenically unsaturated bond-containing compound of formula A-1 below | 0.46 part by weight |
| Binder polymer of formula B-1 | 0.51 part by weight |
| Sensitizing dye of formula D-1 | 0.03 part by weight |
| Bisimidazole (Kurogane Kasei Co., Ltd.) | 0.12 part by weight |
| Aqueous dispersion of ε-phthalocyanine of formula F-1 | 0.47 part by weight |
| Mercapto compound of formula S-1 | 0.09 part by weight |
| Fluorochemical nonionic surfactant (Megaface F-780F, made by Dainippon Ink & Chemicals, Inc.) | 0.009 part by weight |
| Cupferron (Wako Pure Chemical Industries, Ltd.) | 0.003 part by weight |
| Methyl ethyl ketone | 7.4 parts by weight |
| Propylene glycol monomethyl ether | 7.4 parts by weight |

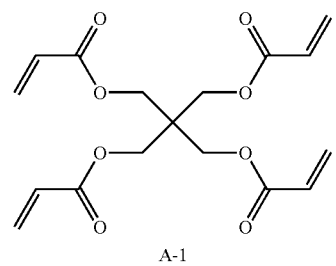

A-1

<Composition of Photosensitive Layer Coating Solution 1>

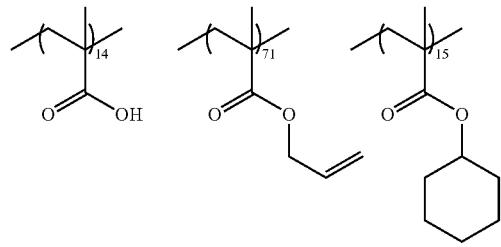

B-1

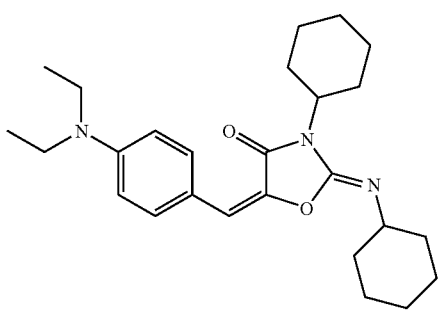

D-1

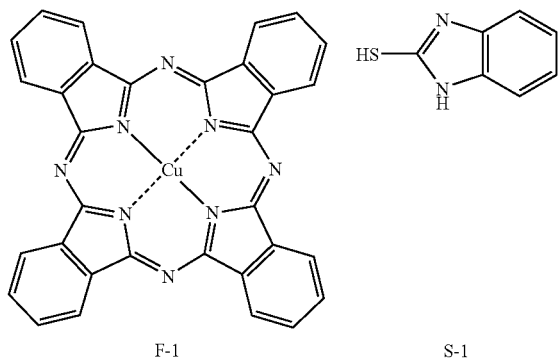

F-1    S-1

<Formation of Protective Layer>

Next, a protective layer coating solution of the composition indicated below was applied onto the image recording layer with a bar coater to a weight after drying of 2.4 g/m² then dried at 120° C. for 1 minute to form a protective layer, thereby giving a presensitized plate.

| <Composition of Protective Layer Coating Solution> | |
|---|---|
| Polyvinyl alcohol (PVA 205, made by Kuraray Co., Ltd.; degree of saponification, 88 mol %; degree of polymerization, 500) | 5.0 parts by weight |
| Nonionic surfactant (Emalex 710; Nippon Nyukazai Co., Ltd.) | 0.09 part by weight |
| Pure water | 94.91 parts by weight |

<Evaluation of Sensitivity>

The resulting presensitized plate was mounted on a Vx-9600 Violet semiconductor laser setter Vx 9600 manufactured by Fujifilm Electronic Imaging Ltd. (an InGaN semiconductor laser; emission wavelength, 405±10 nm; power, 30 mW), and an image having a halftone dot area ratio of 50% was formed by exposure at a dose of 90 μJ/cm².

Next, the exposed presensitized plate was carried to an automatically connected automatic processor LP1250PLX and heated at 100° C. for 10 seconds, following which the protective layer was removed by rinsing with water and development was subsequently carried out at 28° C. for 20 seconds.

Development was carried out using a 5-fold dilution of the developer DV-2 (Fuji Photo Film Co., Ltd.) in water. The lithographic printing plate obtained by development was rinsed in a rinsing bath, then transferred to a gum coating bath, where it was gum coated with a two-fold dilution of the liquid gum FP-2W (Fuji Photo Film Co., Ltd.) in water, and subsequently hot-air dried.

The halftone dot area ratios for each of the lithographic printing plates obtained were measured using CC-dot, and the deviation of the measured value from the setting (50%) was computed. At too low a sensitivity, the measured halftone dot value will be lower than the setting (50%).

The results are shown in Table 4. The ratings used in the table are described below.

Good: Measured halftone dot value was 47% or more
Fair: Measured halftone dot value was more than 45% but less than 47%
NG: Measured halftone dot value was 45% or less (III) Conventional Negative Type <Formation of Undercoat>

A sulfonic acid group-bearing water-soluble polymer undercoat was applied onto the lithographic printing plate support by a method similar to that described in Example 1 of JP 59-106151 A.

<Formation of Image Recording Layer>

Next, a Photosensitive Layer Coating Solution 2 of the composition indicated below was applied with a bar coater onto the undercoated lithographic printing plate support and dried at 110° C. for 45 seconds to form a photosensitive layer (conventional negative-type image recording layer). The dried coating weight (photosensitive layer coating weight) was 2.0 g/m².

| <Composition of Photosensitive Layer Coating Solution 2> | |
|---|---|
| Diazo resin (hexafluorophosphate of condensation product of p-diazodiphenylamine and p-formaldehyde mentioned in Synthesis Example 1 of JP 59-78340 A) | 1.2 g |
| Binder (a water-insoluble but alkali water-soluble film-forming polymer that is a 2-hydroxyethyl methacrylate/acrylonitrile/methyl methacrylate/ methacrylic acid copolymer having a weight ratio of 50/20/26/4, an average molecular weight of 75,000, and an acid content of 0.4 meq/g) | 5.0 g |
| Victoria Pure Blue BOH (oil-soluble dye) | 0.15 g |
| Fluorochemical surfactant (Megaface F-177; Dainippon Ink & Chemicals, Inc.) | 0.02 g |
| Tricresyl phosphate | 0.2 g |
| Phosphorous acid | 0.03 g |
| Malic acid | 0.03 g |
| n-Hexyl alcohol half ester of styrene/ maleic anhydride copolymer | 0.05 g |
| Methyl 2-hydroxy-2-methylpropionate | 20.00 g |
| 1-Methoxy-2-propanol | 20.00 g |
| Methyl lactate | 7.00 g |
| Methanol | 25.00 g |
| Methyl ethyl ketone | 25.00 g |
| Water | 3.00 g |

<Matting>

In addition, matting was carried out by electrostatically spraying a liquid of Composition B described in Example 1 of JP 3-21902 B onto the image recording layer, then drying in a 60° C. atmosphere for 5 seconds, thereby giving a presensitized plate.

<Evaluation of Sensitivity>

The resulting presensitized plate was left to stand for 5 days under high-temperature, high-humidity conditions (45° C., 80% RH), then was exposed using an iRotary Printer (Eyegraphics Co., Ltd.) through a lith film on which a screen tint having a halftone dot area ratio of 50% had been formed.

Next, using an 800H automatic processor manufactured by Fuji Photo Film Co., Ltd., the plate was developed with a 1:1 dilution of the aqueous alkali solution-based developer DN-3C (Fuji Photo Film) in water.

The halftone dot area ratios for each of the lithographic printing plates obtained were measured using CC-dot, and the deviation of the measured value from the setting (50%) was computed. At too low a sensitivity, the measured halftone dot value will be lower than the setting (50%).

The results are shown in Table 4. The ratings used in the table are described below.

Good: Measured halftone dot value was 47% or more
Fair: Measured halftone dot value was more than 45% but less than 47%
NG: Measured halftone dot value was 45% or less

TABLE 4

|  | Gritty unevenness | Streak-like unevenness | Sensitivity (thermal positive-type) | Sensitivity (photopolymer-type) | Sensitivity (conventional negative-type) |
| --- | --- | --- | --- | --- | --- |
| Example 1 | Exc | Exc | Good | Good | Good |
| Example 2 | Exc | Exc | Good | Good | Good |
| Example 3 | Exc | Exc | Good | Good | Good |
| Example 4 | Exc | Exc | Good | Good | Good |
| Example 5 | Exc | Exc | Good | Good | Good |
| Example 6 | Exc | Fair | Good | Fair | Good |
| Example 7 | Exc | Exc | Good | Good | Good |
| Example 8 | Exc | Good | Good | Good | Good |
| Example 9 | Exc | Good | Good | Good | Good |
| Example 10 | Fair | Good | Good | Good | Good |
| Example 11 | Exc | Fair | Good | Good | Good |
| Example 12 | Exc | Fair | Good | Good | Good |
| Example 13 | Exc | Fair | Good | Good | Good |
| Example 14 | Exc | Exc | Good | Good | Good |
| Example 15 | Exc | Exc | Good | Good | Good |
| Example 16 | Fair | Fair | Good | Fair | Good |
| Example 17 | Fair | Fair | Good | Fair | Good |
| Example 18 | Exc | Exc | Good | Good | Good |
| Example 19 | Exc | Exc | Good | Good | Good |
| Example 20 | Exc | Exc | Good | Good | Good |
| Example 21 | Exc | Exc | Good | Good | Good |
| Example 22 | Exc | Exc | Good | Good | Good |
| Example 23 | Exc | Exc | Good | Good | Good |
| Example 24 | Exc | Exc | Good | Good | Good |
| Example 25 | Exc | Exc | Good | Good | Good |
| Comp. Ex. 1 | NG | NG | Fair | NG | Good |
| Comp. Ex. 2 | NG | NG | Fair | NG | Good |
| Comp. Ex. 3 | NG | NG | Fair | NG | Good |
| Comp. Ex. 4 | NG | NG | Fair | NG | Good |

As is apparent from Tables 1 to 4, unevenness due to surface treatment was suppressed on the surfaces of the lithographic printing plate supports according to the invention (Examples 1 to 25). Moreover, presensitized plates according to the invention which were obtained from such supports had an excellent sensitivity even when a thermal positive-type or a photopolymer-type image recording layer was used.

The reasons are most likely as follows.

In the comparative examples, numerous $TiB_2$ particles distributed as lenticular streaks having a width of 100 μm or more are present on the surface of the lithographic printing plate support. On a thermal positive-type image recording layer, poor development following exposure had a tendency to occur in areas where $TiB_2$ particles are present, particularly in areas where numerous $TiB_2$ particles are present in the form of agglomerates.

Moreover, in the comparative examples, because the distribution of iron and silicon is non-uniform, particles of iron and silicon-containing intermetallic compounds are unevenly distributed primarily in the surface layer. Hence, the adhesion of a photopolymer-type image recording layer to the support in exposed areas is lower, presumably resulting in smaller halftone dots.

Exposure of the image recording layer gives rise to an on/off difference between image areas and non-image areas, with the non-image areas being removed by dissolution during development and the image areas remaining intact. Because a laser-imagable image recording layer (CTP sensitive material) has a very short exposure time, appearance of the on/off difference is largely attributable to the difference in the rate of dissolution between exposed areas and unexposed areas during development. Hence, in a thermal positive-type image recording layer, when places that are not easily developed due to the fineness of the grain, for example, arise in the surface layer, insufficient development occurs, lowering the sensitivity. Similarly, in a negative-type image recording layer such as of the photopolymer type, if adhesion of the image areas to the support is inadequate, dissolution of those areas that should become image areas will proceed, lowering the sensitivity. However, in conventional negative-type and conventional positive-type image recording layers, such a decrease in sensitivity will not readily arise if a sufficient exposure time is provided and sufficient development is carried out.

Examples and Comparative Examples of Eleventh to Fourteenth Aspects of Invention Examples 26 to 64 and Comparative Examples 5 to 32

2-1. Preparation of Aluminum Melt

Aluminum melts containing iron, silicon and copper in the respective amounts shown in Table 5, with the balance being aluminum and inadvertent impurities, were prepared. To these melts was added Al—Ti (5 wt %)—B (1 wt %) alloy wire so that titanium is included in the amounts shown in Table 5, thereby forming Aluminum Melts 8 to 16. Aluminum Melt 9 was obtained without the addition of titanium.

2-2. Manufacture of Lithographic Printing Plate Support

Cleaning treatment was carried out on the aluminum melts obtained as described above, following which, as shown in Table 6, the respective melts were consecutively subjected to a filtration step, a continuous casting step, a cold rolling step, an intermediate annealing step, a finish cold rolling step, a graining treatment step and an anodizing treatment step by the methods described below, thereby obtaining lithographic printing plate supports.

(1) Filtration step:

The aluminum melt was filtered using a filtration tank. The filter used in the filtration tank was a ceramic filter. A filtration step was not carried out in Comparative Examples 8, 12, 16 and 20.

(2) Continuous Casting Step:

Aluminum alloy plates were continuously cast using the machine shown in FIG. 1. More specifically, first, in a melt feeding step, the aluminum melt was fed from a melting furnace to a melt feed nozzle via a filtration tank (not shown), except in Comparative Examples 8, 12, 16 and 20, and also via a flow channel having a recess in which an agitating means shown in FIG. 3 was provided (an agitating means was not provided in Comparative Examples 8, 12, 16 and 20). Next, in a casting step, the aluminum melt was fed between a pair of cooling rollers from the melt feel nozzle, then was rolled while being solidified by the pair of cooling rollers, thereby forming an aluminum alloy plate.

The agitating means was provided in a pouring basin (recess) just prior to the melt feed nozzle. Agitation was carried out by turning a rotary carbon rotor (diameter, 50 mm) at 150 rpm while feeding argon gas through a hole passing through the center of the rotor shaft at a rate of 3 liters per minute.

The melt feed nozzle used was either a nozzle having a pressurizing construction which includes a top plate member which contacts the aluminum alloy melt from above and a bottom plate member which contacts the aluminum alloy melt from below, these members being vertically movable, and the top plate member and the bottom plate member being each subjected to pressure by the aluminum alloy melt and thereby pushed against an adjoining cooling roller surface; or a nozzle without such a pressurizing construction.

The relative positions of the outer edge of the melt feed nozzle opening and the cooling rollers was noted in Table 6. In the table, "A" indicates that the outer edge of the melt feed nozzle opening is in contact with the cooling rollers only at the tip of the nozzle, and "C" indicates that the outer edge of the melt feed nozzle opening is in contact with the cooling rollers both at the nozzle tip and in other areas.

The inner wall of the melt feed nozzle which comes into contact with the aluminum melt was coated with a parting agent in which the filler had the median and modal diameters indicated in Table 6. The filler having a median diameter of 15 μm and a modal diameter of 8 μm was boron nitride (BN), and the filler having a median diameter of 5 μm and a modal diameter of 3 μm was zinc oxide (ZnO).

A carbon graphite-containing parting agent was intermittently applied to the surfaces of the cooling rollers and, except in Comparative Examples 8, 12, 16 and 20, a wiper was used to make the thickness of the applied parting agent uniform.

(3) Cold Rolling Step:

The aluminum alloy plate obtained in the continuous casting step was cold rolled to a thickness of 2 mm.

(4) Intermediate Annealing Step:

Intermediate annealing was carried out by heating the cold-rolled aluminum alloy plate to the temperature indicated in Table 6 for 10 hours, thereby controlling the respective amounts of iron, silicon and copper in solid solution.

(5) Finish Cold Rolling Step:

The aluminum alloy plate obtained from the intermediate annealing step was finish cold rolled to a thickness of 0.3 mm.

Table 6 shows the respective amounts of iron, silicon and copper in solid solution within the finish cold-rolled aluminum alloy plate.

(6) Graining Treatment Step:

As shown in Table 6, one of Graining Treatments 2-1 to 2-4 described below was carried out to the finish cold-rolled aluminum alloy plate.

(I) Graining Treatment 2-1

Graining Treatment 2-1 was carried out by consecutively performing each of the following treatments (a) to (i).

(a) Mechanical Graining

Mechanical graining was carried out with a rotating roller-type nylon brush while feeding an abrasive slurry in the form of a suspension (specific gravity, 1.12) of an abrasive (pumice having an average particle size of 35 μm) in water to the surface of the aluminum alloy plate. The nylon brushes were made of 6/10 nylon and had a bristle length of 50 mm and a bristle diameter of 0.48 mm. Each brush was constructed of a 300 mm diameter stainless steel cylinder in which holes had been formed and bristles densely set (the brush had a bristle density of 450/cm$^2$). Three rotating brushes were used. The brush rollers were pressed against the aluminum alloy plate until the load on the driving motor that rotates the brushes was 7 kW greater than before the brush rollers were pressed against the plate. The direction in which the brushes were rotated was the same as the direction in which the aluminum plate was moved. The speed of rotation of the brushes was 200 rpm.

(b) Alkali Etching

The aluminum alloy plate was subjected to etching treatment by spraying with an aqueous solution having a sodium hydroxide concentration of 25 wt %, an aluminum ion concentration of 7 wt % and a temperature of 70° C. so as to dissolve 7 g/m$^2$ of material from the aluminum plate. The plate was subsequently rinsed by spraying with water.

(c) Desmutting

Desmutting was carried out by spraying the plate with an aqueous solution having a sulfuric acid concentration of 25 wt % (aluminum ion content, 0.5 wt %) and a temperature of 60° C. for 4 seconds. The plate was subsequently rinsed by spraying with water.

(d) Electrochemical Graining

Electrochemical graining was consecutively carried out using a 60.0 Hz AC voltage. The electrolyte used was an aqueous solution of 1 wt % nitric acid (containing 0.5 wt % of aluminum ions) that had a liquid temperature of 35° C. Electrochemical graining was carried out for a period of time TP until the current reached a peak from zero of 0.8 ms, at a duty ratio of 1:1, using an alternating current having a trapezoidal waveform, and with a carbon electrode as the counterelectrode. Ferrite was used as the auxiliary anode.

The current density, which is the peak value of the current, was 25 A/dm$^2$. The amount of electricity, which is the total amount of electricity during the anode reaction at the aluminum alloy plate, was 180 C/dm$^2$. Of the current that flows from the power supply, 5% was diverted to the auxiliary anode.

Rinsing was subsequently carried out by spraying with water.

(e) Alkali Etching

Etching was carried out by spraying the aluminum alloy plate with an aqueous solution having a sodium hydroxide concentration of 25 wt %, an aluminum ion concentration of 7 wt % and a temperature of 70° C., thereby dissolving 3 g/m² of material from the plate. Rinsing was subsequently carried out by spraying with water.

(f) Desmutting

Desmutting was carried out by spraying the plate with an aqueous solution having a sulfuric acid concentration of 25 wt % (aluminum ion content, 0.5 wt %) and a temperature of 30° C. for 10 seconds. The plate was subsequently rinsed by spraying it with water.

(g) Electrochemical Graining

Electrochemical graining was consecutively carried out using a 60.0 Hz AC voltage. The electrolyte used was an aqueous solution of 0.5 wt % hydrochloric acid (containing 0.5 wt % of aluminum ions) that had a liquid temperature of 50° C. Electrochemical graining was carried out for a period of time TP until the current reached a peak from zero of 0.8 ms, at a duty ratio of 1:1, using an alternating current having a trapezoidal waveform, and with a carbon electrode as the counterelectrode. Ferrite was used as the auxiliary anode.

The current density, which is the peak value of the current, was 25 A/dm². The amount of electricity, which is the total amount of electricity during the anode reaction at the aluminum alloy plate, was 63 C/dm². Of the current that flows from the power supply, 5% was diverted to the auxiliary anode.

The plate was subsequently rinsed by spraying it with water.

(h) Alkali Etching

Etching was carried out by spraying the aluminum alloy plate with an aqueous solution having a sodium hydroxide concentration of 5 wt %, an aluminum ion concentration of 0.5 wt % and a temperature of 35° C., thereby dissolving 0.2 g/m² of material from the plate. The plate was subsequently rinsed by spraying it with water.

(i) Desmutting

Desmutting was carried out by spraying the plate with an aqueous solution having a sulfuric acid concentration of 25 wt % (aluminum ion content, 0.5 wt %) and a temperature of 60° C. for 3 seconds. The plate was subsequently rinsed by spraying it with water.

(II) Graining Treatment 2-2

Graining Treatment 2-2 was carried out in the same way as Graining Treatment 2-1, except that above steps (a) and (f) to (h) were not carried out, in step (b) the amount of aluminum dissolution was set to 5 g/m², in step (d) the total amount of electricity during the anode reaction at the aluminum alloy plate was set to 255 C/dm², in step (e) the temperature of the aqueous solution was set to 30° C. and the amount of aluminum dissolution was set to 0.3 g/m², and in step (i) the concentration of the aqueous solution was set to 15 wt % and the temperature was set to 30° C.

(III) Graining Treatment 2-3

Graining Treatment 2-3 was carried out in the same way as Graining Treatment 2-1, except that above steps (f) to (h) were not carried out.

(IV) Graining Treatment 2-4

Graining Treatment 2-4 was carried out in the same way as Graining Treatment 2-2, except that in step (d) a 1 wt % aqueous hydrochloride acid solution containing 0.5 wt % of aluminum ions and having a liquid temperature of 35° C. was used instead of the aqueous nitric acid solution, and the total amount of electricity during the anode reaction at the aluminum alloy plate was set to 450 C/dm².

(7) Anodizing Treatment Step:

The aluminum alloy plate obtained from the graining treatment step was then subjected to anodizing treatment using an anodizing apparatus, thereby giving a lithographic printing plate support.

The electrolyte was an aqueous solution having a sulfuric acid concentration of 15 wt % (and containing 0.5 wt % of aluminum ions) and a temperature of 35° C. The plate was then rinsed by spraying it with water. The final weight of the anodized layer was 2.7 g/m².

TABLE 5

| Al melt | Fe (ppm) | Si (ppm) | Cu (ppm) | Ti added (ppm) |
|---|---|---|---|---|
| 8 | 500 | 300 | 1 | 50 |
| 9 | 3000 | 500 | 3 | none |
| 10 | 3000 | 500 | 3 | 50 |
| 11 | 3000 | 800 | 150 | 50 |
| 12 | 3000 | 800 | 250 | 50 |
| 13 | 3000 | 800 | 350 | 50 |
| 14 | 3000 | 800 | 500 | 50 |
| 15 | 4800 | 1900 | 500 | 50 |
| 16 | 6000 | 2500 | 600 | 500 |

TABLE 6

| | Al melt | Filtration step | Agitating means | Pressurizing construction in melt feed nozzle | Parting agent in melt feed nozzle Median diameter (µm) | Parting agent in melt feed nozzle Modal diameter (µm) | Thickness of parting agent on cooling rollers uniformized | Positional relationship between melt feed nozzle and cooling rollers | Intermediate annealing temperature (° C.) | Solid solution content (ppm) Fe | Solid solution content (ppm) Si | Solid solution content (ppm) Cu | Graining treatment |
|---|---|---|---|---|---|---|---|---|---|---|---|---|---|
| (part 1) | | | | | | | | | | | | | |
| Example 26 | 8 | yes | yes | yes | 15 | 8 | yes | A | 550 | 20 | 20 | 1 | 2-1 |
| Example 27 | 10 | yes | yes | yes | 15 | 8 | yes | A | 550 | 25 | 35 | 3 | 2-1 |
| Example 28 | 11 | yes | yes | yes | 15 | 8 | yes | A | 550 | 25 | 60 | 110 | 2-1 |
| Example 29 | 12 | yes | yes | yes | 15 | 8 | yes | A | 550 | 25 | 60 | 180 | 2-1 |
| Example 30 | 13 | yes | yes | yes | 15 | 8 | yes | A | 550 | 25 | 60 | 250 | 2-1 |
| Example 31 | 14 | yes | yes | yes | 15 | 8 | yes | A | 550 | 25 | 60 | 360 | 2-1 |
| Example 32 | 15 | yes | yes | yes | 15 | 8 | yes | A | 550 | 45 | 130 | 360 | 2-1 |
| Example 33 | 8 | yes | yes | yes | 15 | 8 | yes | A | 550 | 20 | 20 | 1 | 2-2 |
| Example 34 | 10 | yes | yes | yes | 15 | 8 | yes | A | 550 | 25 | 35 | 3 | 2-2 |
| Example 35 | 11 | yes | yes | yes | 15 | 8 | yes | A | 550 | 25 | 60 | 110 | 2-2 |

TABLE 6-continued

| | Al melt | Filtration step | Agitating means | Pressurizing construction in melt feed nozzle | Parting agent in melt feed nozzle Median diameter (μm) | Modal diameter (μm) | Thickness of parting agent on cooling rollers uniformized | Positional relationship between melt feed nozzle and cooling rollers | Intermediate annealing temperature (° C.) | Solid solution content (ppm) Fe | Si | Cu | Graining treatment |
|---|---|---|---|---|---|---|---|---|---|---|---|---|---|
| Example 36 | 12 | yes | yes | yes | 15 | 8 | yes | A | 550 | 25 | 60 | 180 | 2-2 |
| Example 37 | 13 | yes | yes | yes | 15 | 8 | yes | A | 550 | 25 | 60 | 250 | 2-2 |
| Example 38 | 14 | yes | yes | yes | 15 | 8 | yes | A | 550 | 25 | 60 | 360 | 2-2 |
| Example 39 | 15 | yes | yes | yes | 15 | 8 | yes | A | 550 | 45 | 130 | 360 | 2-2 |
| Example 40 | 8 | yes | yes | yes | 15 | 8 | yes | A | 550 | 20 | 20 | 1 | 2-3 |
| Example 41 | 10 | yes | yes | yes | 15 | 8 | yes | A | 550 | 25 | 35 | 3 | 2-3 |
| Example 42 | 11 | yes | yes | yes | 15 | 8 | yes | A | 550 | 25 | 60 | 110 | 2-3 |
| (part 2) | | | | | | | | | | | | | |
| Example 43 | 12 | yes | yes | yes | 15 | 8 | yes | A | 550 | 25 | 60 | 180 | 2-3 |
| Example 44 | 13 | yes | yes | yes | 15 | 8 | yes | A | 550 | 25 | 60 | 250 | 2-3 |
| Example 45 | 14 | yes | yes | yes | 15 | 8 | yes | A | 550 | 25 | 60 | 360 | 2-3 |
| Example 46 | 15 | yes | yes | yes | 15 | 8 | yes | A | 550 | 45 | 130 | 360 | 2-3 |
| Example 47 | 8 | yes | yes | yes | 15 | 8 | yes | A | 550 | 20 | 20 | 1 | 2-4 |
| Example 48 | 10 | yes | yes | yes | 15 | 8 | yes | A | 550 | 25 | 35 | 3 | 2-4 |
| Example 49 | 11 | yes | yes | yes | 15 | 8 | yes | A | 550 | 25 | 60 | 110 | 2-4 |
| Example 50 | 12 | yes | yes | yes | 15 | 8 | yes | A | 550 | 25 | 60 | 180 | 2-4 |
| Example 51 | 13 | yes | yes | yes | 15 | 8 | yes | A | 550 | 25 | 60 | 250 | 2-4 |
| Example 52 | 14 | yes | yes | yes | 15 | 8 | yes | A | 550 | 25 | 60 | 360 | 2-4 |
| Example 53 | 15 | yes | yes | yes | 15 | 8 | yes | A | 550 | 45 | 130 | 360 | 2-4 |
| Example 54 | 10 | yes | yes | yes | 15 | 8 | yes | A | 480 | 24 | 35 | 3 | 2-4 |
| Example 55 | 10 | yes | yes | yes | 15 | 8 | yes | A | 400 | 23 | 35 | 3 | 2-4 |
| Example 56 | 10 | yes | yes | yes | 15 | 8 | yes | A | 300 | 20 | 35 | 3 | 2-4 |
| (part 3) | | | | | | | | | | | | | |
| Comp. Ex. 5 | 10 | yes | yes | yes | 15 | 8 | yes | A | 290 | 18 | 15 | 1 | 2-1 |
| Comp. Ex. 6 | 10 | yes | yes | yes | 15 | 8 | yes | A | 260 | 13 | 10 | 1 | 2-1 |
| Comp. Ex. 7 | 16 | yes | yes | yes | 15 | 8 | yes | A | 550 | 50 | 200 | 400 | 2-1 |
| Comp. Ex. 8 | 10 | no | no | no | 5 | 3 | no | C | 290 | 18 | 15 | 1 | 2-1 |
| Comp. Ex. 9 | 10 | yes | yes | yes | 15 | 8 | yes | A | 290 | 18 | 15 | 1 | 2-4 |
| Comp. Ex. 10 | 10 | yes | yes | yes | 15 | 8 | yes | A | 260 | 13 | 10 | 1 | 2-4 |
| Comp. Ex. 11 | 16 | yes | yes | yes | 15 | 8 | yes | A | 550 | 50 | 200 | 400 | 2-4 |
| Comp. Ex. 12 | 10 | no | no | no | 5 | 3 | no | C | 290 | 18 | 15 | 1 | 2-4 |
| Comp. Ex. 13 | 10 | yes | yes | yes | 15 | 8 | yes | A | 290 | 18 | 15 | 1 | 2-3 |
| Comp. Ex. 14 | 10 | yes | yes | yes | 15 | 8 | yes | A | 260 | 13 | 10 | 1 | 2-3 |
| Comp. Ex. 15 | 16 | yes | yes | yes | 15 | 8 | yes | A | 550 | 50 | 200 | 400 | 2-3 |
| Comp. Ex. 16 | 10 | no | no | no | 5 | 3 | no | C | 290 | 18 | 15 | 1 | 2-3 |
| Comp. Ex. 17 | 10 | yes | yes | yes | 15 | 8 | yes | A | 290 | 18 | 15 | 1 | 2-4 |
| Comp. Ex. 18 | 10 | yes | yes | yes | 15 | 8 | yes | A | 260 | 13 | 10 | 1 | 2-4 |
| Comp. Ex. 19 | 16 | yes | yes | yes | 15 | 8 | yes | A | 550 | 50 | 200 | 400 | 2-4 |
| Comp. Ex. 20 | 10 | no | no | no | 5 | 3 | no | C | 290 | 18 | 15 | 1 | 2-4 |

2-3. Evaluation of Lithographic Printing Plate Support

The lithographic printing plate supports obtained above were evaluated as described below for surface unevenness due to surface treatment, for uniformity of electrochemical graining treatment, and for press life of lithographic printing plates obtained therefrom.

(1) Surface unevenness

Surface unevenness due to surface treatment was categorized as chatter marks (transverse bands that are formed perpendicularly to the direction in which the aluminum alloy plate advances), black streaks (black streak-like surface defect), crystal streaks (gray streak-like surface defect at least 100 mm in length), short streaks (gray streak-like surface defect less than 100 mm in length), and abrasion marks (thin white scratch-like streak), and their sensory evaluations were carried out visually. Each type of irregularity was rated on a scale of 1 (numerous) to 5 (few). A rating of 3 represents the allowable lower limit for practical use.

The results are given in Table 7.

(2) Uniformity of Electrochemical Graining Treatment

The surface of the lithographic printing plate support was examined with a scanning electron microscope (SEM) at a magnification of 2,000×, and sensory evaluations of the uniformity of electrochemical graining treatment were carried out. The uniformity was rated on a scale of 1 (low uniformity) to 5 (high uniformity).

The results are given in Table 7.
(3) Press Life of Resulting Lithographic Printing Plate Presensitized plates were fabricated by providing a thermal positive-type image recording layer in the manner described below on each of the lithographic printing plate supports obtained above.

First, an undercoating solution of the composition indicated below was applied onto the lithographic printing plate support, and dried at 80° C. for 15 seconds, thereby forming an undercoat. The weight of the undercoat after drying was 15 mg/m².

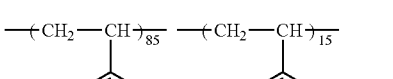

| <Composition of Undercoating Solution> | |
|---|---|
| Polymeric compound of the following formula | 0.3 g |
| Methanol | 100 g |
| Water | 1 g |

In addition, a heat-sensitive layer coating solution of the composition indicated below was prepared. This solution was applied onto the undercoated lithographic printing plate support and dried to obtain a dried coating weight (heat-sensitive layer coating weight) of 1.8 g/m², thus forming a heat-sensitive layer (thermal positive-type image recording layer) and giving a presensitized plate.

Then, an image was formed on the resulting presensitized plate by exposure using a Trendsetter (manufactured by Creo) at a beam intensity of 10 W and a drum rotation speed of 150 rpm.

Next, development was carried out over a period of 20 seconds using a PS Processor 940H (manufactured by Fuji Photo Film Co., Ltd.) charged with an alkaline developer of the composition indicated below while holding the developer at a temperature of 30° C., thereby giving a lithographic printing plate.

<Alkaline Developer Composition>

| | |
|---|---|
| D-Sorbit | 2.5 wt % |
| Sodium hydroxide | 0.85 wt % |
| Polyethylene glycol lauryl ether (weight-average molecular weight, 1,000) | 0.5 wt % |
| Water | 96.15 wt % |

The press life was evaluated by printing copies from the resulting printing plate on a Lithrone printing press (manufactured by Komori Corporation) using DIC-GEOS(N) black ink (Dainippon Ink and Chemicals, Inc.) and determining the total number of impressions that were printed until the density of solid images began to noticeably decline on visual inspection.

The results are shown in Table 7. The ratings used in Table 7 are described below.
6: 70,000 or more copies
5: At least 60,000 but fewer than 70,000 copies
4: At least 50,000 but fewer than 60,000 copies
3: At least 40,000 but fewer than 50,000 copies
2: At least 30,000 but fewer than 40,000
1: Fewer than 30,000 copies As is apparent from Tables 5 to 7, each of the lithographic printing plate supports manufactured by the methods corresponding to the eleventh to fourteenth aspects of the inventive method of manufacturing lithographic printing plate supports (Examples 26 to 56) did not exhibit surface unevenness due to

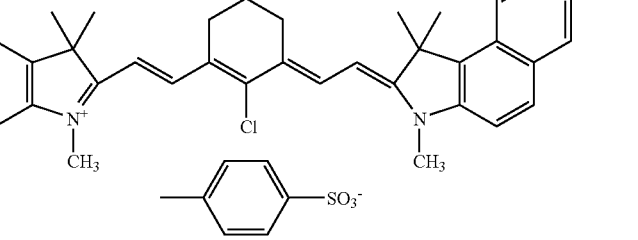

| <Composition of Heat-Sensitive Layer Coating Solution> | |
|---|---|
| Novolak resin (m-cresol/p-cresol = 60/40; weight-average molecular weight, 7,000; unreacted cresol content, 0.5 wt %) | 0.90 g |
| Ethyl methacrylate/isobutyl methacrylate/methacrylic acid copolymer (molar ratio: 35/35/30) | 0.10 g |
| Cyanine Dye A of the following formula | 0.1 g |
| Tetrahydrophthalic anhydride | 0.05 g |
| p-Toluenesulfonic acid | 0.002 g |
| Dye obtained by changing counterion in Ethyl Violet to 6-hydroxy-β-naphthalenesulfonic acid | 0.02 g |
| Fluorochemical surfactant (Megaface F-780F, available from Dainippon Ink and Chemicals, Inc.; solids content, 30 wt %) | 0.0045 g (solids) |
| Fluorochemical surfactant (Megaface F-781F, available from Dainippon Ink and Chemicals, Inc.; solids content, 100 wt %) | 0.035 g |
| Methyl ethyl ketone | 12 g | surface treatment, and had an excellent uniformity in electrochemical graining treatment. Moreover, lithographic printing plates manufactured from these supports had an excellent press life.

By contrast, when the respective contents of elemental iron, silicon and copper in the aluminum melt were too high (Comparative Examples 7, 11, 15 and 19), the respective contents of elemental iron, silicon and copper in solid solution within the finish cold-rolled aluminum alloy plate were too low (Comparative Examples 5, 6, 8 to 10, 12 to 14, 16 to 18 and 20), or techniques for suppressing various non-uniformities that cause surface unevenness were not used in the aluminum alloy plate continuous casting step (Comparative Examples 8, 12, 16 and 20), poor results were obtained for one or more of the following: various types of surface unevenness due to surface treatment, electrochemical graining treatment uniformity, and press life of the resulting lithographic printing plate.

3-1 Manufacture of Lithographic Printing Plate Support

Examples 57 and 58, and Comparative Examples 21 to 24

Cleaning treatment was carried out on the aluminum melts obtained as described above, following which, as shown in Table 8, the respective melts were consecutively subjected to a filtration step, a continuous casting step, a cold rolling step, an intermediate annealing step, a finish cold rolling step, a graining treatment step and an anodizing treatment step by the methods described below, thereby obtaining lithographic printing plate supports.

(1) Filtration Step:

The aluminum melt was filtered using a filtration tank. The filter used in the filtration tank was a ceramic filter. A filtration step was not carried out in Comparative Examples 22 and 24.

TABLE 7

|  | Surface unevenness | | | | | Uniformity of electrochemical graining | Press life |
|---|---|---|---|---|---|---|---|
|  | Chatter marks | Black streaks | Crystal streaks | Short streaks | Abrasion marks | | |
| (part 1) | | | | | | | |
| Example 26 | 3 | 5 | 5 | 5 | 5 | 3 | 3 |
| Example 27 | 5 | 5 | 5 | 5 | 5 | 5 | 5 |
| Example 28 | 5 | 5 | 5 | 5 | 5 | 5 | 5 |
| Example 29 | 5 | 5 | 5 | 5 | 5 | 5 | 6 |
| Example 30 | 5 | 5 | 5 | 5 | 5 | 5 | 6 |
| Example 31 | 5 | 5 | 5 | 5 | 5 | 5 | 5 |
| Example 32 | 5 | 5 | 5 | 5 | 5 | 5 | 5 |
| Example 33 | 3 | 5 | 5 | 5 | 5 | 3 | 3 |
| Example 34 | 3 | 5 | 5 | 5 | 5 | 3 | 3 |
| Example 35 | 5 | 5 | 5 | 5 | 5 | 5 | 5 |
| Example 36 | 5 | 5 | 5 | 5 | 5 | 5 | 5 |
| Example 37 | 4 | 5 | 5 | 5 | 5 | 4 | 4 |
| Example 38 | 3 | 5 | 5 | 5 | 5 | 3 | 3 |
| Example 39 | 3 | 5 | 5 | 5 | 5 | 3 | 3 |
| Example 40 | 3 | 5 | 5 | 5 | 5 | 3 | 3 |
| Example 41 | 3 | 5 | 5 | 5 | 5 | 3 | 3 |
| Example 42 | 5 | 5 | 5 | 5 | 5 | 5 | 5 |
| Example 43 | 5 | 5 | 5 | 5 | 5 | 5 | 5 |
| Example 44 | 4 | 5 | 5 | 5 | 5 | 4 | 4 |
| Example 45 | 4 | 5 | 5 | 5 | 5 | 4 | 4 |
| Example 46 | 3 | 5 | 5 | 5 | 5 | 3 | 4 |
| (part 2) | | | | | | | |
| Example 47 | 5 | 5 | 5 | 5 | 5 | 5 | 5 |
| Example 48 | 5 | 5 | 5 | 5 | 5 | 5 | 5 |
| Example 49 | 5 | 5 | 5 | 5 | 5 | 5 | 5 |
| Example 50 | 5 | 5 | 5 | 5 | 5 | 5 | 5 |
| Example 51 | 5 | 5 | 5 | 5 | 5 | 5 | 5 |
| Example 52 | 5 | 5 | 5 | 5 | 5 | 5 | 5 |
| Example 53 | 5 | 5 | 5 | 5 | 5 | 5 | 5 |
| Example 54 | 5 | 5 | 5 | 5 | 5 | 4 | 5 |
| Example 55 | 5 | 5 | 5 | 5 | 5 | 4 | 4 |
| Example 56 | 5 | 5 | 5 | 5 | 5 | 3 | 3 |
| Comp. Ex. 5 | 3 | 5 | 5 | 5 | 5 | 2 | 2 |
| Comp. Ex. 6 | 2 | 5 | 5 | 5 | 5 | 1 | 2 |
| Comp. Ex. 7 | 3 | 5 | 5 | 5 | 5 | 5 | 2 |
| Comp. Ex. 8 | 3 | 2 | 3 | 4 | 4 | 2 | 2 |
| Comp. Ex. 9 | 1 | 5 | 5 | 5 | 5 | 1 | 1 |
| Comp. Ex. 10 | 1 | 5 | 5 | 5 | 5 | 1 | 1 |
| Comp. Ex. 11 | 2 | 5 | 5 | 5 | 5 | 2 | 2 |
| Comp. Ex. 12 | 1 | 1 | 1 | 1 | 1 | 1 | 3 |
| Comp. Ex. 13 | 1 | 5 | 5 | 5 | 5 | 1 | 1 |
| Comp. Ex. 14 | 1 | 5 | 5 | 5 | 5 | 1 | 1 |
| Comp. Ex. 15 | 2 | 5 | 5 | 5 | 5 | 2 | 2 |
| Comp. Ex. 16 | 1 | 1 | 1 | 1 | 1 | 1 | 1 |
| Comp. Ex. 17 | 3 | 5 | 5 | 5 | 5 | 2 | 2 |
| Comp. Ex. 18 | 2 | 5 | 5 | 5 | 5 | 1 | 2 |
| Comp. Ex. 19 | 3 | 5 | 5 | 5 | 5 | 5 | 2 |
| Comp. Ex. 20 | 3 | 2 | 3 | 3 | 3 | 3 | 3 |

(2) Continuous Casting Step:

Aluminum alloy plates were continuously cast using the machine shown in FIG. 1. Casting was continued without interruption by feeding additional aluminum melt from a melting furnace (not shown) just before the melt in the holding furnace ran out. More specifically, first, in a melt feeding step, the aluminum melt was fed from the melting furnace to a melt feed nozzle via a filtration tank (not shown), except in Comparative Examples 22 and 24, and also via a flow channel having a recess in which an agitating means shown in FIG. 3 was provided (no agitating means was provided in Comparative Examples 21, 22, 23 and 24). Next, in a casting step, the aluminum melt was fed between a pair of cooling rollers from the melt feel nozzle, then was rolled while being solidified by the pair of cooling rollers, thereby forming an aluminum alloy plate. The samples used were obtained after about 100 metric tons (90 to 110 metric tons) of material had been cast following the start of casting.

The agitating means was provided in a pouring basin (recess) just prior to the melt feed nozzle. Agitation was carried out by turning a rotary carbon rotor (diameter, 50 mm) at 150 rpm while feeding argon gas through a hole passing through the center of the rotor shaft at a rate of 3 liters per minute.

A nozzle having no pressurizing construction was used as the melt feed nozzle.

The outer edge of the melt feed nozzle opening was positioned relative to the cooling rollers so as to provide a clearance of 0.5 mm.

The inner wall of the melt feed nozzle which comes into contact with the aluminum melt was not coated with a parting agent.

A carbon graphite-containing parting agent was not applied to the surfaces of the cooling rollers.

(3) Cold Rolling Step:

The aluminum alloy plate obtained in the continuous casting step was cold rolled to a thickness of 2 mm.

(4) Intermediate Annealing Step:

Intermediate annealing was carried out by heating the cold-rolled aluminum alloy plate to 550° C. for 10 hours, thereby controlling the respective amounts of elemental iron, silicon and copper in solid solution.

(5) Finish Cold Rolling Step:

The aluminum alloy plate obtained from the intermediate annealing step was finish cold rolled to a thickness of 0.3 mm.

Table 8 shows the respective amounts of elemental iron, silicon and copper in solid solution within the finish cold-rolled aluminum alloy plate.

(6) Graining Treatment Step:

Above described Graining Treatment 2-3 was carried out on the finish cold-rolled aluminum alloy plate.

(7) Anodizing Treatment Step:

The aluminum alloy plate obtained from the graining treatment step was then subjected to anodizing treatment using an anodizing apparatus, thereby giving a lithographic printing plate support.

The electrolyte used was an aqueous solution having a sulfuric acid concentration of 15 wt % (and containing 0.5 wt % of aluminum ions) and a temperature of 35° C. The plate was then rinsed by spraying it with water. The final weight of the anodized layer was 2.7 g/m$^2$.

3-2. Evaluation of Lithographic Printing Plate Support

Sensory evaluations of black streaks as surface unevenness were carried out visually on the lithographic printing plate supports obtained as described above. Ratings were assigned on a scale of 1 (many black streaks) to 4 (few black streaks). A rating of 4 is acceptable for practical use.

The results are shown in Table 8.

As is apparent from Table 8, lithographic printing plate supports manufactured according to the eleventh aspect of the inventive method of manufacturing lithographic printing plate supports (Examples 57 and 58) were free of black streaks.

By contrast, when a filtration step was not carried out (Comparative Examples 22 and 24) or when a filtration step was carried out but an agitating means was not provided (Comparative Examples 21 and 23), black streaks appeared.

The black streaks that arose were analyzed with an electron probe microanalyzer (8800M; JEOL Ltd.), as a result of which compounds of titanium and boron were detected in all. It appears that when Aluminum Melt 10 was used (Comparative Examples 21 and 22), the addition of Al—Ti (5 wt %)—B (1 wt %) alloy wire for the crystal refinement led to the segregation of a coarse TiB compound (presumably TiB$_2$) and the formation of black streaks. When Aluminum Melt 9 was used (Comparative Examples 23 and 24), black streaks were formed even though titanium was not supplied. This is most likely due to the entry into the flow channel for feeding the aluminum melt of TiB$_2$ particles that had settled to the bottom of the flow channel during past casting operations.

TABLE 8

| | Al melt | Filtration step | Agitating means | Solid solution content (ppm) | | | Surface unevenness |
|---|---|---|---|---|---|---|---|
| | | | | Fe | Si | Cu | Black streaks |
| Example 57 | 10 | yes | yes | 25 | 35 | 3 | 4 |
| Comp. Ex. 21 | 10 | yes | no | 25 | 35 | 2 | 2 |
| Comp. Ex. 22 | 10 | no | no | 25 | 35 | 2 | 1 |
| Example 58 | 9 | yes | yes | 25 | 35 | 3 | 4 |
| Comp. Ex. 23 | 9 | yes | no | 25 | 35 | 2 | 3 |
| Comp. Ex. 24 | 9 | no | no | 25 | 35 | 2 | 2 |

4-1. Manufacture of Lithographic Printing Plate Support

Examples 59 and 60, and Comparative Examples 25 and 26

Cleaning treatment was carried out on the aluminum melts obtained as described above, following which, as shown in Table 9, the respective melts were consecutively subjected to a continuous casting step, a cold rolling step, an intermediate annealing step, a finish cold rolling step, a graining treatment step and an anodizing treatment step by the methods described below, thereby obtaining lithographic printing plate supports. A filtration step was not carried out prior to the continuous casting step.

(1) Continuous Casting Step:

Aluminum alloy plates were continuously cast using the machine shown in FIG. 1. More specifically, first, in a melt feeding step, the aluminum melt was fed from a melting furnace to a melt feed nozzle. Agitation was not carried out at this time. Next, in a casting step, the aluminum melt was fed between a pair of cooling rollers from the melt feel nozzle, then was rolled while being solidified by the pair of cooling rollers, thereby forming an aluminum alloy plate.

As indicated in Table 9, the melt feed nozzle used was either a nozzle having a pressurizing construction which includes a top plate member which contacts the aluminum alloy melt from above and a bottom plate member which contacts the aluminum alloy melt from below, these members being vertically movable, and the top plate member and bottom plate member being each subjected to pressure by the aluminum alloy melt and thereby pushed against an adjoining cooling roller surface; or a nozzle without such a pressurizing construction.

The outer edge of the melt feed nozzle opening was positioned relative to the cooling rollers so as to provide a clearance of 0.5 mm.

The inner wall of the melt feed nozzle which comes into contact with the aluminum melt was not coated with a parting agent.

A carbon graphite-containing parting agent was not applied to the surfaces of the cooling rollers.

(2) Cold rolling step:

The aluminum alloy plate obtained in the continuous casting step was cold rolled to a thickness of 2 mm.

(3) Intermediate Annealing Step:

Intermediate annealing was carried out by heating the cold-rolled aluminum alloy plate to 550° C. for 10 hours, thereby controlling the respective amounts of elemental iron, silicon and copper in solid solution.

(4) Finish Cold Rolling Step:

The aluminum alloy plate obtained from the intermediate annealing step was finish cold rolled to a thickness of 0.3 mm.

Table 9 shows the respective amounts of elemental iron, silicon and copper in solid solution within the finish cold-rolled aluminum alloy plate.

(5) Graining Treatment Step:

Above described Graining Treatment 2-3 was carried out on the finish cold-rolled aluminum alloy plate.

(6) Anodizing Treatment Step:

The aluminum alloy plate obtained from the graining treatment step was then subjected to anodizing treatment using an anodizing apparatus, thereby giving a lithographic printing plate support.

The electrolyte used was an aqueous solution having a sulfuric acid concentration of 15 wt % (and containing 0.5 wt % of aluminum ions) and a temperature of 35° C. The plate was then rinsed by spraying it with water. The final weight of the anodized layer was 2.7 g/m².

4-2. Evaluation of Lithographic Printing Plate Support

Sensory evaluations of ripple marks as surface unevenness were carried out visually on the lithographic printing plate supports obtained as described above. The support was rated as "Good" when there were few ripple marks, and "NG" when there were numerous ripple marks. A rating of "Good" is acceptable for practical use.

The results are shown in Table 9.

As is apparent from Table 9, lithographic printing plate supports manufactured according to the twelfth aspect of the inventive method of manufacturing lithographic printing plate supports (Examples 59 and 60) were free of ripple marks.

By contrast, when a melt feed nozzle having no pressurizing construction was used (Comparative Examples 25 and 26), ripple marks appeared.

TABLE 9

| | Al melt | Pressurizing construction in melt feed nozzle | Solid solution content (ppm) | | | Surface unevenness |
|---|---|---|---|---|---|---|
| | | | Fe | Si | Cu | Ripple marks |
| Example 59 | 10 | yes | 25 | 35 | 3 | Good |
| Comp. Ex. 25 | 10 | no | 25 | 35 | 2 | NG |
| Example 60 | 12 | yes | 25 | 60 | 180 | Good |
| Comp. Ex. 26 | 12 | no | 25 | 60 | 180 | NG |

5-1. Manufacture of Lithographic Printing Plate Support

Examples 61 and 62, and Comparative Examples 27 and 28

Cleaning treatment was carried out on the aluminum melts obtained as described above, following which, as shown in Table 10, the respective melts were consecutively subjected to a continuous casting step, a cold rolling step, an intermediate annealing step, a finish cold rolling step, a graining treatment step and an anodizing treatment step by the methods described below, thereby obtaining lithographic printing plate supports. A filtration step was not carried out prior to the continuous casting step.

(1) Continuous Casting Step:

Aluminum alloy plates were continuously cast using the machine shown in FIG. 1. More specifically, first, in a melt feeding step, the aluminum melt was fed from a melting furnace to a melt feed nozzle. Agitation was not carried out at this time. Next, in a casting step, the aluminum melt was fed between a pair of cooling rollers from the melt feel nozzle, then was rolled while being solidified by the pair of cooling rollers, thereby forming an aluminum alloy plate.

The above-described nozzle having no pressurizing construction was used as the melt feed nozzle.

The outer edge of the melt feed nozzle opening was positioned relative to the cooling rollers so as to provide a clearance of 0.5 mm.

The inner wall of the melt feed nozzle which comes into contact with the aluminum melt was coated with a parting agent in which the filler had the median and modal diameters indicated in Table 10. The filler having a median diameter of 15 μm and a modal diameter of 8 μm was boron nitride (BN), and the filler having a median diameter of 5 μm and a modal diameter of 3 μm was zinc oxide (ZnO).

A carbon graphite-containing parting agent was not applied to the surfaces of the cooling rollers.

(2) Cold Rolling Step:

The aluminum alloy plate obtained in the continuous casting step was cold rolled to a thickness of 2 mm.

(3) Intermediate Annealing Step:

Intermediate annealing was carried out by heating the cold-rolled aluminum alloy plate to 550° C. for 10 hours, thereby controlling the respective amounts of elemental iron, silicon and copper in solid solution.

(4) Finish Cold Rolling Step:

The aluminum alloy plate obtained from the intermediate annealing step was finish cold rolled to a thickness of 0.3 mm.

Table 10 shows the respective amounts of elemental iron, silicon and copper in solid solution within the finish cold-rolled aluminum alloy plate.

(5) Graining Treatment Step:

Above described Graining Treatment 2-3 was carried out on the finish cold-rolled aluminum alloy plate.

(6) Anodizing Treatment Step:

The aluminum alloy plate obtained from the graining treatment step was then subjected to anodizing treatment using an anodizing apparatus, thereby giving a lithographic printing plate support.

The electrolyte used was an aqueous solution having a sulfuric acid concentration of 15 wt % (and containing 0.5 wt % of aluminum ions) and a temperature of 35° C. The plate was then rinsed by spraying it with water. The final weight of the anodized layer was 2.7 g/m².

5-2. Evaluation of Lithographic Printing Plate Support

Sensory evaluations of crystal streaks as surface unevenness were carried out visually on the lithographic printing plate supports obtained as described above. Ratings were assigned on a scale of 1 (numerous) to 3 (few). A rating of 3 is acceptable for practical use.

The results are shown in Table 10.

As is apparent from Table 10, lithographic printing plate supports manufactured according to the thirteenth aspect of the inventive method of manufacturing lithographic printing plate supports (Examples 61 and 62) were free of crystal streaks.

By contrast, when the filler in the parting agent applied onto the inner wall of the melt feed nozzle that comes into contact with the aluminum melt had a median diameter of 5 μm and a modal diameter of 3 μm (Comparative Examples 27 and 28), crystal streaks appeared.

TABLE 10

| | Al melt | Parting agent on melt feed nozzle | | Solid solution content (ppm) | | | Surface unevenness Crystal streaks |
|---|---|---|---|---|---|---|---|
| | | Median diameter (μm) | Modal diameter (μm) | Fe | Si | Cu | |
| Example 61 | 8 | 15 | 8 | 20 | 20 | 1 | 3 |
| Comp. Ex. 27 | 8 | 5 | 3 | 20 | 20 | 1 | 2 |
| Example 62 | 12 | 15 | 8 | 25 | 60 | 180 | 3 |
| Comp. Ex. 28 | 12 | 5 | 3 | 25 | 60 | 180 | 1 |

6-1. Manufacture of Lithographic Printing Plate Support

Examples 63 and 64, and Comparative Examples 29 to 32

Cleaning treatment was carried out on the aluminum melts obtained as described above, following which, as shown in Table 11, the respective melts were consecutively subjected to a continuous casting step, a cold rolling step, an intermediate annealing step, a finish cold rolling step, a graining treatment step and an anodizing treatment step by the methods described below, thereby obtaining lithographic printing plate supports. A filtration step was not carried out prior to the continuous casting step.

(1) Continuous Casting Step:

Aluminum alloy plates were continuously cast using the machine shown in FIG. 1. More specifically, first, in a melt feeding step, the aluminum melt was fed from a melting furnace to a melt feed nozzle. Agitation was not carried out at this time. Next, in a casting step, the aluminum melt was fed between a pair of cooling rollers from the melt feel nozzle, then was rolled while being solidified by the pair of cooling rollers, thereby forming an aluminum alloy plate.

The above-described nozzle having no pressurizing construction was used as the melt feed nozzle.

The positional relationship between the outer edge of the melt flow nozzle opening and the cooling rollers was as shown in Table 11. In the table, "A" indicates that the outer edge of the melt feed nozzle opening is in contact with the cooling rollers only at the tip of the nozzle, "B" indicates that the outer edge of the melt flow nozzle opening is not in contact with the cooling rollers, and "C" indicates that the outer edge of the melt feed nozzle opening is in contact with the cooling rollers both at the nozzle tip and in other areas.

No parting agent was applied to the inner wall of the melt feed nozzle that comes into contact with the aluminum melt.

A carbon graphite-containing parting agent was intermittently applied to the surfaces of the cooling rollers and, except in Comparative Examples 30 to 32, a wiper was used to make the thickness of the applied parting agent uniform.

(2) Cold Rolling Step:

The aluminum alloy plate obtained in the continuous casting step was cold rolled to a thickness of 2 mm.

(3) Intermediate Annealing Step:

Intermediate annealing was carried out by heating the cold-rolled aluminum alloy plate to 550° C. for 10 hours, thereby controlling the respective amounts of elemental iron, silicon and copper in solid solution.

(4) Finish Cold Rolling Step:

The aluminum alloy plate obtained from the intermediate annealing step was finish cold rolled to a thickness of 0.3 mm.

Table 11 shows the respective amounts of elemental iron, silicon and copper in solid solution within the finish cold-rolled aluminum alloy plate.

(5) Graining Treatment Step:

Above described Graining Treatment 2-3 was carried out on the finish cold-rolled aluminum alloy plate.

(6) Anodizing Treatment Step:

The aluminum alloy plate obtained from the graining treatment step was then subjected to anodizing treatment using an anodizing apparatus, thereby giving a lithographic printing plate support.

The electrolyte used was an aqueous solution having a sulfuric acid concentration of 15 wt % (and containing 0.5 wt % of aluminum ions) and a temperature of 35° C. The plate was then rinsed by spraying it with water. The final weight of the anodized layer was 2.7 g/m².

6-2. Evaluation of Lithographic Printing Plate Support

Sensory evaluations of streaks and abrasion marks as surface unevenness were carried out visually on the lithographic printing plate supports obtained as described above. The plate was rated as "Good" when there were few streaks and abrasion marks, and "NG" when there were numerous streaks and abrasion marks. A rating of "Good" is acceptable for practical use.

The results are shown in Table 11.

As is apparent from Table 11, lithographic printing plate supports manufactured according to the fourteenth aspect of the inventive method of manufacturing lithographic printing plate supports (Examples 63 and 64) were free of streaks and abrasion marks.

By contrast, when the outer edge of the melt feed nozzle opening was in contact with the cooling rollers at the nozzle tip thereof and in other areas (Comparative Examples 29 and 32), abrasion marks arose. When the thickness of the parting agent applied to the cooling rolls was not made uniform with a wiper (Comparative Examples 30 to 32), streaks arose.

TABLE 11

|  | Thickness of parting agent on cooling rollers Al melt | uniformized | Positional relationship between melt flow nozzle and cooling rollers | Solid solution content (ppm) | | | Surface unevenness | |
|---|---|---|---|---|---|---|---|---|
|  |  |  |  | Fe | Si | Cu | Streaks | Abrasion marks |
| Example 63 | 10 | yes | A | 25 | 35 | 2 | Good | Good |
| Example 64 | 10 | yes | B | 25 | 35 | 2 | Good | Good |
| Comp. Ex. 29 | 10 | yes | C | 25 | 35 | 2 | Good | NG |
| Comp. Ex. 30 | 9 | no | A | 25 | 35 | 2 | NG | Good |
| Comp. Ex. 31 | 9 | no | B | 25 | 35 | 2 | NG | Good |
| Comp. Ex. 32 | 9 | no | C | 25 | 35 | 2 | NG | NG |

What is claimed is:

1. A method of preparing a lithographic printing plate support comprising the steps of:
   filtering an aluminum alloy melt containing iron, silicon, titanium and boron, downstream from the position where the titanium and boron are added in the form of $TiB_2$ to an aluminum melt;
   producing an aluminum alloy plate from the aluminum melt, wherein the aluminum alloy has a surface layer of up to 20 μm from the surface that is free of $TiB_2$ particles or contains $TiB_2$ particles at least 95% of which have a width of less than 100 μm, and
   has crystal grains present in the surface layer having an average width of 20 to 200 μm and a maximum width of at most 2,000 μm; and
   carrying out a graining treatment comprising at least alkali etching and subsequent electrochemical graining on the surface of the aluminum alloy plate so that after the graining treatment, the iron concentration and a silicon concentration in the surface layer up to 20 μm from the surface of the plate each show a fluctuation of not more than 20%, wherein a difference of the concentration in high-concentration and low-concentration areas to the concentration in the low-concentration areas determined by EPMA as follows:

$$\text{Fluctuation}(\%) = 100 \times [(PC_s) - (PC_{BA})]/(PC_{BA})$$

wherein $(PC_s)$=(peak count for streaks) and $(PC_{BA})$=(peak count for blank areas).

2. The method of claim 1 which further comprises prior to the graining treatment the subsequent steps of:
   continuous casting by feeding an aluminum alloy melt containing iron, silicon, titanium and boron between a pair of cooling roller through a melt feed nozzle where the aluminum alloy melt is rolled as it is solidified to form an aluminum alloy plate;
   cold rolling the aluminum alloy plate to reduce a thickness thereof;
   intermediate annealing the cold-rolled aluminum alloy plate; and
   finish cold rolling the aluminum alloy plate to further reduce the thickness thereof.

3. The method of claim 2, which further comprises prior to the continuous casting step the steps of:
   filtering aluminum alloy melt using a filtration tank, and
   melt feeding in filtered aluminum alloy melt from the filtration tank to the melt feed nozzle through a flow channel;
   wherein, in the melt feeding step, agitating means provided in a recess formed in a base of the flow channel agitates the aluminum alloy melt near the recess.

4. The method of claim 2, wherein an inner wall of the melt feed nozzle that comes into contact with the aluminum alloy melt is coated beforehand with a parting agent containing filler particles having a particle size distribution with a median diameter of 5 to 20 μm and a modal diameter of 4 to 12 μm.

5. The method of claim 2, wherein in the continuous casting step, a carbon graphite-containing parting agent is applied to surfaces of the pair of cooling rollers, then the applied parting agent is made uniform in thickness, and the melt feed nozzle has an opening with an outer edge which does not contact the cooling rollers or which contacts the cooling rollers only at a tip thereof.

6. The method of claim 2, wherein the following equation is satisfied:

$$V \geq 5 \times 10^{-5} \times (D/t^2)$$

wherein V is a circumferential velocity (m/min) of the cooling rollers, t is a thickness (m) of the aluminum alloy plate and D is a diameter (m) of the cooling rollers in the continuous casting step.

7. The method of claim 1, wherein the graining treatment includes, in this order, at least a first alkali etching treatment, a first electrochemical graining treatment using an alternating current in a nitric acid-containing electrolyte, a second alkali etching treatment, and a second electrochemical graining treatment using an alternating current in a hydrochloric acid-containing electrolyte.

* * * * *